United States Patent [19]

Meeker

[11] 4,447,886

[45] May 8, 1984

[54] TRIANGLE AND PYRAMID SIGNAL TRANSFORMS AND APPARATUS

[76] Inventor: G. William Meeker, 310 Bonifant Rd., Silver Spring, Md. 20904

[21] Appl. No.: 288,936

[22] Filed: Jul. 31, 1981

[51] Int. Cl.³ ............................................ G06F 15/332
[52] U.S. Cl. .................................... 364/725; 358/133; 382/43
[58] Field of Search ...................... 364/723, 725, 727; 358/133, 260, 261, 263; 382/43

[56] References Cited

U.S. PATENT DOCUMENTS

| | | | |
|---|---|---|---|
| 2,921,124 | 1/1960 | Graham | 358/138 |
| 3,051,778 | 8/1962 | Graham | 358/133 |
| 3,742,201 | 6/1973 | Groginsky | 364/727 |
| 4,055,756 | 10/1977 | Jolivet et al. | 364/725 |
| 4,222,076 | 9/1980 | Knowlton | 358/133 |
| 4,261,018 | 4/1981 | Knowlton | 358/133 |
| 4,261,043 | 4/1981 | Robinson et al. | 364/725 |
| 4,286,330 | 8/1981 | Isaacson | 364/725 |

OTHER PUBLICATIONS

H. B. Kekre et al., "Modified Slant and Modified Slant Haar Transforms for Image Data Compression", *Comput. and Elect. Engng.*, vol. 4, 1977, pp. 199–206.
K. R. Sloan, Jr. and S. L. Tanimoto, "Progressive Refinement of Raster Images", *IEEE Transactions on Computers*, vol. C-28, No. 11, Nov. 1979, pp. 871–874.
S. Tanimoto and T. Pavlidis, "A Hierarchical Data Structure for Picture Processing", *Comput. Graphics and Image Processing*, vol. 4, No. 2, pp. 104–119 (1975).
C. R. Paul and R. W. Koch, "On Piecewise-Linear Basis Functions and Piecewise-Linear Signal Expansions", *IEEE Trans. Acoust., Speech, Signal Processing*, ASSP-24, No. 3, Jun. 1976, pp. 263–264.
C. M. Melas, "Generalized Paul-Koch Basis Functions", *IEEE Trans. Acoust., Speech, Signal Processing*, vol. ASSP-24, No. 3, Jun. 1976, pp. 263–264.

Primary Examiner—Charles E. Atkinson
Attorney, Agent, or Firm—Kerkam, Stowell, Kondracki & Clarke

[57] ABSTRACT

Transform techniques for transforming numerical signal data into a transform domain and subsequent reconstruction, for purposes such as compression (bandwidth reduction) for communication or storage. The subject transforms involve several defined basis functions which operate on input data points. The basis functions of the invention are essentially weighting functions such that terms and coefficients (in the transform domain) calculated in accordance with the basis functions are each a particularly weighted average of the values of a selected consecutive plurality of input data points. An important basis function is a triangular weighting function. Successive terms and coefficients generated in accordance with each of the defined basis functions are calculated from successive consecutive pluralities of the input data points, with overlap of input data points depending on the particular basis function. The transforms are organized into a plurality of bands or levels N. Band N is the highest, and Band 1 the lowest. For forward transformation, calculation begins with the highest band, Band N, and works down. For inverse transformation (reconstruction), calculation begins with the lowest band, Band 1, and works up. Results of processing in each band are then employed as inputs for processing in the next lower band until the last band is reached. Many of the calculated coefficients have zero values, and there is also disclosed an efficient coding technique which permits the transmission of only the non-zero coefficients.

57 Claims, 54 Drawing Figures

B FUNCTION

OVERLAPPED B FUNCTION

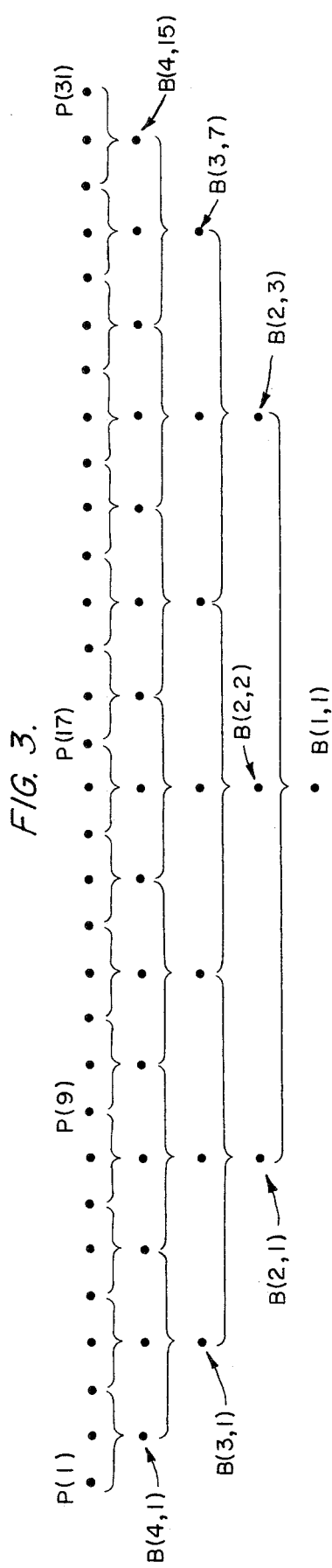
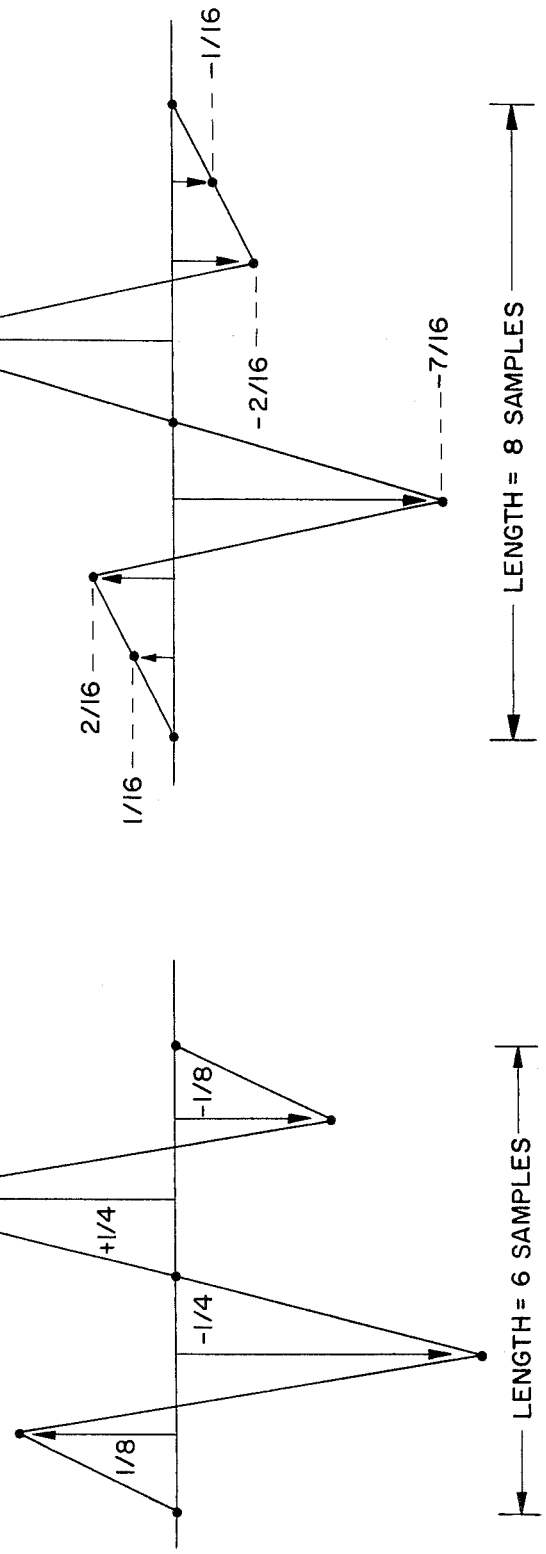
FIG. 3.
FIG. 7.
FIG. 6.

"D" FUNCTION
BAND N

"D" FUNCTION
BAND N-1

"S" FUNCTION
BAND N

"S" FUNCTION
BAND N-1

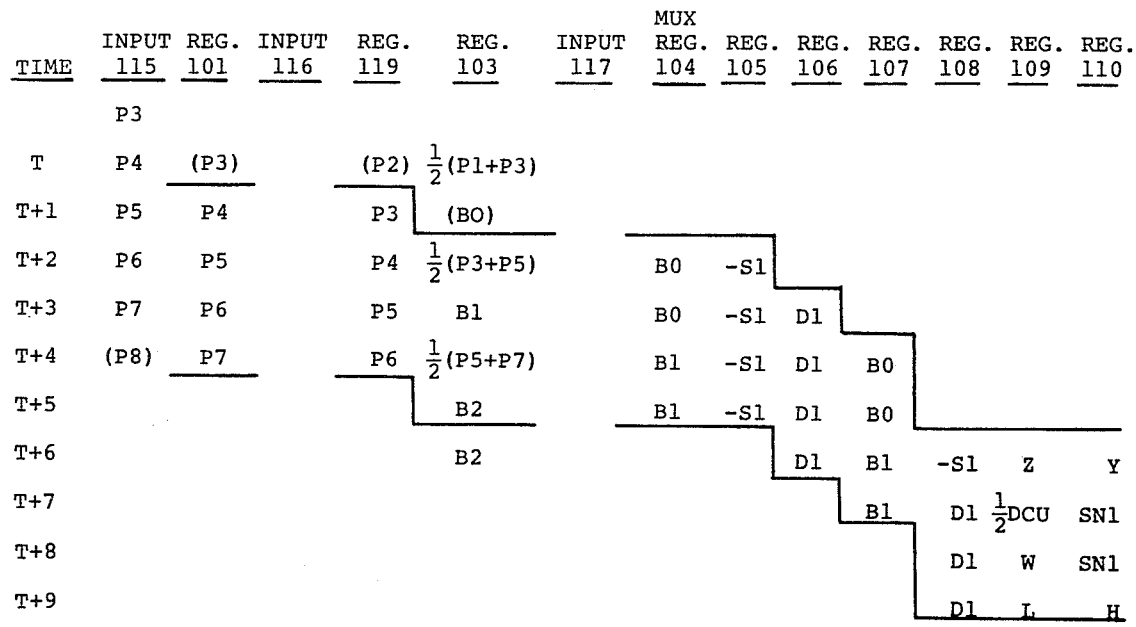
FIG. 21A.
FORWARD TRANSFORMER
CONTINUOUS NORMALIZED CASE
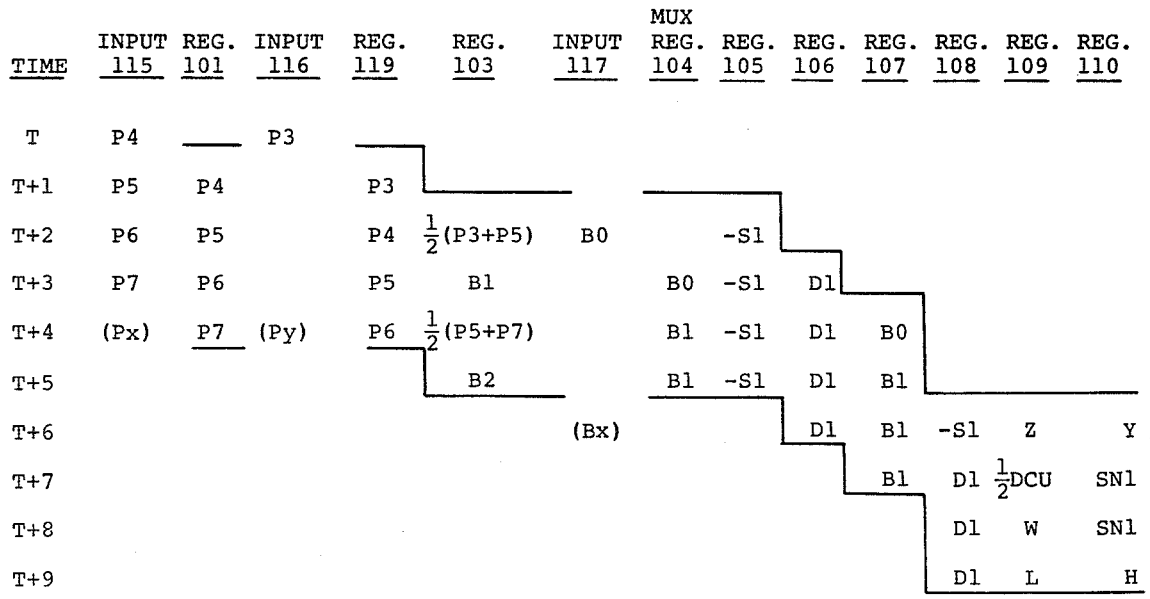
FIG. 22A.    FORWARD TRANSFORMER
NON-CONTINUOUS NORMALIZED CASE

FIG. 21B.

FORWARD TRANSFORMER
CONTINUOUS NORMALIZED CASE

| TIME | ADDER 111 | ADDER 112 | ADDER 113 | ADDER 114 |
|---|---|---|---|---|
| T | $(B0=\frac{1}{2}(P2+\frac{1}{2}(P1+P3)))$ | | | |
| T+1 | $\frac{1}{2}(P3+P5)$ | $-S1=\frac{1}{2}(P3-P5)$ | | |
| T+2 | $B1=\frac{1}{2}(P4+\frac{1}{2}(P3+P5))$ | $D1=\frac{1}{2}[P4-\frac{1}{2}(P3+P5)]$ | | |
| T+3 | $\frac{1}{2}(P5+P7)$ | --- | | |
| T+4 | $B2=\frac{1}{2}(P6+\frac{1}{2}(P5+P7))$ | --- | | |
| T+5 | | | $Y=\frac{1}{2}(B0+B2)$ | $Z=\frac{1}{4}(B0-B2)$ |
| T+6 | | | $\frac{1}{2}DCU=\frac{1}{4}(B1-Y)$ | $SN1=-(-S1)+Z$ |
| T+7 | | | --- | $W=\frac{1}{2}DCU-D1$ |
| T+8 | | | $L=W+SN1$ | $H=W-SN1$ |
| T+9 | | | | |

FIG. 22B.

FORWARD TRANSFORMER
NON-CONTINUOUS NORMALIZED CASE

| TIME | ADDER 111 | ADDER 112 | ADDER 113 | ADDER 114 |
|---|---|---|---|---|
| T | | | | |
| T+1 | | | | |
| T+2 | SAME | SAME | | |
| T+3 | AS | AS | | |
| T+4 | ABOVE | ABOVE | | |
| T+5 | | | | |
| T+6 | | | SAME | SAME |
| T+7 | | | AS | AS |
| T+8 | | | ABOVE | ABOVE |
| T+9 | | | | |

FIG. 23A.    FORWARD TRANSFORMER
NON-CONTINUOUS NON-NORMALIZED CASE
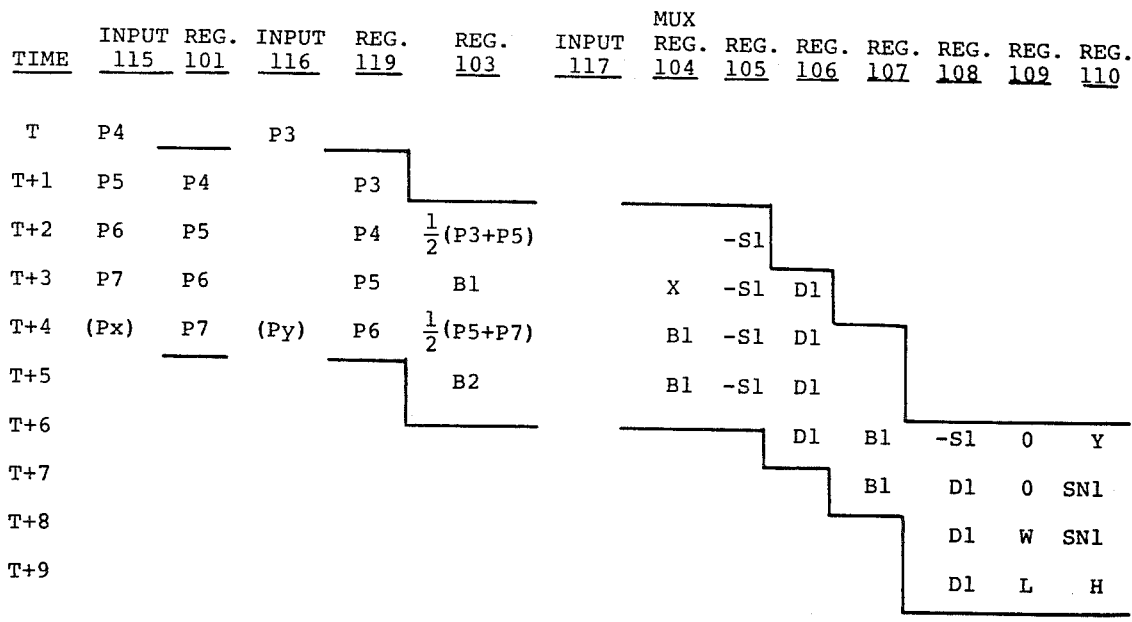
FIG. 27A.    RECONSTRUCTION PROCESSOR B
INTERPOLATION MODE
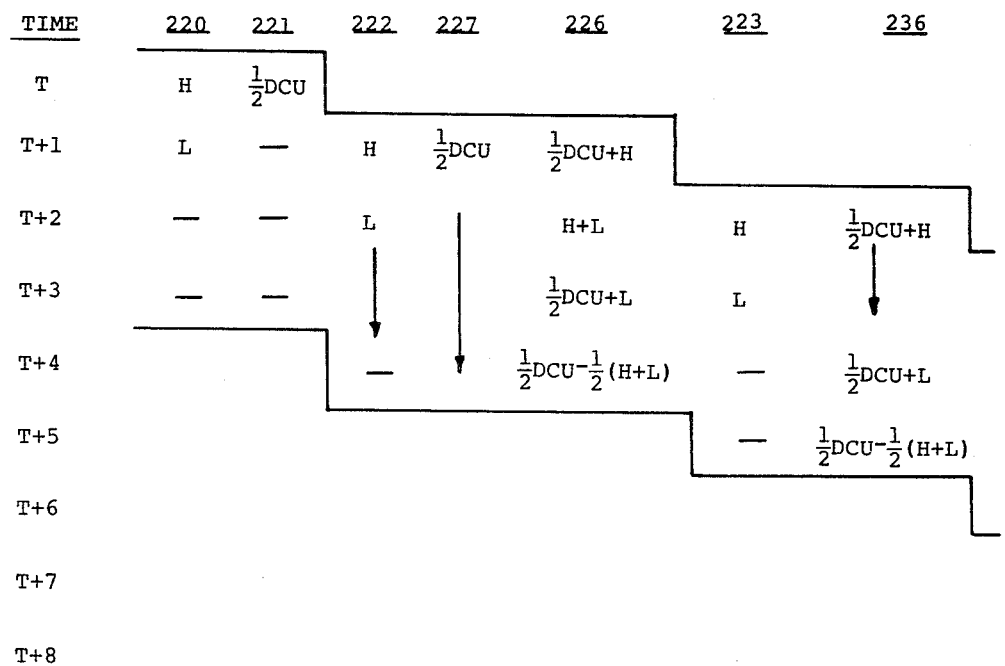

FIG. 23B.  FORWARD TRANSFORMER
NON-CONTINUOUS NON-NORMALIZED CASE

| TIME | ADDER 111 | ADDER 112 | ADDER 113 | ADDER 114 |
|---|---|---|---|---|
| T | $(B0=\frac{1}{2}(P2+\frac{1}{2}(P1+P3)))$ | | | |
| T+1 | $\frac{1}{2}(P3+P5)$ | $-S1=\frac{1}{2}(P3-P5)$ | | |
| T+2 | $B1=\frac{1}{2}(P4+\frac{1}{2}(P3+P5))$ | $D1=\frac{1}{2}[P4-\frac{1}{2}(P3+P5)]$ | | |
| T+3 | $\frac{1}{2}(P5+P7)$ | --- | | |
| T+4 | $B2=\frac{1}{2}(P6+\frac{1}{2}(P5+P7))$ | --- | | |
| T+5 | | | X | X |
| T+6 | | | X | $SN1=-(-S1)+0$ |
| T+7 | | | --- | $W=0-D1$ |
| T+8 | | | $L=W+SN1$ | $H=W-SN1$ |
| T+9 | | | | |

FIG. 27B.  RECONSTRUCTION PROCESSOR B
INTERPOLATION MODE

| TIME | 235 | 237 | 230 | 229 | 231 (238) | 232 |
|---|---|---|---|---|---|---|
| T | | | | | | |
| T+1 | | | $\frac{1}{4}$DCU | $\frac{1}{4}$DCU+$\frac{1}{2}$DCU | | |
| T+2 | | | $\frac{3}{4}$DCU | $\frac{3}{4}$DCU+$\frac{1}{2}$H | | |
| T+3 | $\frac{1}{2}$(H+L) | $\frac{1}{2}$DCU+H | ↓ | $\frac{3}{4}$DCU+$\frac{1}{2}$L | $\frac{3}{4}$DCU+$\frac{1}{2}$H | |
| T+4 | ↓ | $\frac{1}{2}$DCU+L | — | — | $\frac{3}{4}$DCU+$\frac{1}{2}$L | |
| T+5 | — | $\frac{1}{2}$DCU-$\frac{1}{2}$(H+L) | | | ↓ | Di |
| T+6 | — | Di | | | | — |
| T+7 | | | | | | — |
| T+8 | | | | | | — |

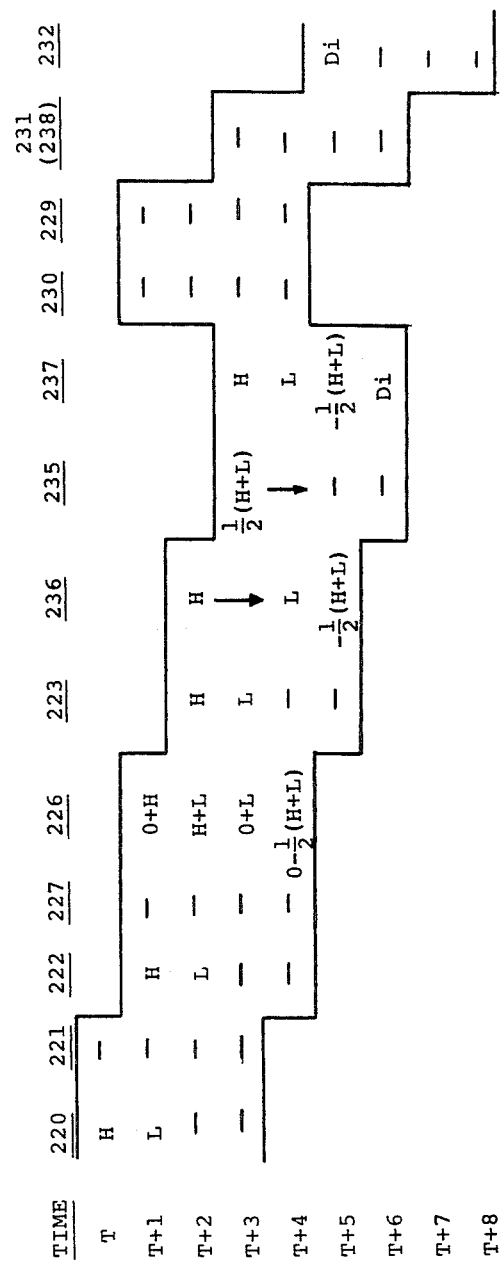
FIG. 28. RECONSTRUCTION PROCESSOR B
NON-INTERPOLATION MODE

RECONSTRUCTION PROCESSOR D
INTERPOLATION PROCESSING MODE

RECONSTRUCTION PROCESSOR D
NON-INTERPOLATION PROCESSING MODE

FIG. 35.

RECONSTRUCTION PROCESSOR D
HORIZONTAL CARRY-UP COMPLETION MODE

| TIME | 211 | 237 | 261 | (271) 262 |
|------|-----|-----|-----|-----------|
| T    | Z1  | X+Y | Z1-X-Y |       |
| T+1  |     | X-Y | Z1-X+Y | DCU(W) |
| T+2  |     | X   | Z1+X   | DCU(Y) |
| T+3  | Z0  | W   | Z0+W   | DCU(X) |
| T+4  |     |     |        | DCU(V) |

TRIANGLE AND PYRAMID SIGNAL TRANSFORMS AND APPARATUS

BACKGROUND OF THE INVENTION

The present invention relates to methods and apparatus for transforming numerical signal data into a transform domain where certain processing steps can be taken, and for subsequent reconstruction (inverse transform) into the original domain to yield a replica of the original data. Frequently the data is video data, and the signals are video signals.

Signal transforms have been employed to obtain a variety of beneficial results. Important uses in the past have been compression for transmission or storage (also referred to as bandwidth reduction), enhancement for restoration in some sense, detection of some certain phenomenon (e.g., motion detection, edge detection, or center-of-gravity detection), tracking of some certain phenomenon, noise reduction or stripping, and image analysis in general. Prior transforms include the Fourier (with attendant Sine and Cosine transforms), the Haar, the Hadamard, the Slant, block Fourier and Cosine transforms, block Hadamard transform, and the Karhunen-Loeve or Hotelling transform.

By the present invention new transforms are provided, herein termed in the Triangle Transform (for one dimension) and the Pyramid Transform (for two dimensions). The subject Triangle and Pyramid transforms herein disclosed are intended for the purpose briefly identified above, and possess several desirable and useful characteristics individually and in combination not possessed by other transforms. These Triangle and Pyramid transforms are discussed largely as they relate to one- and two-dimensional signal compression for transmission or storage.

COMPARISON OF THE SUBJECT TRIANGLE AND PYRAMID TRANSFORMS WITH PRIOR ART TRANSFORMS

It is believed that the subject transforms will be better appreciated in view of the following general comparison with various prior art transforms. The comparison below is with reference to the accompanying FIG. 1, which is a block diagram representation of the coding and subsequent decoding of a signal in the context of a communication system, or a storage and retrieval system.

In FIG. 1, the input signal, be it one- or multi-dimensional, is sampled, digitized and transferred to a forward transform device 32, where a reversible transformation process is performed on it. The object of the operation is to create a new representation of the signal such that the resulting elements are more independent of each other. As such, many of the new elements tend to represent change in the input signal amplitude and are close to or equal to zero in the neighborhoods of little signal amplitude change. The new transformed elements around zero value represent redundancies in the original signal. For practical signals arising from conventional acoustic or image sources, a high degree of this redundancy usually exists.

Following the forward transform device 32 is a quantizer 34 which groups elements of the transformed signals into a smaller number of discrete levels. Elements from the transform device 32 having nearly equal amplitudes are given the same value by the quantizer 34. Quantizing is a non-reversible process, and is performed to reduce the amount of representation required by the transformed signal elements. This reduction process can be carried only as far as the resulting distortion of the reconstructed signal can be tolerated. The degree of coarseness of the quantization which can be performed for a given acceptable output signal is a measure of the utility of the particular transformation process.

Usually, a coefficient coder 36 is provided following the quantizer 34 to reduce the required representation of the elements issuing from the quantizer 36 still further. Advantage may be taken of two phenomena. The first is that the amplitude distribution of the coefficient elements coming from the quantizer 34 is very peaked around zero amplitude and decays quite rapidly for larger amplitudes. For this type of distribution it is said that the signal entropy, expressed as the average number of bits required to represent an amplitude, is less than the number of bits representing the coefficients before coding. This is a useful situation which results from many transformation processes. The coefficient coder 36 maps the various amplitudes of the coefficients into variable length words such as by well known Huffman coding or other variable length technique so that the amount of data transferred to a transmission channel or storage medium 38 is less than that entering the coefficient coder 36, and hopefully close to the actual average coefficient signal entropy.

The second phenomenon is that a larger percentage of the elements issuing from the quantizer 36 actually have zero value. Another operation performed by the coefficient coder 36 is removing coefficients which have zero amplitude from output data stored or sent to a subsequent receiver. These zero values can be inserted at a receiver, so long as sufficient overhead mapping data is transmitted to indicate where they go, or more usually where they don't go. Since there are many more zero values than non-zero values a technique such as run-length coding can be used to efficiently indicate the number of zeroes between non-zero coefficients which are the only ones actually transmitted.

It should be noted that a mapping technique different from this for use with the subject Triangle and Pyramid Transforms is disclosed hereinbelow.

The transmission channel or storage medium 38 receives from the coefficient coder 36 coefficients which have non-zero values in coded form and a map which indicates their placement. The process of the coefficient coder 36 is reversible, and the inverse operation is performed by a coefficient recovery device 40.

The coefficient recovery device 40 converts the variable length coefficients back into fixed length format and inserts the zeros back into the signal at the correct locations as determined by the accompanying map. These coefficients are then input to a reconstruction transformer 42 which effects the inverse operation of the forward transformer 32. This results in an output signal which is a replica of the input signal. The difference between input and output signals is ideally the result of only the non-reversible operation of the quantizer 34. The other elements of the system are assumed to be transparent so as not to produce any difference in input and output signals by their own actions.

The behavior of the Triangle and Pyramid transforms will now be discussed in relation to that of prior art transforms. Bases for comparison include the following attributes:

(1) Nature and harshness of the perceived output signal distortion as a result of transform coefficient quantization;

(2) Graceful degradation of the output signal when higher order frequency or sequency coefficients are omitted from the reconstruction;

(3) Simplicity of implementation and calculation; and (4) Compression efficiency.

The first attribute, the nature and degree of the distortion produced in the output signal as a result of the quantization operation, depends considerably on the type of transformation device employed. However, some distortions are far less acceptable than others, depending on the application. Calculation of mean-square-error between input and output signals is tractible for some transforms, but often forms a rather poor measure of perceived distortion by a human observer of an acoustic or image signal. Relative to human observers distortions can usefully be divided into two categories. The first category concerns errors introduced in the process of reproducing a signal portion which involves considerable change. The second category concerns errors introduced in the process of reproducing a signal portion which involves little perceived change. Errors in the first category are much more tolerable than those of the second category. This masking effect of errors by a signal portion undergoing change is well documented in the literature relative to audio and video signals. The conclusion as it relates to a particular transformer device is to somehow have any distortion which occurs happen in a signal area where change in the signal naturally occurs, and not in a relatively smooth area of the signal. A smooth signal is better defined from a perception standpoint as one whose first derivitive is constant over an interval rather than whose amplitude is constant over the interval. It is therefore desirable that the transformer minimize distortion in signal portions which contain linear ramps.

The perceived distortion in the output signal is generally less if the first derivitive of the distortion is minimized. Distortion-induced low amplitude changes in the output signal are much more noticeable in an audio or video signal if they are abrupt (high value of first derivitive) than if they occur over a longer period of time (or space in a two dimensional image). The audio result of an abrupt change can be a "pop" noise, and a video result can be an artifact edge. It is therefore desirable that the basis functions used in the transform be smooth functions not containing discontinuities. For a digital transform working with sampled data this requires that the envelope of the samples be smooth.

These desired qualities in performance can be translated into more technical type requirements for a transform, three of which are summarized: First, concentrating the larger errors near locations of greater signal activity without introduction of errors of similar magnitude in other signal areas of small activity can be accomplished through use of a transform employing finite duration basis functions. Each of these functions extend only over a portion of the signal space, as contrasted with transforms whose basis functions all extend over the complete range of the signal space. A prior art example of the type employing finite basis functions is the Haar transform. Examples of the transforms extend over the complete range of signal space are the Cosine and Hadamard transforms. Second, the transform should carry signal areas of contant slope with a small number of low frequency or low sequency basis functions, without requiring many high frequency or high sequency basis function components. Third, in order to avoid artificial discontinuities in an output signal reconstructed from transform coefficients which have been subjected to some quantizing action subsequent to forward transformation, the transform should avoid use of discontinuous basis functions in the aforementioned envelope sense.

The Haar transform is a finite duration transform, but cannot concentrate an input signal having a constant slope into a few low sequency coefficients. Also undesirable is its use of discontinuous basis functions. The Slant transform contains a constant slope component as one of its basis functions, but a majority of its other basis functions contain discontinuities. Also, it is not a finite duration transform type as all of its basis functions are defined over all of the signal space. The Cosine transform achieves the goal of smooth basis functions, but it is not a finite duration type, nor does it contain a basis function component dedicated to carrying a constant slope signal area. It will be shown that the subject Triangle and Pyramid transforms possess all three performance attributes. Before showing this, however, other desirable characteristics of a transform are stated as further basis for comparison of prior art transforms and the subject invention.

The second attribute for comparison is that of graceful degradation of the output signal when higher frequency, or higher sequency, coefficients are omitted, or their inclusion delayed in time from the reconstruction of the output signal in the case of images. When this situation arises it is often better to have some approximation of the output signal than none at all. This is particularly true of images in motion where a less distinct image, or sometimes a less distinct portion of the image which contains the motion is quite acceptable to the human observer. Since most transforms have some natural ordering to the coefficients on the basis of frequency of sequency, when it is necessary to limit the rate at which coefficients must be transmitted to the maximum rate the transmission channel can accomodate, it is desirable to omit coefficients of higher order. When this operation occurs, the resulting image should degrade by losing some definition, but not become noticeably contaminated by discontinuities and edges related to the nature of the transform's basis functions. The Cosine function does moderately well at achieving this goal because it employs the smooth cosine functions of various frequencies to reconstruct the output signal. It unfortunately introduces an amount of distortion into smooth signal areas similar to the amount it introduces into areas of much activity. However, the distortion is relatively smooth and without discontinuities. The Hadamard, Haar and Slant transforms, however, require the higher order terms to fill in discontinuities created by lower order terms. When the higher order terms are omitted, artificial discontinuities result. The subject Triangle and Pyramid transforms achieve a smooth degradation since the reconstruction degrades to a linear interpolation of lower order smooth functions in the absence of higher order coefficients.

The third attribute of a transform listed above for comparison purposes is the ease of its implementation, which relates directly to its cost. Three technical factors relating to ease of implementation are:

(a) Existence of a "fast calculation" method for the transform;

(b) A high degree of sparseness in the required calculations to minimize the number of terms which must be calculated in the forward and reconstruction transforms; and (c) Freedom from requirements for non-trivial multiplications.

The phrase "fast calculation" method refers to an efficient organization of the calculations such that some of the calculations performed to obtain initial results are additionally useful as partial calculations in obtaining subsequent results. Fast calculation methods are known for the Cosine, Hadamard, Harr and Slant transforms, as well as for some others. The present invention includes a fast method for calculation of the Triangle and Pyramid transforms.

The Haar transform is the only one of the aforementioned prior art transforms possessing a sparse matrix. The others have all their basis functions defined over the complete span of the signal. To get around this considerable problem, most prior art transforms are "blocked" so as to limit the span of the functions to separate sub-spaces. Each sub-space then has all of its basis functions defined over the entire sub-space. Although this greatly reduces the number of points over which a transform must be calculated, it does this at the expense of introducing artificial boundaries at the subspace edges which can cause discontinuities or edges. This occurs even in the Cosine transform which, in the absence of "blocking" does not have any tendency to produce edges. The Triangle and Pyramid transforms are naturally sparse like the Haar transform, and yet avoid recourse to blocking.

Multiplications have historically been more difficult to implement than additions and subtractions, requiring either more time, more hardware, more expensive hardware, or some combination of these. Although this gap has narrowed due to advances in integrated circuit technology, multiplications, other than by powers of two which are readily accomplished by left or right shift operations in digital hardware, are to be avoided where possible. The Cosine transform as usually calculated involves non-trivial multiplications, as does the Slant transform. The Hadamard transform can be calculated without multiplications, as can the Haar transform. The subject Triangle and Pyramid transforms, in the preferred embodiments, require only trivial multiplications by powers of two.

The fourth attribute of a transform as listed above for comparison purposes relates to the efficiency of satisfactory representation of a signal with the smallest number of resulting non-zero value coefficients. This implies high energy compaction into a small number of terms. As stated previously, "satisfactory" representation is difficult to quantify, when it relates to results perceived by human senses. However, certain comparisons can be made. The first term in virtually all transforms represents the average value of all the input samples so that the other terms need only represent departures from that average value. In practice a transform is often blocked so as to limit the number of calculations. Each block must therefore have its own average value term which may detract somewhat from the efficiency. However, if the size of the block is comparable to the extent of the correlation of the data in the signal, then the efficiency is not seriously compromised. Some trade-off may be necessary, however, between calculation efficiency and transform efficiency. With the Triangle and Pyramid Transforms the size of an area over which each local average value is determined is readily selected by the designer for a particular application by varying the number of decimations of the signal data and has a relatively minor effect on the required number of calculations. Next, of considerable value in achieving high efficiency is the ability to represent a constant slope in the input data with the least number of terms. This is especially true of image data and to varying degrees with other data. The Haar and Hadamard transforms, for example, are poor in this regard in that most coefficients have non-zero values for a constant slope of the input data. The Cosine transform requires a few terms to make an approximation to a constant slope. The Slant transform has a single term dedicated to a constant slope and is therefore quite efficient in this regard. The Triangle and Pyramid transforms result in coefficients with exactly zero value for all signal areas where the slope of the input samples is constant. Very good efficiency is therefore achieved in this regard.

SUMMARY OF THE INVENTION

Briefly, and in accordance with an overall concept of the invention, the subject transforms involve several defined basis functions which operate on input data points P(i). The basis functions of the invention are essentially weighting functions such that terms and coefficients (in the transform domain) calculated in accordance with the basis functions are each a particularly weighted average of the values of a selected consecutive plurality of input data points. Successive terms and coefficients generated in accordance with each of the defined basis functions are calculated from successive consecutive pluralities of the input data points, with overlap of input data points depending on the particular basis function.

In accordance with a further concept of the invention, the transforms are organized into a plurality of bands or levels N. Band N is the highest, and Band 1 the lowest. The bands or levels are significant for two different reasons: (1) Coefficients are output from the transform process for each band; and (2) In the preferred fast calculation methods the bands represent successive stages of calculation. For forward transformation, calculation begins with the highest band, Band N, and works down. For inverse transformation (reconstruction), calculation begins with the lowest band, Band 1, and works up. Results of processing in each band are then employed as inputs for processing in the next lower band until the last band is reached.

More particularly, there is defined a "B-function" which is a weighting function with an envelope shaped as a triangle for a one-dimensional transform, and as a pyramid for a two-dimensional transform. For Band 1 a continous stream of B-function terms are calculated and output, with each B-function term in the one-dimensional case being a triangularly-weighted average of $20^{N+1}-1$ consecutive input data points, where N is the number of bands or levels in the system. The consecutive pluralities of input data points contributing to successive B-function terms overlap by one-half. Since the one-dimensional weighting function is triangular, for $N=1$ the B-function is a ¼, ½, ¼-weighting function. For $N=2$, the B-function is a 1/16, ⅛, 3/16, ¼, 3/16, ⅛, 1/16 weighting function.

As a simple example of a two-dimensional B-function, the pyramid weighting function is as follows for a three-by-three matrix of input data points to yield a single B-function term:

| 1/16 | ⅛ | 1/16 |
| ⅛ | ¼ | ⅛ |
| 1/16 | ⅛ | 1/16 |

In actual two-dimensional implementation, a stream of B-function terms for Band 1 are generated and output, with overlap of the input data points contributing to each B-function term for Band 1 such that the beginning data point for each ensuing successive B-function term for Band 1 shifts ahead by $2^N$ input data points in one or the other or both of the two directions of the two-dimensional set of input data points. Each term for Band 1 may be defined as a pyramid-weighted average of the values of a square array of input data points, with each side of the sqaure containing $2^{N+1}-1$ consecutive input data points.

In the fast calculation approach, each B-function calculation requires only three input points, weighted ¼, ½, ¼. The B-function terms for Band N only are calculated from actual input sample points. The B-function terms for all lower bands are calculated from the B-terms from the next higher band. Only those from Band 1 are output.

In accordance with a further overall concept of the invention, coefficients are generated and outputted for each band as predetermined functions defined as weighted averages of selected consecutive pluralities of input data points. The number of input data points contributing to each coefficient is the least for Band N, and increases by powers of two for each successive band below Band N. The predetermined functions are selected so as to enable reconstruction of the values of the input data points as a build-up from Band 1 upwards of linear interpolation between B-function terms for Band 1, with departures from linear interpolation being indicated by non-zero coefficients for Bands 1 through N. The build up process begins with Band 1, and works upward through Band N.

One of the predetermined functions is a D-function, which is a $-¼, +½, -¼$-weighting function according to which coefficients are generated from input sample points for Band N, and from B-terms for the next higher band for all band below Band N.

An S-function, which is a $-½, 0, +½$-weighting function is defined, and similarly operates on input sample points and next higher band B-terms to generate coefficients.

To provide the useful property of generating zero-value coefficients for any sequence of input samples with constant slope, the S-fucntion may be "normalized" to produce an SN-function.

In the transform domain, the local average value of the input signal is carried by B-function terms, and the D-function and S-function, or alternatively the D-function and SN-function, coefficients carry sufficient additional information to permit exact reconstruction.

For transform processing of a two-dimensional set of input data points, a Band N transform is performed independently on each row, and the intermediate results (B-terms and selected combination of D, S, SN, H and L-type coefficients) are ordered by horizontal position. A second Band-N transform is performed on each resulting column of the array of intermediate results. The combined results of these two operations are: (1) a set of two-dimensional output coefficients which require no further processing in other bands, and (2) a two-dimensional array of intermediate B-type data points which are subsequently input to two dimensional processing in Band N−1. The number of data points input to Band N−1 is one fourth that of the original number of the two-dimensional set of input data points. The same sequence of two sets of one dimensional transforms are performed at each Band in like manner. At Band 1, transformation is complete, and two-dimensional coefficients and pyramid-weighted average terms are output as band 1 results.

Another significant aspect of the subject transforms, mentioned above, is the continuous overlapping of input data points contributing to the weighting calculations for various terms and coefficients. As a result, it is not possible to associate a fixed number of specific coefficients in the transform domain with a like number of specific input samples. However, this aspect gives the subject Triangle and Pyramid transforms much of their strength and utility.

It is not necessary to calculate all possible terms and coefficients for each of the bands. Rather, many can be omitted, leading to various possible organizations, and still permit reconstruction. The B-function terms for Band 1 are always calculated, based on successive overlapping pluralities of input sample points. Also, there must be two coefficients calculated in the highest band, Band N, for every four input samples. It is preferred to calculate, for Band N, one D-coefficient and one overlapping S-type coefficient. For Band N−1, there must be two coefficients for each eight input sample points. For Band N−2, there must be two coefficients for each sixteen input sample points, and so on.

For reconstruction (inverse transform) the processes are reversed, and the original data points are determined through simple algebraic manipulation.

However, when coefficients are roughly quantized or eliminated as part of the transmission or storage process between the forward and inverse transform processes, objectionable errors can result. For this situation, alternative algebraic expressions are developed, which provide a smoothing action through an interpolation process. Accordingly, an important aspect of the invention is satisfactory reconstruction even in the presence of rough quantization, or elimination of certain coefficients. This involves the generation and use of carry-up coefficients from higher or lower bands.

Another aspect of the invention is the manner in which zero-valued coefficients are treated for efficient transmission, taking advantage of the probabilities of occurrence relationships between various coefficients which result from the finite length of the basis functions and the layering of coefficients in multiple bands. In particular, a local length can be associated with each function. In a certain locality a high level of signal activity may produce non-zero value coefficients in multiple bands where the particular basis functions with non-zero values align with this signal activity. If there are gradual edges in the activity only the lower bands may produce non-zero coefficients; if there are steep edges then the higher bands as well as the lower bands will produce non-zero coefficients. Existence of non-zero lower band coefficients does not carry with it a high probability of higher band coefficients; existence of higher band coefficients does, however carry with it a high probability of the existence of lower band non-zero coefficients in spatially aligned locations. This aspect for naturally occurring signals such as acoustic and image signals is utilized in minimizing the amount of overhead map data which must accompany the non-zero coefficient data for reconstruction purposes.

Further, the subject mapping techniques provide additional efficiency when applied to color images represented by three video signals such as "Y", "I" and "Q" employed in standard broadcast practice. The "Y" signal is the equivalent of a monochrome signal which can be transformed by the subject Pyramid Transform. The "I" and "Q" signals are color-difference signals. In one specific technique, called the "OR" technique, a single map word is caused to exist in a processing block by a corresponding non-zero coefficient in the transformed "Y" signal, or the "I" signal, or the "Q" signal. The result then is that coefficients from all three signals are transmitted in response to the information contained in the common map. In another specific technique, called the "Monochrome-signalling" technique, map data are produced only in response to non-zero value coefficients from the "Y" signal. Non-zero values of coefficients of "I" and "Q" signals not corresponding to a non-zero value coefficient from the "Y" signal are simply discarded. There is no extra map data required for the color coefficients, only the coefficients themselves. The color portion of the picture is thereby transmitted very efficiently without need for any additional mapping overhead. Another advantage of this latter technique is the ability to remove noise in the color portion of the video signal introduced by various means including passage through a video tape recorder.

The map coding techniques of the present invention, while developed specifically for the subject Triangle and Pyramid transforms, are also applicable to other transforms having a hierarchial structure, as explained more fully hereinafter.

Still another aspect of the invention is the development of standardized processing blocks for the forward and inverse transforms. These standardized processing blocks are arranged adjacent one another within each band, and above and below one other for higher and lower bands.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

FIG. 3 illustrates the manner in which B-function terms are successively derived in a fast calculation method in accordance with the invention;

FIG. 6 illustrates the weighting envelope shape of a Band N SM-function in accordance with the invention;

FIG. 7 illustrates the envelope shape for a Band N SN-function in accordance with the invention;

FIGS. 21A&B, 22A&B, and 23A&B are data flow diagrams for various modes of the FIG. 20 processor;

FIGS. 27A&B, 28 and 29 are data flow diagrams for three different modes of operation of the FIG. 24B processor;

DETAILED DESCRIPTION OF THE INVENTION

Figure 1:
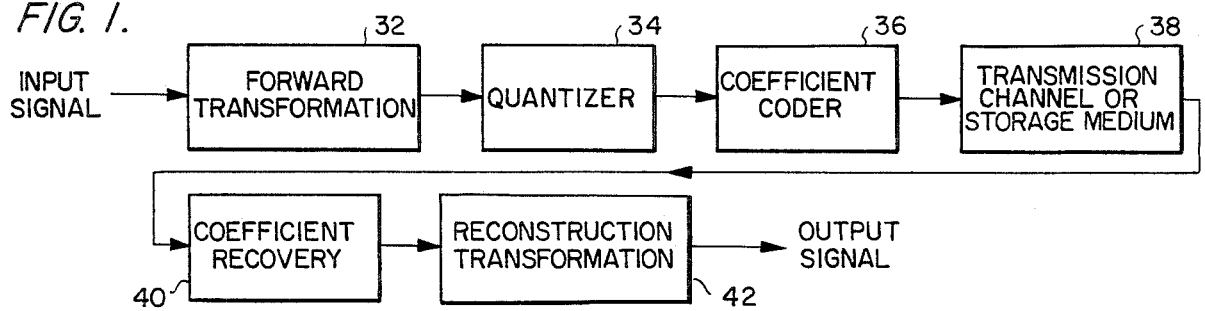
FIG. 1, discussed hereinabove, is a generalized block diagram representation of the coding (forward transform) and subsequent decoding (inverse transform or reconstruction) of a signal.

The subject Triangle and Pyramid transforms are described hereinbelow initially from a conceptual or functional standpoint, followed by a description of exemplary apparatus for practicing the invention.

Forward Triangle and Pyramid Transform Concepts

The transforms herein described relate to signals which can either be assumed infinite in length for practical purposes, or of specific finite length with attendant edges such as an image. In either case, the signals comprise a series of input data points, $P(i)$, $P(i+1)$, $P(i+2)$, etc. For a one-dimensional signal, the input data points are successive discrete samples, such as sampled values at successive equal intervals of time. For an exemplary two-dimensional signal comprising an image, the input data points are picture elements, commonly termed pixels. The subject Triangle Transform is a one-dimensional transform. The Pyramid Transform is a closely related two-dimensional transform. The transforms are first described as they operate on interior portions of a signal away from edges, and are then described as they operate near edges.

The subject transforms are organized into a number of bands or levels N, where N is an integer greater than zero. Band N is herein considered the highest band, and Band 1 the lowest. The number N can be chosen for a particular application within broad limits depending on aspects of the signal such as correlation length, and the intended purpose, such as bandwidth reduction, noise stripping, etc.

The transforms operate on the input data points and, for each band, output a set of coefficients (in the transform domain). Additionally, basis function terms (in the transform domain) are preferably generated for each band. However, only the basis function terms for the lowest band, i.e. Band 1, are output, those for higher bands being used as intermediate values during calculation of the coefficients and terms. Not only do "band" or "level" refer to entities for which coefficients and terms are generated, but they refer as well to successive stages in a preferred approach to calculation. In the preferred "fast" calculation methods, calculation proceeds in stages beginning with calculations for the highest band (Band N) operating on the actual input data points. Not only are coefficients for Band N output after this initial calculation, but the base function terms for Band N are then employed as the "input" points (although no longer actual input data points) for the next stage, that of the next lower band, Band $N-1$. The process continues until calculations for Band 1 are complete.

In all cases, no matter which band, each of the generated coefficients or terms is simply a weighted average of the magnitudes of a selected consecutive plurality of the actual input data points. As such, the basis functions of the subject Triangle and Pyramid transforms may be viewed as weighting functions which span a consecutive plurality of input data points, and the coefficients and terms are calculated by purely arithmetic operations. The number of input data points which go into the weighted averages defining each of the terms and coefficients are smallest for the highest band (Band N), and increase in number approximately by powers of two for each successive lower band. Although each term and coefficient for each band can be expressed by means of an arithmetic expression as a function of the actual input data points, such would represent a relatively impractical direct calculation for all bands below Band N, with difficulty increasing rapidly for the lower bands. Instead, the terms and coefficients for each lower band are generally expressed herein only as rather simple functions of the results of calculation for the immediately preceeding higher band. The actual calculations in the preferred embodiments proceed accordingly. However, for illustrative purposes herein, expressions for some lower bands are developed as functions of the actual input data points.

Coefficients of the highest band (Band N) having the shortest length basis functions generally occupy a Fourier frequency spectrum concentrated in the upper one-half of the spectrum of the input signal. ("Length" refers to the number of input data points spanned by the basis function.) Basis functions in Band $N-1$ span twice the length as those of the highest band N, and have their spectral energy concentrated from one-fourth to one-half of the total spectrum of the input signal. In each successive lower band the basis functions have twice the span as the next higher band.

The number of input data points contributing to the basis functions for the lowest band (Band 1) is a function of N, and is equal to $(2^{N+1}-1)$. E.g., if $N=5$, then 63 input data points, weighted according to the basis function, contribute to each term output for Band 1. The value of N thus has an upper limit determined by the length of the signal if it is of finite duration, or by the user with a knowledge of intended application and nature of the signal such as the natural correlation length. If N is chosen so large that the length of the basis functions for the lowest band (Band 1) exceed the signal correlation length, efficiencies gained in bandwidth reduction do not become any greater, and the primary result is more calculations than necessary.

The specific basis functions of the subject Triangle and Pyramid transforms will now be defined, considering first those for one-dimensional input signals.

A primary basis function is herein termed a "B"-function. This is a weighting function with an envelope shaped as a triangle for a one-dimensional transform, and as a pyramid for a two-dimensional transform. The names employed herein for the subject Triangle and Pyramid transforms derive from the B-function envelope shape. The summation of weights represented by the triangle and the pyramid are both unity. The envelopes of the B-functions are continuous even functions, with piecewise continuous first derviatives.

For the lowest band, Band 1, a stream of B-function terms are calculated and output. Each B-function term is a triangularly-weighted average of the magnitudes of a consecutive plurality of input data points. The consecutive pluralities of input data points contributing to respective successive B-function terms overlap a selected amount. A typical example is 50% overlap.

For nomenclature purposes, the B-function terms are given a two-part subscript, with the first subscript part indicating the band number, and the second subscript part indicating the particular one of the B terms in the output stream. For example, successive B-function terms for the highest band, Band N, are denoted B(N,j), B(N,j+1), B(N,j+2), and so on, where j is an arbitrary reference in the transform domain. While all B-function terms are calculated in the fast process, only those for Band 1 are actually output, i.e., B(1,j), B(1,j+1), B(1,j+2), and so on.

For the simplest case of only one band, N=1. Then the B terms are defined as follows:

$$B(1,j+m) = \frac{P(i+2m)}{4} + \frac{P(i+2m+1)}{2} + \frac{P(i+2m+2)}{4},$$

where m=0, 1, 2, 3, etc.

More particularly, the first three B terms are:

$$B(1,j) = \frac{P(i)}{4} + \frac{P(i+1)}{2} + \frac{P(i+2)}{4},$$

$$B(1,j+1) = \frac{P(i+2)}{4} + \frac{P(i+3)}{2} + \frac{P(i+4)}{4}, \text{ and}$$

$$B(1,j+2) = \frac{P(i+4)}{4} + \frac{P(i+5)}{2} + \frac{P(i+6)}{4}.$$

Figure 2A:
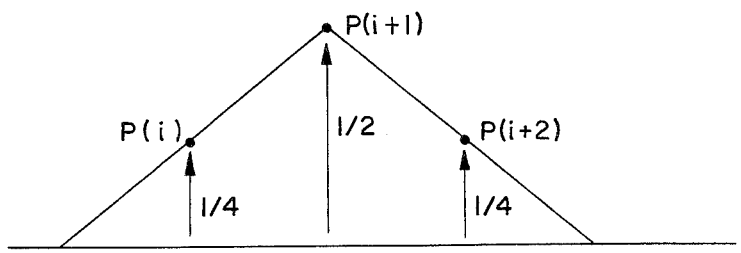
FIG. 2A illustrates the weighting envelope of a single B-function in accordance with the invention.

With reference to FIG. 2A, the envelope of a single B-function term, that of B(1,j), where N=1, above is shown. As may be seen, the envelope shape is triangular.

Figure 2B:
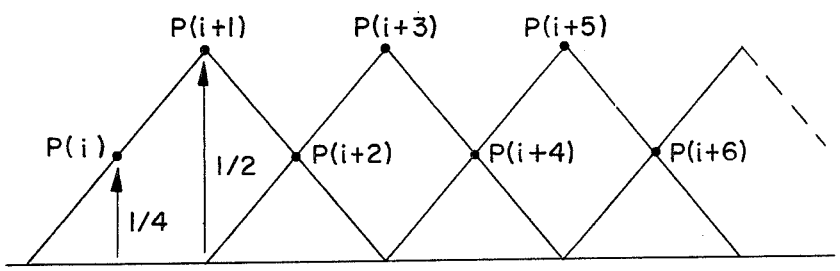
FIG. 2B illustrates the manner in which successive B-function terms overlap.

With reference to FIG. 2B, the manner in which successive B-function terms overlap for Band 1, where N=1, is depicted.

For the general case, where N is any positive integer, the B-terms output from the lowest band, Band 1, are as follows (for 50% overlap):

$$B(1,j+m) = \frac{1*P(i+m*2^N)}{4^N} + \frac{2*P(i+m*2^N+1)}{4^N} +$$

$$\frac{3*P(i+m*2^N+2)}{4^N} + \ldots +$$

$$\frac{2^N*P(i+m*2^N+2^N-1)}{4^N} + \ldots +$$

$$\frac{3*P(i+m*2^N+2^{N+1}-4)}{4^N} +$$

$$\frac{2*P(i+m*2^N+2^{N+1}-3)}{4^N} +$$

$$\frac{1*P(i+m*2^N+2^{N+1}-2)}{4^N},$$

where m=0, 1, 2, 3, etc; and the asterisk symbol (*) denotes multiplication.

From the above, it can be seen that the number of input points or samples contributing to the weighted average comprising each B-function term in equal to $2^{N+1}-1$. The weight assigned to all other input sample points is zero. The beginning P(i) data point shifts ahead by $2^N$ for each successive B(1,j) term, assuming 50% overlap.

As one specific example, if N=2, then there are $(2^3-1)=7$ input points contributing to each B-function term in a triangularly-weighted average as follows:

$$B(1,j) = \frac{1}{16} P(i) + \frac{2}{16} P(i+1) + \frac{3}{16} P(i+2) +$$

$$\frac{4}{16} P(i+3) + \frac{3}{16} P(i+4) +$$

$$\frac{2}{16} P(i+5) + \frac{1}{16} P(i+6)$$

Figure 2C:
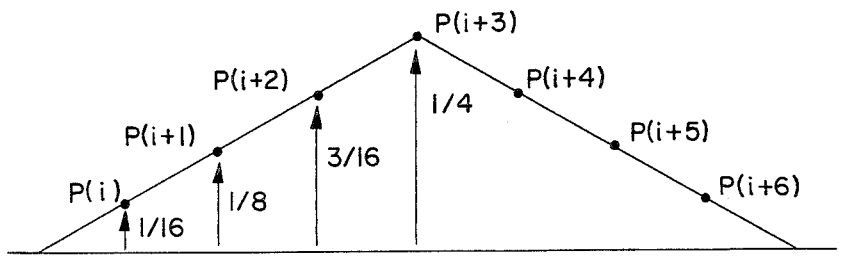
FIG. 2C illustrates a B-function weighting envelope for another case in accordance with the invention.

The B-function weighting envelope of this particular B(1,j), where N=2, is depicted in FIG. 2C.

As another specific example, if N=5 (for a five band system) the triangle for each Band 1 B-function spans $(2^6-1)=63$ non-zero input sample points, with individual weights or amplitudes as follows:

$$B(1,j) = \frac{1}{1024} P(i) + \frac{2}{1024} P(i+1) + \frac{3}{1024} P(i+2) + \ldots +$$

$$\frac{30}{1024} P(i+29) + \frac{31}{1024} P(i+30) +$$

$$\frac{32}{1024} P(i+31) \text{ [the center]} +$$

$$\frac{31}{1024} P(i+32) + \frac{30}{1024} P(i+33) + \ldots +$$

$$\frac{2}{1024} P(i+61) + \frac{1}{1024} P(i+62).$$

From the foregoing expression for just a single B-function term in a five band system, it can be appreciated that direct calculation of the B-terms in a multiband system would be a time-consuming or hardware-consuming task, without even considering the various coefficients, discussed in detail hereinbelow, calculated for each band. The present invention, however, provides a fast calculation approach where B-function terms are calculated for all bands, beginning with Band N, and employed as intermediate results. B-terms for lower bands are calculated from the B-terms calculated for the immediately preceeding band. The actual input sample points are not needed. Significantly, each calculation of a B term requires only three input terms to be averaged in a simple ¼, ½, ¼ weighting calculation. Although the B-terms calculated as intermediate results are not actually output, they aid significantly in rapidly calculating a stream of final (Band 1) B-terms, and also in calculating coefficients for the various bands, as hereinafter described.

Specifically, For the fast calculation method, the B-function terms are defined next.

The B-function terms for Band N are the only ones calculated directly from input sample points, and are as follows:

$$B(N,j+m) = \frac{P(i+2m)}{4} + \frac{P(i+2m+1)}{2} + \frac{P(i+2m+2)}{4},$$

where m=0, 1, 2, 3, etc.

The B-function terms for all lower bands are calculated, not from input sample points, but rather from the B terms from the next higher band, as follows:

$$B(n,j+m) = \frac{B(n+1,j+2m)}{4} + \frac{B(n+1,j+2m+1)}{2} +$$

-continued $$\frac{B(n+1, j+2m+2)}{4},$$

where n=N−1, N−2, ..., 3, 2, 1; and m=0, 1, 2, 3, etc.

Substitution will show that the results of the fast calculation approach described immediately above are identical to the results of the more cumbersome direct calculation approach involving non-trivial multiplications initially described. For example, assuming a two-band system where N=2, then, for the highest band:

$$B(N,j) = \frac{P(i)}{4} + \frac{P(i+1)}{2} + \frac{P(i+2)}{4},$$

$$B(N,j+1) = \frac{P(i+2)}{4} + \frac{P(i+3)}{2} + \frac{P(i+4)}{4}, \text{ and}$$

$$B(N,j+2) = \frac{P(i+4)}{4} + \frac{P(i+5)}{2} + \frac{P(i+6)}{4}.$$

For the next lower band, which in this case is Band 1 since N is only 2:

$$B(N-1,j) = \frac{B(N,j)}{4} + \frac{B(N,j+1)}{2} + \frac{B(N,j+2)}{4}.$$

Substitution then yields:

$$B(N-1,j) = \frac{1}{16} P(i) + \frac{2}{16} P(i+1) + \frac{3}{16} P(i+2) +$$

$$\frac{4}{16} P(i+3) + \frac{3}{16} P(i+4) + \frac{2}{16} P(i+5) +$$

$$\frac{1}{16} P(i+6)$$

which is identical to the previous direct example of B(1,j), where N=2.

With reference now to FIG. 3, the manner in which B-function terms are successively derived is shown in diagrammatic fashion. FIG. 3 depicts which points and terms contribute to the various lower-band terms by means of brackets, but, for clarity of illustration, does not depict the ¼, ½, ¼ weighting sequence assigned to the three points within each bracket. The FIG. 3 example is for a four-band system, wherein each B-function term in Band 1 is a triangularly-weighted average of $(2^5-1)=31$ input data points, designated P(1) through P(31). For the highest band, Band 4, it can be seen that fifteen B terms are calculated, B(4,1) through B(4,15). The input data points P(i) are overlapped by one in the sampling for each successive B-term B(4,j) in Band 4. For the next lower band, Band 3, only seven B terms are calculated, B(3,1) through B(3,7). The B-terms B(4,j) in Band 4 are overlapped by one in the sampling for each successive B-term B(3,j) in Band 3. The process continues in the same manner, with only three B-terms calculated for Band 2, and one B term for Band 1, B(1,1).

Although not illustrated in FIG. 3, it will be appreciated that the next successive B-term for Band 1, B(1,2), is the triangularly-weighted average of three B-terms in Band 2, B(2,3), B(2,4) and B(2,5) (not shown), and as such is the triangularly-weighted average of 31 input data points P(17) through P(47) (not shown). As stated previously, for 50% overlap, the beginning P(i) data point shifts ahead $2^N$ for each successive B(1,j) term. For N=4, $2^N=16$.

To conclude, the B-function terms which are output are each a triangularly weighted average of a consecutive plurality of input sample points. For a given number of data input points in a stream, far fewer B-function terms are output, with the number of B terms decreasing by powers of two as additional bands are added to the system. Any local average value of the input signal is carried by the B terms in the transform domain, but the Band 1 B-function terms above do not carry sufficient detail to permit reconstruction. In the Fourier sense, the frequency spectrum of the B-functions lies principally in the range of from zero to a value $(F_{max}/2^N)$, where $F_{max}$ is one-half the sample frequency, and N is the number of bands in the system. (The input signal is assumed to be band limited from zero to Fmax.)

To permit reconstruction, at least one additional basis function must be employed since the B-terms alone are not sufficient. The next basis function is herein termed a "D" function. D-function coefficients are generated for each band, beginning with Band N, and are immediately output, without contributing to calculations for lower bands. For Band N, the actual input data points P(i) are sampled and appropriately weighted to generate the D-coefficients. For all lower bands, beginning with Band N−1, the B-terms from the next higher band are sampled and appropriately weighted to generate the D-coefficients. The D-function may also be viewed as a weighting function.

Figure 4A:
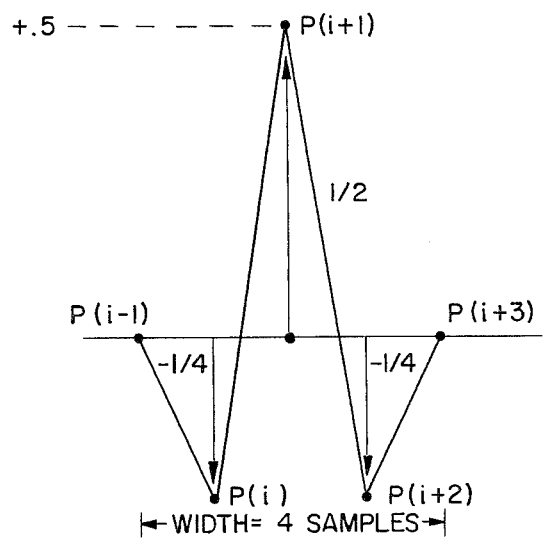
FIG. 4A shows the weighting envelope shape for a Band N D-function coefficient.

Specifically, the D-function is a $-\frac{1}{4}, +\frac{1}{2}, -\frac{1}{4}$ weighting function. The envelope shape for a Band N D-function is shown in FIG. 4A.

The D-function coefficients for Band N are the only ones calculated directly from input sample points, and are as follows:

$$D(N,j+m) =$$

$$-\frac{P(i+2m)}{4} + \frac{P(i+2m+1)}{2} - \frac{P(i+2m+2)}{4},$$

where m=0, 1, 2, 3 etc.

For all lower bands the D-function coefficients are calculated from the B-terms from the next higher band, as follows:

$$D(n,j+m) = -\frac{B(n+1,j+2m)}{4} + \frac{B(n+1,j+2m+1)}{2} -$$

$$\frac{B(n+1,j+2m+2)}{4},$$

where n=N−1, N−2, ..., 3, 2, 1; and m=0, 1, 2, 3, etc.

While the D-function coefficients for all bands below Band N are defined above in terms of the B-function terms for the next higher band, direct expressions in terms of the actual input data points can be derived, although entirely unnecessary for the fast calculation methods.

Nevertheless, for purposes of illustration, a D-coefficient for Band N−1 is developed next below, and the envelope shape depicted in FIG. 4B.

First:

$$D(N-1,j) = -\frac{B(N,j)}{4} + \frac{B(N,j+1)}{2} - \frac{B(N,j+2)}{4}.$$

Figure 4B:
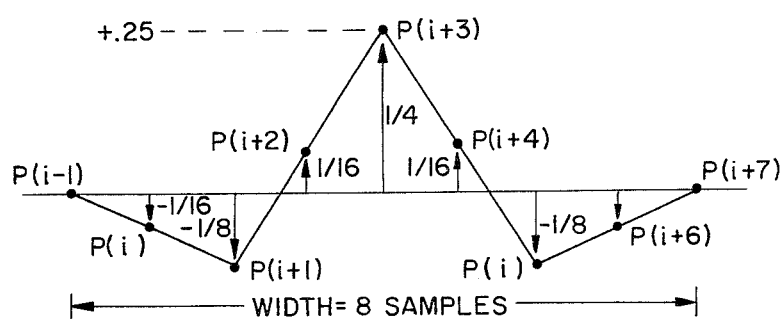
FIG. 4B shows the weighting envelope shape for a Band $N-1$ D-function coefficient.

Substituting the previously-developed expressions for B(N,j), B(N,J+1), and B(N,J+2) yields:

$$D(N-1,j) = -\frac{1}{16}P(i) - \frac{1}{8}P(i+1) + \frac{1}{16}P(i+2) +$$

$$\frac{1}{8}P(i+3) + \frac{1}{16}P(i+4) - \frac{1}{8}P(i+5) - \frac{1}{16}P(i+6),$$

as shown in FIG. 4B.

Comparing FIGS. 4A and 4B, it can be seen that the envelope shape is the same in both cases. The FIG. 4B envelope for Band N−1 has twice the length and half the maximum height compared to the FIG. 4A envelope for Band N.

Properties of the D-function are that it is a continuous even function having a first derivative which is piecewise continuous. The average value of the D-function is zero. Further, the D-function has the useful property that its coefficients are zero for any sequence of input signal samples with constant slope.

As pointed out in the definitional expressions above, it is not necessary to calculate all possible D-coefficients in the preferred embodiments. For example, the first two D-coefficients actually calculated for Band N are:

$$D(N,j) = -\frac{P(i)}{4} + \frac{P(i+1)}{2} - \frac{P(i+2)}{4}, \text{ and}$$

$$D(N,j+1) = -\frac{P(i+2)}{4} + \frac{P(i+3)}{2} - \frac{P(i+4)}{4}.$$

For reconstruction in the absence of quantization such as is introduced by the FIG. 1 quantizer 34, the Band 1 B-function terms and the D-function coefficients (including all m-values) for all bands, Band N through Band 1, are completely sufficient. The original signal can be exactly reproduced. However, quantization is essential for any practical digital communication system, which is the primary field of application intended.

To add further strength to the subject Triangle and Pyramid transforms, a class of basis functions, herein termed "S"-functions, is defined. Coefficients for these functions are also generated for each band, beginning with Band N, and are immediately output without contributing to calculations for lower bands. S-coefficients are generated from appropriately weighted samples of the actual input data points for Band N, and of B-terms from the next higher band for all lower bands beginning with Band N−1.

With the inclusion of S-coefficients, for reconstruction it is sufficient to have all Band 1 B-function terms, and just odd-m D-coefficients and odd-m S-coefficients, defined next.

Figure 5A:
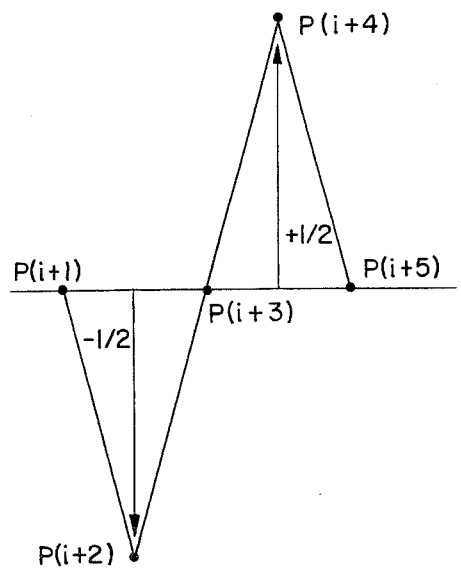
FIG. 5A illustrates the weighting envelope shape for a Band N S-function weighting envelope in accordance with the invention.
Figure 5B:
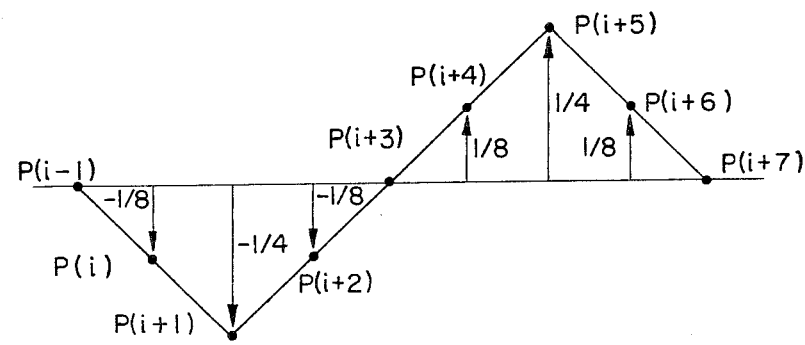
FIG. 5B illustrates the envelope shape of a Band $N-1$ S-function weighting envelope in accordance with the invention.

Specifically, the S-function is a $-\frac{1}{2}$, 0, $+\frac{1}{2}$ weighting function. The envelope shape for a Band N S-function is shown in FIG. 5A, and that for a Band N−1 S-function is shown in FIG. 5B.

The S-function coefficients for Band N are defined in terms of input sample points as follows:

$$S(N,j+m) = -\frac{P(i+2m)}{2} + \frac{P(i+2m+2)}{2},$$

where m=0,1,2,3, etc.

The S-function coefficients for all lower bands are defined in terms of preceeding band B-function term as follows:

$$S(n,j+m) = -\frac{B(n+1,j+2m)}{2} + \frac{B(n+1,j+2m+2)}{2},$$

where n=N−1, N−2, ... 3, 2, 1; and m=0, 1, 2, 3, etc.

A useful property, which the S-function however lacks, is that of generating coefficients of zero value for a sequence of input sample points having a constant slope. To provide this property, the S-function may be "normalized". Two normalized S-functions are defined herein, "SM" and "SN", and both are odd functions. The SN-function is prefered due to advantages which accrue in the calculations for both the forward and inverse (reconstruction) transforms.

FIG. 6 depicts the envelope shape of the SM-function for Band N. The SM-function does have the useful property of generating zero-value coefficients for any sequence of input samples with constant slope. The SM-function envelope spans one and one-half times the number of sample points as the S-function envelope. The envelope shapes for successive lower bands have twice the length, and one-half the height of the respective preceeding bands.

To compute an SM-function coefficient requires the calculation of $B_x$-type terms which would not otherwise be calculated because they involve the overlap of different input points. These $B_x$-type terms are, for Band N:

$$B_x(N,j+m) = \frac{P(i+2m+1)}{4} + \frac{P(i+2m+2)}{2} + \frac{P(i+2m+3)}{4},$$

where m=0, 1, 2, 3, etc.

For all bands below Band N they are:

$$B_x(n,j+m) = \frac{B(j+2m+1)}{4} + \frac{B(j+2m+2)}{2} + \frac{B(j+2m+3)}{4}$$

where n=N−1, N−2, ... 3, 2, 1; and m=0, 1, 2, 3, etc.

As a specific illustration, the first two regular B-terms are formed from P(i), P(i+1) and P(i+2); and P(i+2), P(i+3), and P(i+4). P(i+2) is overlapped. However, the first two $B_x$-terms are formed from P(i+1), P(i+2), and P(i+3); and P(i+3), P(i+4), and P(i+5). P(i+3) is overlapped.

The SM-function for any band is defined as:

$$SM(n,j+m) = S(n,j+m) - \frac{B_x(n,j+m+1)}{2} + \frac{B_x(n,j+m)}{2}$$

where n=N, N−1, N−2, ... 3, 2,; and m=1, 2, 3, etc.

FIG. 7 depicts the envelope shape of the preferred SN-function for Band N. The SN-function also has the useful property of generating zero-value coefficients for any sequence of input samples with constant slope. The SN-function spans twice the number of input sample points as the S-function. The envelope shapes for lower bands also have twice the length and one-half the height as for preceeding bands.

The SN-function for any band is defined as:

$$SN(n,j+m) = S(n,j+m) + \frac{B(n,j+m-1)}{4} -$$

-continued $$\frac{B(n, j + m + 1)}{4},$$

where n=N, N−1, N−2, ... 3, 2, 1; and m=1, 2, 3, etc., with odd values of m being sufficient.

Additional functions in accordance with the invention, specifically "H" and "L" functions, are defined hereinbelow in the context of a specific implementation.

From the foregoing definitions and discussion, it can be seen that any local average value of the input signal is carried exclusively by the B function terms in the transform domain, and not by coefficients from the D, S, SM, or SN functions. It is possible to define an additional average-value term which is subtracted from all of the B-terms, but this is not necessary and often not desirable as much of the attractiveness of the subject Triangle & Pyramid transforms is in the finite duration of all the component functions. Also, the B-function terms must carry the constant slope information as well, since none of the D, SM, or SN coefficients has a non-zero value for signal points having a constant slope.

When carried to a second dimension, the Triangle transform becomes the Pyramid transform. This extension may be contrasted with the extension from one to two dimensions for many other transforms.

More particularly, the usual extension from one to two dimensions for many transforms is to first perform a complete one-dimensional transform on each row of elements in a two-dimensional array, and to order the results by row and rank (e.g. frequency, sequency, etc.). Then a complete second one-dimensional transform is performed on each of the columns resulting from the ordered one dimensional row transforms.

The extension from the one dimensional Triangle Transform to the two dimension Pyramid Transform differs considerably with important beneficial results. First, there are significantly fewer calculations which must be performed in realizing the Pyramid Transform. Second, the Pyramid Transform may be calculated in pieces or sections in a flow which progresses as the input data from the signal flows into the transform device. A beneficial consequence of this is the reduced internal storage memory capacity necessary, as in most cases the first coefficients may be output soon after the first data samples become available and far sooner than the final input data samples become available. In many other transforms it is necessary to artificially separate the input data into blocks to realize this computational advantage with the resulting limitation that artifact edges may be generated in the reconstructed replica of the signal at the edges of the blocks. A related, major advantage of the Pyramid transform over many other two-dimensional transforms is that, when implemented as described next below, the number of calculations decreases by a factor of four for each successive band.

For the Pyramid Transform, a sequence, as now described, is repeated a number of times equal to the number of bands selected for use in the transform. A partial transform in one dimension comprising those steps necessary to output the coefficients and B-type terms for a single band is first performed on each row of elements (e.g. horizontal row) in a two-dimensional array. The results of this first transform process of each row are ordered in a row themselves by type (e.g. B, D, Sn, H or L) and position. A second partial transform in one dimension comprising those steps necessary to output the coefficients and B-type terms for a single band is next performed on each column of the ordered results of previously transformed horizontal data. The result is a two-dimensional forward transform of a single band.

The results of this sequence are outputs of two categories:

(1) Two-dimensional coefficients assigned to the band just processed which require no additional calculations; and (2) B-function terms with a pyramid-weighted average of a selected two-dimensional array of input samples which form the two-dimensional array of data samples which are input to transform processing in the next lower band.

Of the outputs resulting from each successive group of sixteen input data samples and the aforementioned processing sequence, there are four pyramid-weighted average terms and a minimum of twelve coefficients. The number of data samples in the two-dimensional array available for transformation in the next lower band is therefore one-fourth that of the number available to the band just completed.

The aforementioned processing sequence is next repeated for the next lower band, as a result of which a minimum of twelve coefficients and a group of four pyramid weighted terms are issued. As before, the two dimensional coefficients are output, requiring no further processing, and the pyramid-weighted terms become the input data samples to the next lower band. The processing sequence continues until Band 1 transformation is complete, at which point both the two-dimensional coefficients and the pyramid-weighted average terms are output as Band 1 results.

The subject transforms can be organized in a plurality of ways, within some restrictions. Various combinations of the aforementioned functions can be used in a number of bands.

Figure 8A:
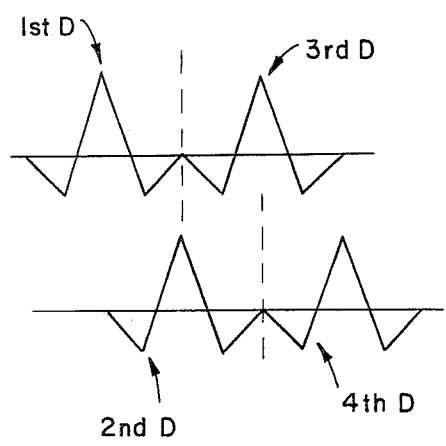
FIG. 8A is a diagram showing one form of transform organization wherein two D-function coefficients are generated for each four input samples.

Returning to the single dimension case, there must be two coefficients in the highest band, Band N, for each four input samples. One possible method, as depicted in FIG. 8A, is to use two D coefficients for each four input samples. In this case the weighting envelope of each D-coefficient overlaps that of an adjacent D-coefficient by 50%.

Figure 8B:
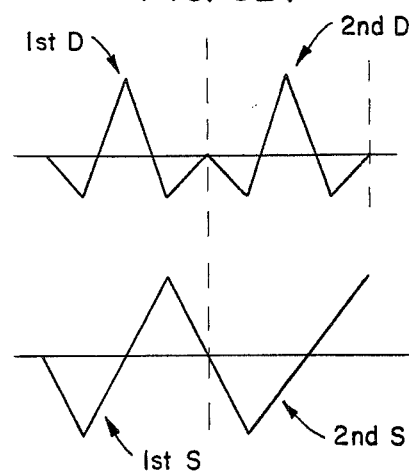
FIG. 8B illustrates another organization in accordance with the invention wherein one D-function coefficient and one S-function coefficient in Band N is employed for every four input samples.

Another method, depicted in FIG. 8B, is to use one D-coefficient term and one of the S-type coefficients in Band N for every four input samples. In FIG. 8B, the "D" and "S" type functions are located so their centers lie on the same sample.

Other combinations, such as two "S" functions, and a "D" and "S" function which alternate are also possible. The preferred embodiment of the subject invention employs a "D" type and an overlapping coefficient of one of the "S" types, which leads to a more robust reconstruction of the signal.

Figure 8C:
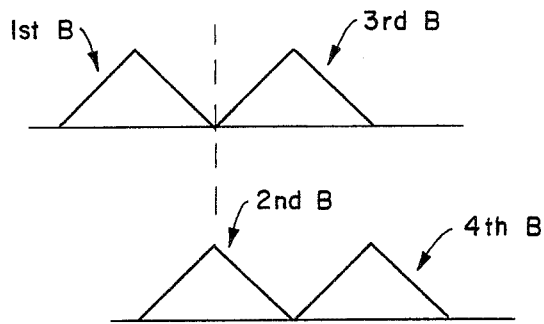
FIG. 8C illustrates overlapping envelopes for B-function terms in accordance with the invention.

In Band N−1 of the preferred embodiment, there must be two coefficients of one of the aforementioned combinations of D and S types for each eight input samples. For Band N−2 there must be two coefficients for each sixteen input samples, and so forth. In addition to these coefficients in Band N down through Band 1, there must be two B-type terms for each pair of Band 1 coefficients. The envelopes for these B-type functions are shown in FIG. 8C, and may be seen to overlap each other by 50%. In general, for interior signal areas the minimum number of coefficients plus B-function terms are equal to the number of input samples from the signal on the average. It is not possible to associate a fixed number of specific coefficients directly with a like number of specific input samples due to the continuous overlapping nature of the transforms. This is in contrast with most prior art transforms, but gives the transform much of its strength and utility.

By way of brief summary, the following are five combinations sufficient for reconstruction, given in groups of four data samples:

(1) Two B-terms and two D-coefficients, with D's for all values of m;

(2) Two B-terms and two S-coefficients, with S's for all values of m;

(3) Two B-terms, one D-coefficient, and one S-coefficient, with D's and S's for odd values only of m;

(4) Two B-terms, one D-coefficient, and one SN-coefficient for odd values only of m; and (5) (Presently preferred) Two B-terms, one H-coefficient, one L-coefficient, and a D carry-up (described hereinafter) from the next lower band.

As mentioned several times above, the subject invention includes a fast technique for performing the calculations of the Triangle and Pyramid transforms resulting in a device of considerable simplicity relative to a device for performing direct calculations. Whereas the direct implementation obviously requires multiplications by other than powers of two, the fast method requires only power-of-two multiplications which can be accomplished by simple shift operations in the digital hardware implementation. There is also much overlapping of calculations through use of an appropriate decimation process, which will now be described.

Figure 9:
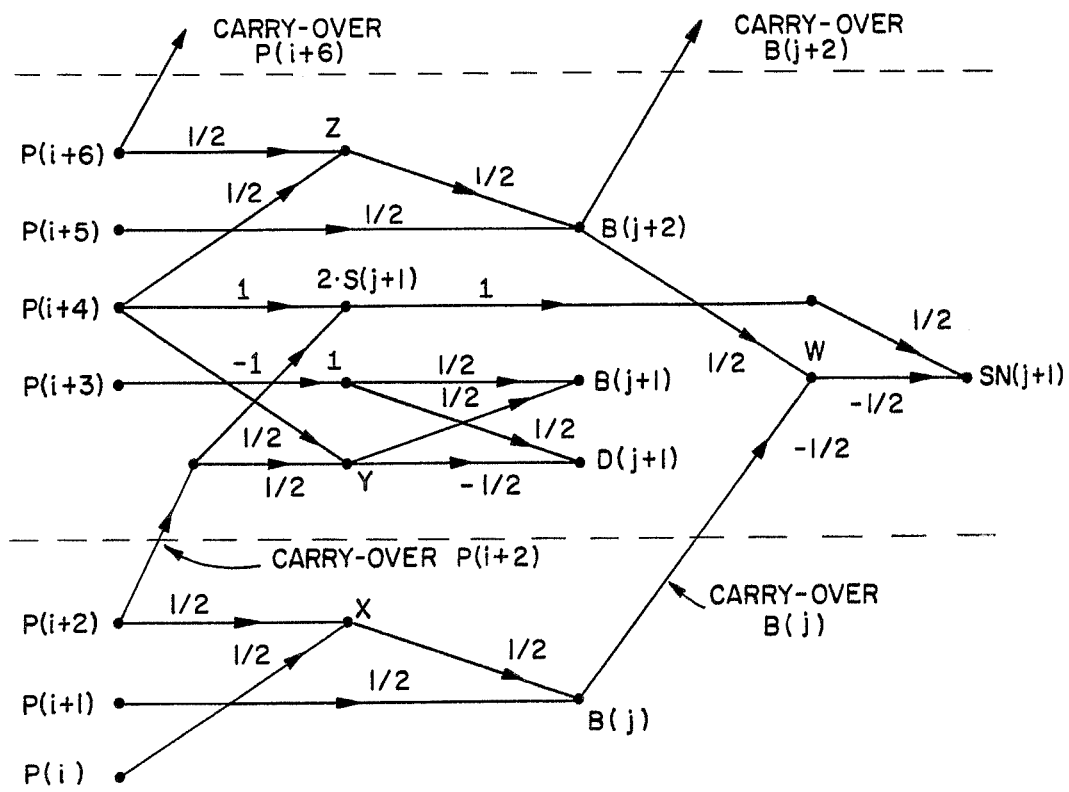
FIG. 9 is a signal flow diagram for a signal decimation process for the forward triangle transformation as implemented within one processing block.

A signal decimation process for the forward Triangle transformation can be represented by the equations shown in the following TABLE I, and a corresponding signal flow diagram is shown in FIG. 9. FIG. 9 also may be viewed as depicting the operations performed within a single processing block in an actual embodiment of the invention, as explained hereinafter with reference to FIG. 11. In FIG. 9, the first band, Band N, is assumed, and the inputs are therefore input data points P(i). The desired output coefficients are $D(N,j+1)$ and $SN(N,j+1)$. $B(N,j)$, $B(N,j+1)$ and $B(N,j+2)$ are intermediate results which are used as inputs to the next decimation process in the next lower band. W, X, Y, and Z are merely temporary intermediate results which are discarded after use.

TABLE I $X = \frac{1}{2} P(i) + \frac{1}{2} P(i+2)$
$Y = \frac{1}{2} P(i+2) + \frac{1}{2} P(i+4)$
$Z = \frac{1}{2} P(i+4) + \frac{1}{2} P(i+6)$
$2 * S(j+1) = P(i+4) - P(i+2)$
$B(N,j) = \frac{1}{2} P(i+1) + \frac{1}{2} X$
$B(N,j+1) = \frac{1}{2} P(i+3) + \frac{1}{2} Y$
$B(N,j+2) = \frac{1}{2} P(i+5) + \frac{1}{2} Z$
$W = \frac{1}{2} B(j+2) - \frac{1}{2} B(j)$
$D(N,j+1) = \frac{1}{2} P(i+3) - \frac{1}{2} Y$
$SN(N,j+1) = \frac{1}{2} (2 * S(N,j+1)) - \frac{1}{2} W$ The FIG. 9 diagram shows all of the operations needed to yield the desired outputs. The operations performed within a single processing block are shown between the two dashed lines. Carry-over terms are shown which cross the dashed lines to support calculations in the next adjacent processing block in the same band. B(N,j) and B(N,j+2) are used in the formation of SN(j+1). Each B is a weighted average of three adjacent input samples. The weights form a triangular envelope, and adjacent triangular envelopes overlap each other by one-half the width of the base of the triangle.

Figures 10A, 10B:
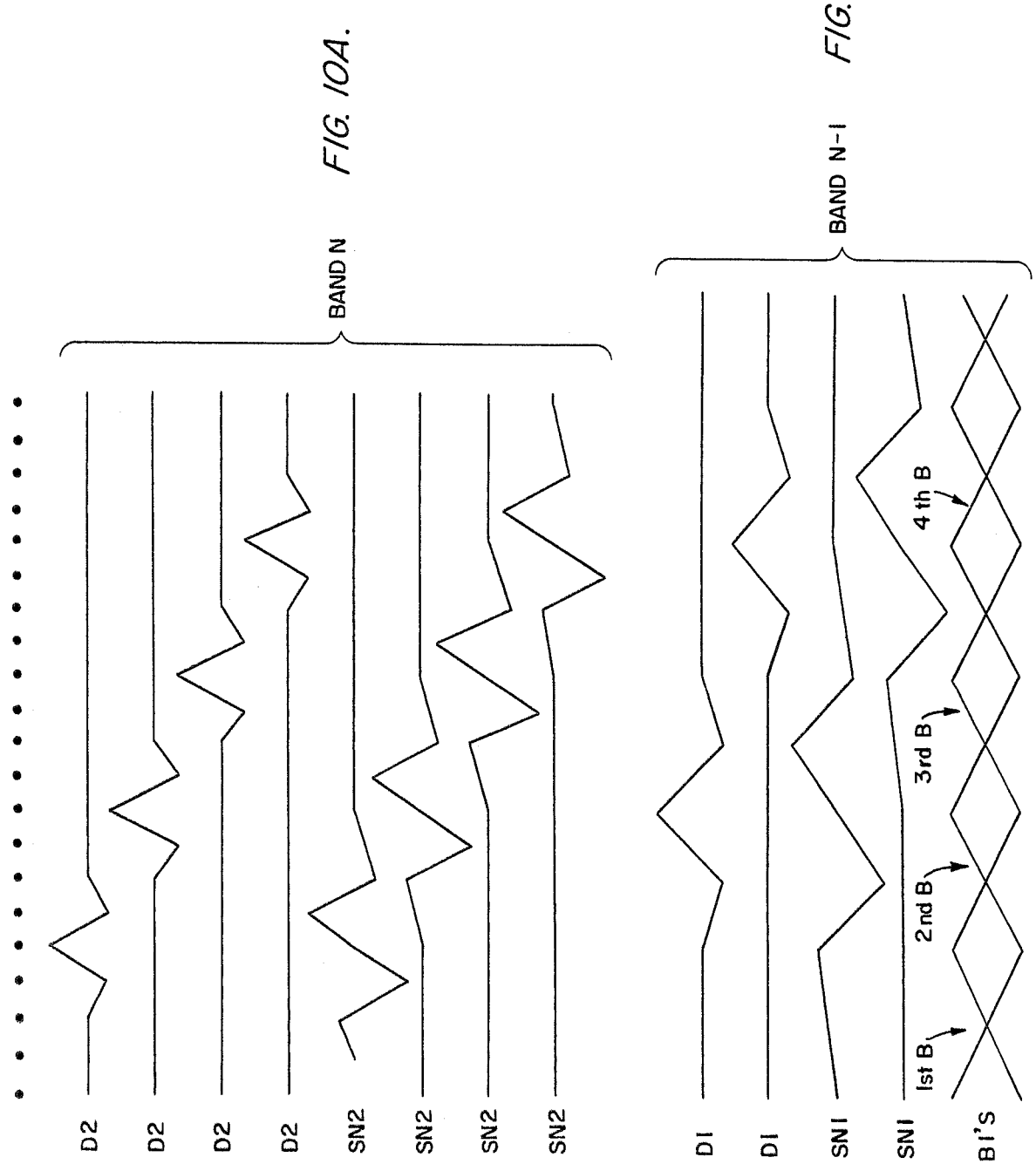
FIG. 10A illustrates overlapping envelopes for multiple D- and SM-functions in Band N.
FIG. 10B shows the alignment of overlapping envelopes of triangular D-functions in Band $N-1$, together with D- and SN-functions.

For successive lower bands, the B-terms are used as inputs to the decimation process of FIG. 9. The resultant D-type, S-type, and SN-type coefficients all have the same envelope shapes as their counterparts one band higher. The envelopes are in this case one half the height and twice the width of the corresponding higher band envelopes. FIG. 10A shows the alignment of multiple D and SN-functions in Band N. FIG. 10B also shows the alignment with triangular B-functions and D-type and SN-type coefficients in Band N−1. Thus the triangular averaging of a previous trio of triangular averages yields a weighting of samples which also forms a triangle but of twice the width and half the height of each of the previous triangles. Subsequent decimation at one band lower yields still another triangle this time involving 15 elements of P with an envelope width of 16 samples. At Band 1 these triangles provide the transform base functions to complete the forward transformation process. FIGS. 10A and 10B are discussed again hereinbelow under the heading "Inverse Triangle and Pyramid Transform Concepts".

Figure 11:
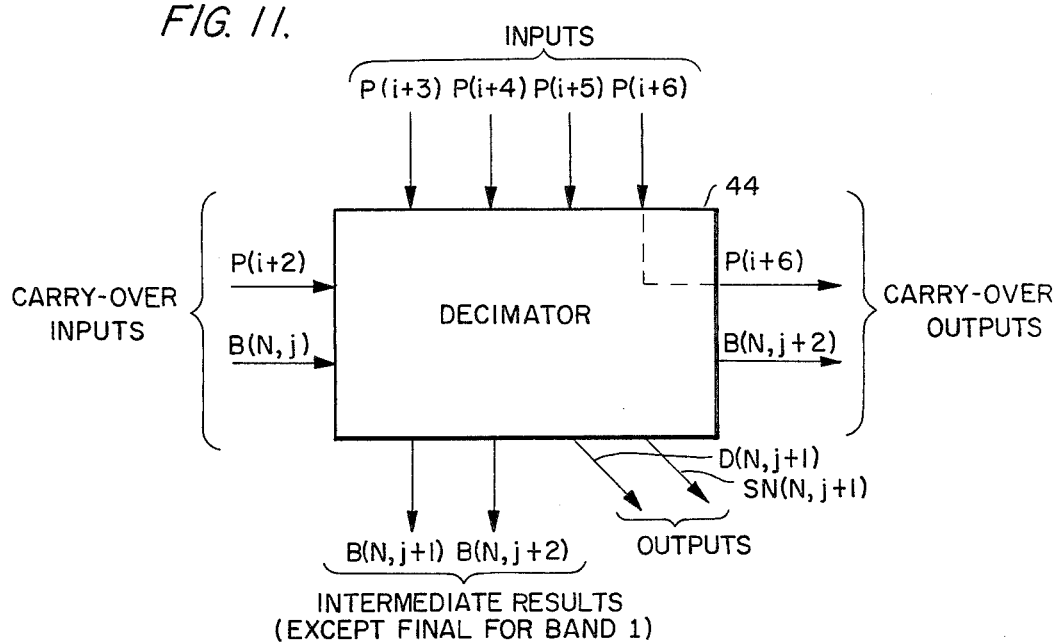
FIG. 11 illustrates connections to a single decimator block.

With reference now to FIG. 11, there are shown the connections to a single decimation or processing block 44 corresponding to the intermediate processing block in the FIG. 9 signal flow diagram. For clarity, the highest band Band N is assumed, and the notation applied accordingly. It will be appreciated, however, that for lower band processing blocks the internal operations are identical, but the inputs are B-terms from the next higher band.

In conclusion, a processing block may be generally defined as the smallest set of processing steps which of themselves do not repeat, but which, when taken with other processing blocks, repeat as a set without any additional steps being required to interconnect them and are sufficient to perform the transform over the space of an arbitrarily large set of input data points.

Figure 12:
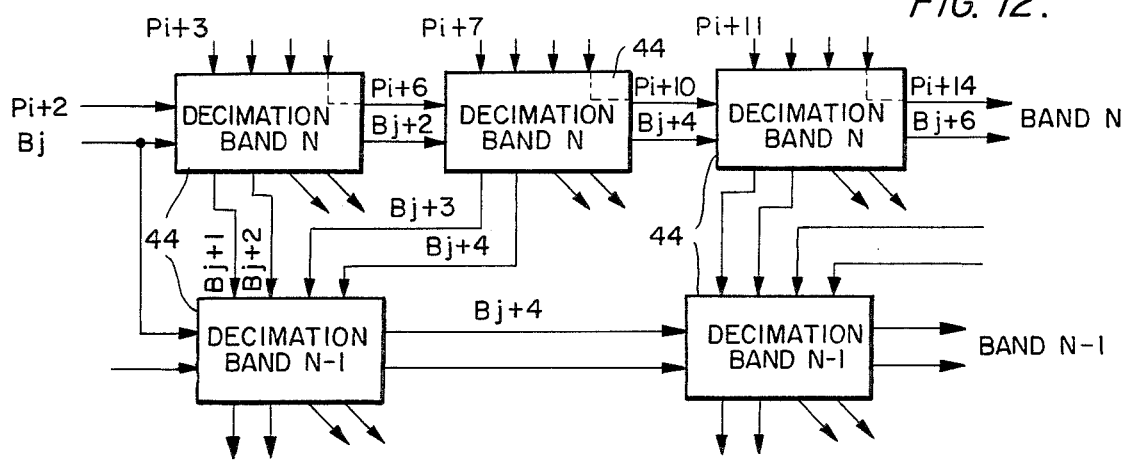
FIG. 12 illustrates how the FIG. 11 decimator blocks may be interconnected.

FIG. 12 shows how the FIG. 11 decimation blocks are interconnected. Specifically, FIG. 12 shows a small section of interconnected decimation blocks 44 in both Band N and Band N−1. As shown, for a one-dimensional transform in an interior signal area there are one-half the number of decimation blocks 44 required in Band N−1 as in Band N. Band N−2 requires half the number as for Band N−1 and so forth.

Figure 13:
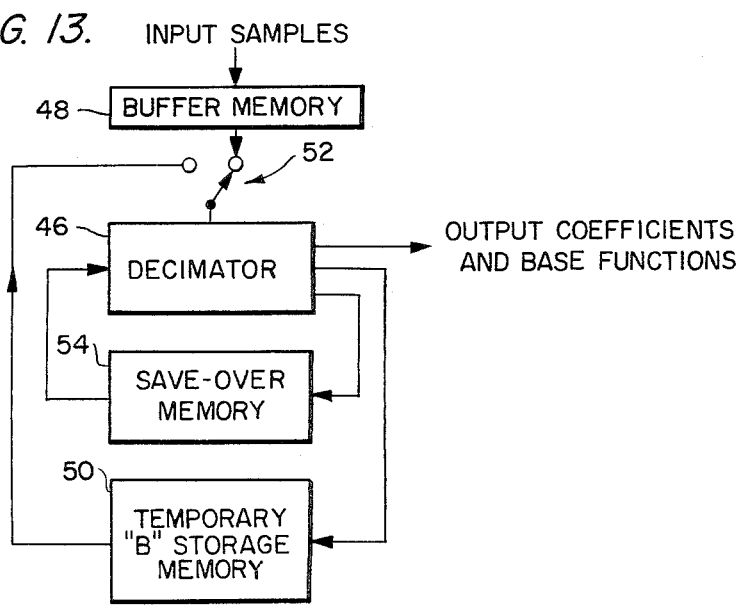
FIG. 13 illustrates how a single decimator block, such as that of FIG. 11, may be employed in combination with a memory to allow the same processing block to perform repeated operations in successive stages of processing.

It is possible, although not necessary, to have a single device 46 perform all of the decimations in an appropriate sequence to minimize the amount of memory required to save intermediate results. Use of a single decimation device 46 is shown in FIG. 13. A buffer memory 48 stores incoming input samples of the signal to be transformed, and a B-storage memory 50 stores intermediate B-terms. Switch 52 is thrown into a position to accept four of these samples in sequence, P(i+3), P(i+4), P(i+5) and P(i+6). The decimator 46 also receives P(i+2) and B(j) from a save-over memory 54. Assuming for clarity Band N, the calculations then performed by the decimator 46, shown in detail hereinafter in the detailed device description, are given in the following TABLE II:

TABLE II $B(N, j + 1) = \frac{P(i + 2)}{4} + \frac{P(i + 3)}{2} + \frac{P(i + 4)}{4}$, $B(N, j + 2) = \frac{P(i + 4)}{4} + \frac{P(i + 5)}{2} + \frac{P(i + 6)}{4}$,

TABLE II-continued $$D(N, j + 1) = -\frac{P(i + 2)}{4} + \frac{P(i + 3)}{2} - \frac{P(i + 4)}{4},$$

$$S(N, j + 1) = -\frac{P(i + 2)}{2} + \frac{P(i + 4)}{2},$$

$$SN(N, j + 1) = S(N, j + 1) + \frac{B(N, j)}{4} - \frac{B(N, j + 2)}{4}.$$

The SN term, while involving non-trivial multipliers when expressed totally in terms of elements of P, can be expressed indirectly as shown using only trivial multipliers (powers of two). The outputs, 46, of the decimator for all bands are $D(N,j+1)$ and either the $S(N,j+1)$ or $SN(N,j+1)$ coefficient depending on the particular application. Also, for band one, the $B(1,j+1)$ and $B(1,j+2)$ terms are outputs. For Band 2 up through Band N, these latter results are stored in the Temporary B Storage Memory 50 to be used later as input elements to the decimator 46 when calculating results in Band N−1 through Band 1. When these latter decimations are performed, the switch 52 is thrown such as to accept input samples from the Temporary B-Storage Memory 50.

A sequence of decimations in the various bands N, N−1, N−2, etc. can be determined which yields the minimum amount of B storage memory 52. This requires that a decimation be performed in the present band after the last decimation in the same band and two in the next higher band. A partial sequence is then given as:

N, N, N−1, N, N, N−1, N−2, N, N, N−1, N, N, N−1, N−2, N−3, . . . .

The $D(n,j+1)$ and $S(n,j+1)$ or $SN(n,j+1)$ coefficients issuing from the decimation process may be taken as outputs directly, or may be further subjected to linear rearrangement. A particularly useful rearrangement in accordance with the subject invention are the formation and use of "H" and "L" functions. These functions are defined as:

$$H(n,j+m) = k * DCU - D(n,j+m) - SN(n,j+m),$$

and $$L(n,j+m) = k * DCU - D(n,j+m) + SN(n,j+m)$$

when using SN-type terms and, $$H(n,j+m) = -D(n,j+m) - S(n,j+m),$$

and $$L(n,j+m) = -D(n,j+m) + S(n,j+m)$$

when using S-type terms.

DCU (for D Carry-Up) is a D-type coefficient in the next lower band formed from the three B-type terms centered around the D-term:

$$DCU = -\frac{B(n,j+m)}{4} + \frac{B(n,j+m+1)}{2} - \frac{B(n,j+m+2)}{4}$$

and k is a constant selected by the user, usually in the range between zero and unity.

The principal reason for including the parameter "k" is to give the user a parameter to control the smoothness of the impulse response in the reconstruction transform. A value of k of one-half has been used successfully and, being a power of two, does not introduce a non-trivial multiplication. The calculation of B-type terms is not affected by the introduction of "k" or of the "H" and "L" functions.

Figure 14:
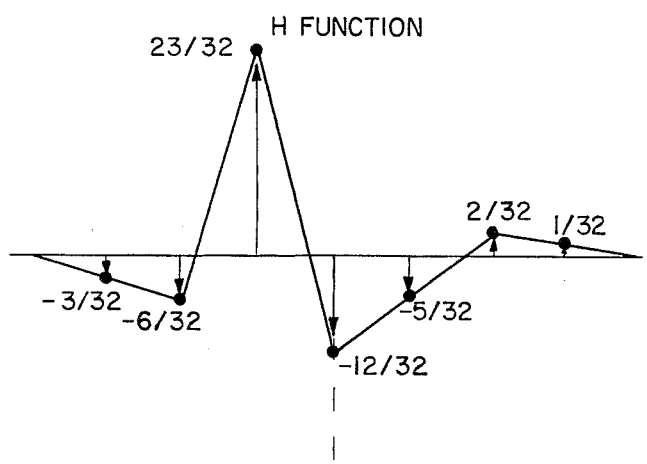
FIG. 14 shows the weighting envelope shape of an H-function in accordance with the invention.
Figure 15:
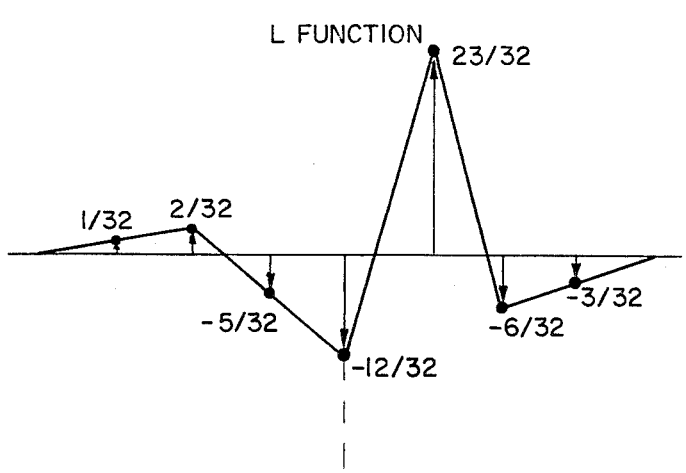
FIG. 15 shows the weighting envelope shape of an L-function in accordance with the invention.

FIGS. 14 and 15 show the envelope shapes for "H" and "L" basis functions with the parameter "k" chosen as ½. Each is the mirror image of the other around a common center and both span the same number of input points, unlike the "D" and "SN" functions.

Figure 16:
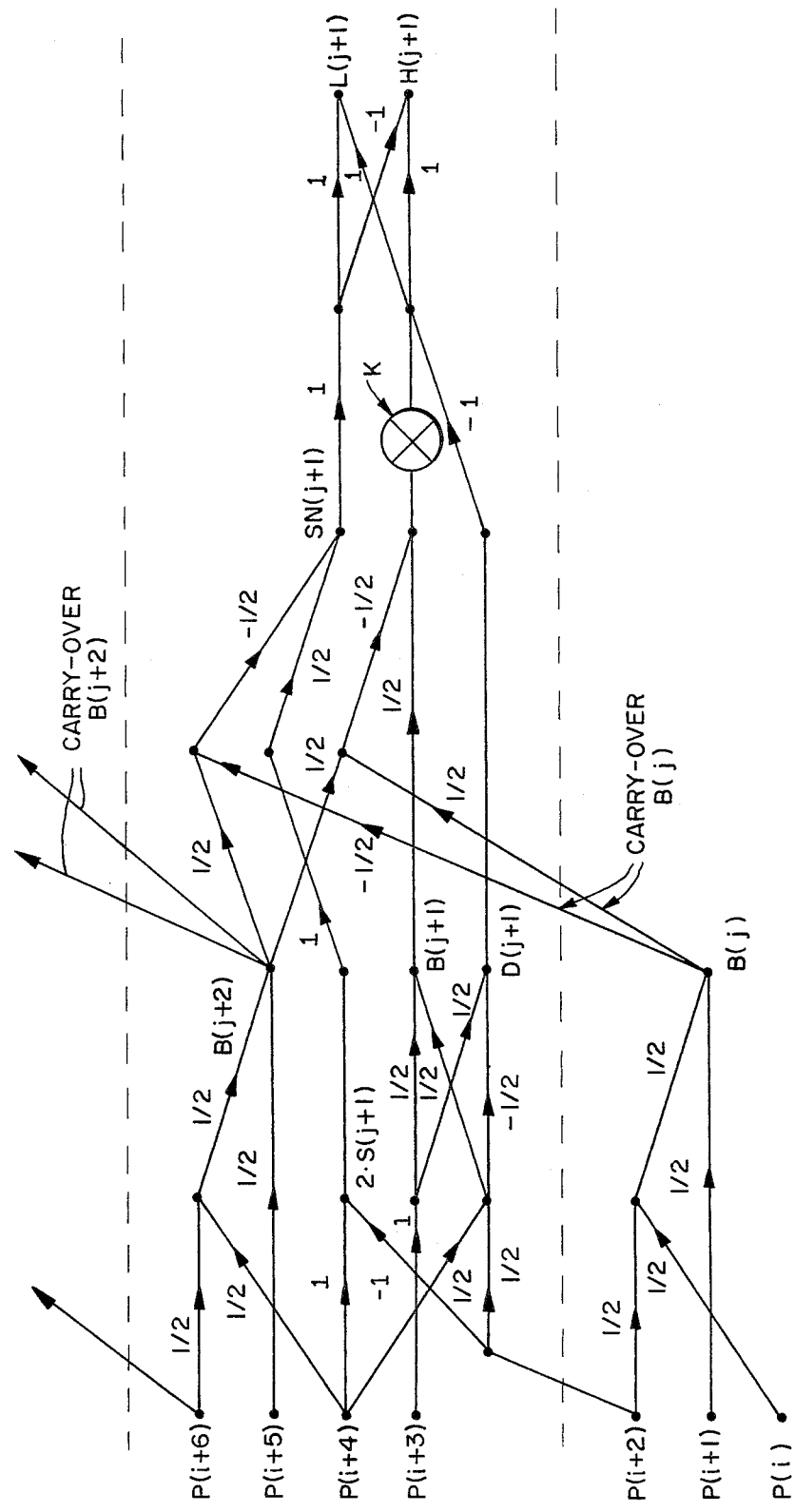
FIG. 16 is a signal flow diagram of a forward transform including calculations for the H and L functions.

FIG. 16 is a signal flow diagram which includes the H and L calculations. FIG. 16 may be compared to FIG. 9, and likewise corresponds to a processing block.

To minimize the amount of temporary storage memory required for the two-dimensional transform (Pyramid transform), and using the fast method of calculation introduced for the one dimensional case, an optimum sequence of horizontal and vertical transforms of each band can be chosen. Only enough samples are processed both horizontally and then vertically in one band to produce sufficient input samples at the next lower band to perform a processing sequence in that band. Considering that two dimensional transforms such as images are usually of finite length with attendant edges, it is often convenient to perform a sequence of processing blocks which include both horizontal and vertical transformations, say horizontally from the left edge to the right edge. After two of these adjacent horizontal strips of processing blocks have been performed, enough input samples are then available to perform a horizontal processing strip at the next lower band. A processing block here requires a four-by-four array of input samples, plus terms saved over in both the horizontal and vertical directions. The output results from the block are twelve coefficients requiring no further processing and a two-by-two array of base functions, each a pyramid-weighted average of a square group of input samples. A square array of four of these two-by-two arrays is required then to perform a processing block at the next lower band.

By way of specific example, the following TABLES III, IV and V illustrate the manner in which a two-dimensional transform proceeds. For clarity, the subscript notation is simplified by eliminating the band number. However, additional notations are added. Lower case letters "a", "b", "c", "d" and "e" indicate exemplary rows of a two-dimensional input data matrix. Lower case letters "h" and "v", when present, indicate that a particular term or coefficient is the result of a horizontal transformation, or both a horizontal and a vertical transformation.

First, TABLE III simply summarizes the various input elements which must be available to perform the fast two-dimensional Pyramid transform operations of a processing block in one band. For clarity, BAND N is assumed, so actual input data points P(i) are employed.

TABLE III

| Row | Column | | | | | |
|---|---|---|---|---|---|---|
| | | W | X | Y | Z | |
| b | B(j)hb | Pb(i+3) | Pb(i+4) | Pb(i+5) | Pb(i+6) | Pb(i+7) |
| c | B(j)hc | Pc(i+3) | Pc(i+4) | Pc(i+5) | Pc(i+6) | Pc(i+7) |
| d | B(j)hd | Pd(i+3) | Pd(i+4) | Pd(i+5) | Pd(i+6) | Pd(i+7) |
| e | B(j)he | Pe(i+3) | Pe(i+4) | Pe(i+5) | Pe(i+6) | Pe(i+7) |
| | SAVE OVERS | | | NEW ELEMENTS | | |

In the above TABLE III, four rows, b, c, d and e of data are shown. The first two columns, labeled only "Save Overs", are points carried or saved over from adjacent processing blocks for the same band. The remaining four columns, labeled "New Elements" and headed W, X, Y and Z, are new elements taken from the actual input data, not previously operated upon. For example, Pb(i+3) designates an input data point from row "b" and column i+3 of the input data matrix.

In the actual processing, a decimation operation is performed (separately) on each of the four rows "b" through "e" of TABLE III. Rows "b" through "e" of the following TABLE IV depicts the results of the horizontal operations:

TABLE IV

| Row | Column | | | |
|---|---|---|---|---|
| | W | X | Y | Z |
| (save overs) | — | B(j)vB(j+1)h | — | B(j)vB(j=2)h |
| a | Hha | B(j+1)ha | Lha | B(j+2)ha |
| b | Hhb | B(j+1)hb | Lhb | B(j+2)hb |
| c | Hhc | B(j+1)hc | Lhc | B(j+2)hc |
| d | Hhd | B(j+1)hd | Lhd | B(j+2)hd |
| e | Hhe | B(j+1)he | Lhe | B(j+2)he |

As may be seen from TABLE IV, the results of the row transformations are "H" and "L" coefficients, as well as "B" terms, ordered in rows by band number. For the row transformations, "normalized" H and L coefficients are calculated, meaning the H and L coefficients are derived from D and SN coefficients, rather than from D and S coefficients.

Additionally, in TABLE IV, each column is augmented by a term (in Row "a") saved over from the previous processing of a vertical transformation adjacent to it in the same column of processing blocks. Columns "X" and "Z" are also each augmented by a BvBh-type term saved over to perform normalization.

Next, a vertical decimation operation (transform) is performed (separately) on each of the four columns "W" through "Z" of TABLE IV. The final results are depicted in the following TABLE V:

TABLE V

| row | column | | | |
|---|---|---|---|---|
| | W | X | Y | Z |
| b | HvHh | HvB(j+1)h | HvLh | HvB(j+2)h |
| c | B(j+1)vHn | B(j+1)vB(j+1)h | B(j+1)vLn | B(j+1)vB(j+2)h |
| d | LvHh | LvB(j+1)h | LvLh | LvB(j+2)h |
| e | B(j+2)vHn | B(j+2)vB(j+1)h | B(j+2)vLh | B(j+2)vB(j+2)h |

From the foregoing TABLE V, the results of the column transformations are "H" and "L" coefficients, as well as "B" terms, ordered in columns by band number. For the column transformations, it is sufficient to calculate "normalized" "H" and "L" coefficients for only columns X and Z of TABLE IV (which columns contain only "B"-type terms). When normalized "H" and "L" coefficients are calculated for the horizontal transformation, the results of which are represented in TABLE IV, it turns out to be unnecessary to calculate normalized "H" and "L" coefficients for the vertical transformation of columns "W" and "Y" of TABLE IV.

An important aspect of the two-dimensional transform, accomplished by the foregoing, is that for any image area with either (1) constant magnitude, or (2) constant slope in either the horizontal or vertical direction, "H" and "L" coefficients of zero value result.

It is usually sufficient to normalize S-type terms in only one dimension and for only operations in the second dimension involving B-type terms issuing from the operations of the first dimension. A motivation for normalizing S-type terms is to cause the resulting SN coefficients to be zero for consecutive input samples with a constant slope. After the transform is taken in one dimension, half of the resulting columns are B-type terms and the other half, whether they be "D" and "SN" or "H" and "L" or other combinations, have non-zero values only when there is a departure from a constant slope. There is little expectation that a column of these latter terms would produce a constant non-zero slope in the second dimension. It is quite likely that a column would have a line of terms of constant value corresponding to a horizontal edge (a constant zero-value slope). However, the S-type terms without normalization have a value of zero for this case already. Thus it is not necessary to perform S-normalization on columns of "D" and "SN", or "H" and "L" terms issuing from the transformation in the first direction. From a theoretical viewpoint "S" normalization could be performed selectively in the first direction and then totally in the second dimension to achieve a similar desired result. For each processing block the normalization is performed in six out of the eight decimations.

Inverse Triangle and Pyramid Transform Concepts

Prior to proceeding with the inverse or reconstruction transform, the phasing relationship between processing operations in adjacent bands depicted in FIGS. 10A and 10B will be further explained. All interior (non-edge) samples have a non-zero weighting contribution to at least one B-type term in a given band. However, every fourth sample does not contribute to production of a D-type coefficient, since D-type coefficients occur for only every other B-type term in the preferred embodiment of the invention. The centers of half of the D-type coefficients of one band should be aligned with the centers of D-type coefficients in the next lower band. Although this is not the only arrangement possible, it facilitates the process of interpolation as a central part of the reconstruction process.

A reconstruction processing block performs the inverse operation from that performed by a forward processing block. In this case B-type terms and appropriate coefficients are entered into the block. B-type terms at the next higher band are the outputs from the block. The calculations performed in the reconstruction block are the inverse of those performed in the forward block and the inputs and outputs are exactly reversed between the two operations. An exception to this are the save-over and carry-up terms which are internal links between adjacent forward blocks or adjacent reconstruction blocks and are particular to the forward or reconstruction direction.

It is now first shown that the original samples from the signal can be reconstructed from the transform coefficients and B-function terms. It is next shown how the reconstruction is performed in the preferred embodiment to yield the desired characteristic of minimal perceived degradation when various coefficients are roughly quantized or eliminated. The techniques involved constitute a fast calculation method in that the partial results of one set of calculations are also used in the calculation of subsequent results. This is in contrast to calculating a value for each final output sample, one at a time, from a set of coefficients and base functions multiplied by appropriate weights. The fast techniques also involve only trivial, meaning powers of two, multiplications, whereas the direct method involves many non-trivial multiplications.

From the equations for the forward transform:

$$B(j) = \frac{P(i)}{4} + \frac{P(i+1)}{2} + \frac{P(i+2)}{4},$$

$$B(j+1) = \frac{P(i+2)}{4} + \frac{P(i+3)}{2} + \frac{P(i+4)}{4},$$

$$B(j+2) = \frac{P(i+4)}{4} + \frac{P(i+5)}{2} + \frac{P(i+6)}{4},$$

$$B(j+3) = \frac{P(i+6)}{4} + \frac{P(i+7)}{2} + \frac{P(i+8)}{4},$$

$$B(j+4) = \frac{P(i+8)}{4} + \frac{P(i+9)}{2} + \frac{P(i+10)}{4},$$

$$D(j+1) = -\frac{P(i+2)}{4} + \frac{P(i+3)}{2} - \frac{P(i+4)}{4}, \text{ and}$$

$$D(j+3) = -\frac{P(i+6)}{4} + \frac{P(i+7)}{2} - \frac{P(i+8)}{4},$$

it can be readily be shown that, $$P(i+3) = B(j+1) + D(j+1),$$
$$P(i+2) = B(j+1) - D(j+1) - S(j+1), \text{ and}$$
$$P(i+4) = B(j+1) - D(j+1) + S(j+1), \text{ where,}$$

$$S(j+1) = SN(j+1) + \frac{B(j+2) - B(j)}{4}$$

if normalization is used. Also, $$P(i+7) = B(j+3) + D(j+3)$$
$$P(i+6) = B(j+3) - D(j+3) - S(j+3), \text{ and}$$
$$P(i+8) = B(j+3) - D(j+3) + S(j+3), \text{ where,}$$

$$S(j+3) = SN(j+3) + \frac{B(j+4) - B(j+2)}{4}$$

if normalization is used.

Thus each trio of points is determined by local coefficients and base functions. After $P(i+4)$ and $P(i+6)$ are calculated, the following relationship may be used to calculate $P(i+5)$, $$P(i+5) = 2 * B(j+2) - \frac{P(i+4) + P(i+6)}{2},$$

which is a rearrangement of the forward calculation of $B(j+2)$. Therefore it is possible to reconstruct the next higher level B-function terms from the values of present band B-function terms and the coefficients (D and S) of the present band. This procedure starts in Band 1 and, in an iterative fashion, continues up through the bands until the replicated output samples of the original signal are produced from the Band N reconstruction processes.

This particular form of reconstruction can lead to objectionable errors, however, when coefficients are roughly quantized or eliminated between forward and reconstruction transformations. The method which provides a desirable smoothing action under this same condition is next shown.

It is first possible to develop alternate forms for the calculation of $P(i+2)$ and $P(i+4)$ starting with the previously stated equations for these terms. To the expression for $P(i+2)$ the term $$\frac{B(j) - B(j+1)}{2}$$

is both added and subtracted, resulting in:

$$P(i+2) = B(j+1) - D(j+1) - SN(j+1) -$$

$$\frac{B(j+2) - B(j)}{4} + \frac{B(j) - B(j+1)}{2} - \frac{B(j) - B(j+1)}{2}.$$

which, with rearrangement, becomes:

$$P(i+2) = \frac{B(j) + B(j+1)}{2} - D(j+1) -$$

$$SN(j+1) - \frac{B(j)}{4} + \frac{B(j+1)}{2} - \frac{B(j+2)}{4}.$$

The last three terms in this relationship can be replaced by the D-type coefficient DCU1 (D Carry-Up) centered under $P(i+3)$ in the next lower band yielding:

$$P(i+2) = \frac{B(j) + B(j+1)}{2} - D(j+1) - SN(j+1) + DCU1,$$

which is the desired result. In practice the DCU-type coefficient is calculated in the next lower band, if it is not directly available, and carried up for use in the present band. In the event that coefficients $D(j+1)$, $SN(j+1)$ and DCU1 are all zero or their combination results in zero, either due to the original signal or to a quantization operation between the forward and reconstruction transforms, $P(i°2)$ becomes the interpolated value of $B(j)$ and $B(j+1)$.

There exist two reconstruction situations where it is desirable to force the value of the D Carry-Up coefficient to zero, even though the calculated values may not be zero. The first situation occurs when a replica of a signal, say an image, is desired, but all of the coefficient data is not yet available. This can occur when the time required to send all of the coefficient data is several seconds. It could also occur when sufficient memory space for the entire signal is not available. If the Band 1 coefficient data are available first, it is possible to reconstruct an approximation of the image using only that data. If both the Band 1 and Band 2 data are available, it is possible to reconstruct a better approximation, and so forth. To reconstruct this type of approximate picture, it is better to force the D Carry-Up coefficient to zero, rather than to calculate it when coefficient data in that processing block is not yet available. The result of this operation is an approximation based on interpolation in those bands whose coefficients are not yet available. The perceived effect is a reduction in resolution due to the smoothing introduced by the interpolation.

The second situation occurs when coefficients are roughly quantized during a forward transformation of a signal, which can result in errors in the D Carry-Up coefficients during reconstruction. These errors are perceived to be more objectionable in smooth areas of the signal than in areas with much activity. It is possible to infer during reconstruction the location of the smooth areas and the location of the busy areas from the mapping data to be later discussed. The inference, however, is that if no coefficients were generated at a location by the forward transformation, then the area must have been smooth and it is appropriate to perform reconstruction via interpolation in the area. As demonstrated hereinafter, the criteria upon which to make this decision is directly available from the mapping data. The user then has the ability to increase the transform efficiency at the expense of some resolution, but without introduction of annoying artifacts due to the transform process in smooth signal areas.

Similarly, if the term $$\frac{B(j+2) - B(j+1)}{2}$$

is both added and subtracted from the expression for P(i+4), then, by similar rearrangement and substitution, $$P(i+4) = \frac{B(j+1) + B(j+2)}{2} - D(j+1) + SN(j+1) + DCU1.$$

It can be seen directly that the value for P(i+3) which is directly aligned with B(j+1) is equal to the latter quantity if D(j+1) is zero. So far, the output sample is equal to the value of the B-type term directly underneath it if there is one, and equal to the interpolated value of the two B-type terms to either side of it if there is no B-type term directly beneath for the case where all the coefficients are zero.

The expression for P(i+5) may be rewritten as:

$$P(i+5) = B(j+2) - \frac{P(i+4) + P(i+6)}{2} + B(j+2).$$

The two terms on the right of this equation, excluding the initial B(j+2), form an invisible D-type coefficient (hereinafter Di), so called because it is not included as an actual visible coefficient term in the preferred embodiment, but has the form of a D-type coefficient in that an output element with a B-type term directly beneath it is formed by, $$P(i+5) = B(j+2) + D(j+2),$$

Similar to, $$P(i+3) = B(j+1) + D(j+1).$$

However, D(j+1) is a visible coefficient, whereas D(j+2) is not and must be found from:

$$D(j+2) = B(j+2) - \frac{P(i+4) + P(i+6)}{2}.$$

An important aspect of the subject invention is the reconstruction of a satisfactory replica of the original signal while minimizing perceptible noise introduced into the signal by rough quantization, or introduced by the elimination of certain coefficients between the forward and reconstruction transforms. The specification herein of the reconstruction as a build-up from Band 1 upwards of linear interpolation between B-function terms, plus departures from linear interpolation due to non-zero coefficients, has so far satisfied this goal. The form of this last equation above does not strongly satisfy this goal, since smoothness is dependent on having the difference of two quantities only somewhat derived from common sources approach zero. The goal is better served by rearranging this relationship to make it more heavily dependent on coefficient data than B-function terms, and to approach zero as much as possible as the incoming coefficients approach zero.

Substitution for P(i+4) and P(i+6) in the expression for D(j+2) yields:

$$D(j+2) = B(j+2) - \frac{B(j+1) + B(j+2)}{4} +$$

$$\frac{D(j+1)}{2} - \frac{SN(j+1)}{2} - \frac{DCU1}{2} -$$

$$\frac{B(j+2) + B(j+3)}{4} + \frac{D(j+3)}{2} + \frac{SN(j+3)}{2} - \frac{DCU2}{2}$$

$$= -\frac{B(j+1)}{4} + \frac{B(j+2)}{2} -$$

$$\frac{B(j+3)}{4} + \frac{D(j+1)}{2} - \frac{SN(j+1)}{2} -$$

$$\frac{DCU1}{2} + \frac{D(j+3)}{2} + \frac{SN(j+3)}{2} - \frac{DCU2}{2}.$$

By adding and subtracting $\frac{DCU1 + DCU2}{2}$, $$D(j+2) = -\frac{B(j+1)}{4} + \frac{B(j+2)}{2} -$$

$$\frac{B(j+3)}{4} + \frac{DCU1 + DCU2}{2} + \frac{D(j+1)}{2} -$$

$$\frac{SN(j+1)}{2} - DCU1 + \frac{D(j+3)}{2} + \frac{SN(j+3)}{2} - DCU2.$$

Expanding the fourth term in terms of B-type functions, $$D(j+2) = -\frac{B(j+1)}{4} + \frac{B(j+2)}{2} - \frac{B(j+3)}{4} +$$

$$\frac{-\frac{B(j)}{4} + \frac{B(j+1)}{2} - \frac{B(j+2)}{4} - \frac{B(j+2)}{4} + \frac{B(j+3)}{2} - \frac{B(j+4)}{4}}{2} +$$

$$\frac{D(j+1)}{2} - \frac{SN(j+1)}{2} - DCU1 + \frac{D(j+3)}{2} + \frac{SN(j+3)}{2} - DCU2.$$

Combining all of the like B-type terms:

$$D(j+2) = -\frac{B(j)}{8} + \frac{B(j+2)}{4} -$$

$$\frac{B(j+4)}{8} + \frac{D(j+1)}{2} - \frac{SN(j+1)}{2} - DCU1 +$$

$$\frac{D(j+3)}{2} + \frac{SN(j+3)}{2} - DCU2.$$

Defining:

$$SA = \frac{B(j+2) - B(j)}{2}, \text{ and}$$

$$SB = \frac{B(j+4) - B(j+2)}{2}, \text{ then}$$

-continued $$D(j + 2) = \frac{SA - SB}{4} + \frac{D(j + 1)}{2} - \frac{SN(j + 1)}{2} - DCU1 + \frac{D(j + 3)}{2} + \frac{SN(j + 3)}{2} - DCU2.$$

In the above form, most of $D(j+2)$, which represents the departure from linear interpolation, is dependent on coefficient data and a smaller part on the difference in the slopes SA and SB. In the case where the slopes are equal, such as a straight line of B-type terms, $D(j+2)$ is only dependent on coefficients. $P(i+5)$ is then equal to $B(j+2)$ plus a departure due to any non-zero coefficients. This form of the calculation is in line with the desired goal.

The invisible Di coefficient, $D(j+2)$, is somewhat more sensitive to quantization effects than other coefficients. In situations where rough quantization is used to gain increased transform efficiency, it is desirable to perform a threshold operation on this coefficient. The operation is to force the value to zero if the absolute value of the term is less than a certain threshold. The effect is a smoothing of the reconstruction. The values of the threshold can be made dynamic. That is, the threshold can be higher in signal areas where the coefficients have zero values and lower in areas where coefficients have non-zero values.

The equations may be readily transformed to functions of the other variables "H" and "L" by using the relationships:

$H = k * DCU - D - SN$, and
$L = k * DCU - D + SN$, from which, $$D = k * DCU - \frac{L + H}{2}, \text{ and}$$

$$SN = \frac{L - H}{2}.$$

After substitution, the equations for $P(i+2)$ through $P(i+5)$ become, $$P(i + 2) = \frac{B(j) + B(j + 1)}{2} + DCU1 * (1 - k) + H(j + 1),$$

$$P(i + 3) = B(j + 1) + DCU1 * k - \frac{H(j + 1) + L(j + 1)}{2},$$

$$P(i + 4) = \frac{B(j + 1) + B(j + 2)}{2} + DCU1 * (1 - k) + L(j + 1), \text{ and}$$

$$P(i + 5) = B(j + 2) + \frac{SA - SB}{4} - \left(1 - \frac{k}{2}\right) * (DCU1 + DCU2) - \frac{L(j + 1) + H(j + 3)}{2}$$

The term $(1-k/2)$ becomes a less trivial multiplication for a value k not equal to zero or one. However, for $k=\frac{1}{2}$, the result is still readily realized by a single subtraction of the quantity it multiplies, say Q, by:

$(\frac{3}{4}) * Q = Q - (\frac{1}{4}) * Q,$ where the multiplier $(\frac{1}{4})$ is a trivial multiplier.

A standardized processing block can be established which can subsequently be repeated to perform the processing of N different bands and for as long as the duration of the signal. To minimize the amount of data saved over, the processing block will actually calculate outputs $P(i+1)$, $P(i+2)$, $P(i+3)$ and $P(i+4)$, using the previous nomenclature and alignment of B-type terms, D-type coefficients, and so on. A partial calculation of the invisible D-type coefficient Di required to calculate $P(i+1)$ is provided to the processing block as an input along with the unprocessed coefficients and with B-type base functions. A part of the task of the processing block is to calculate a partial quantity to be used in an adjacent processing block for calculating $P(i+5)$. This adjacent block uses this latter partial quantity just as the present block uses the former partial quantity to calculate $P(i+1)$.

From the aforementioned calculation for $P(i+5)$, the operation can be divided into two parts (a) and (b).

$$\text{(a)} = \frac{SA}{4} - \left(1 - \frac{k}{2}\right) * DCU1 - \frac{L(j + 1)}{2}, \text{ and}$$

$$\text{(b)} = B(j + 2) - \frac{SB}{4} - \left(1 - \frac{k}{2}\right) * DCU2 - \frac{H(j + 3)}{2},$$

where from before, $$SA = \frac{B(j + 2) - B(j)}{2}, \text{ and}$$

$$SB = \frac{B(j + 4) - B(j + 2)}{2}.$$

Upon substitution, $$\text{(a)} = \frac{B(j + 2) - B(j)}{8} - \left(1 - \frac{k}{2}\right) * DCU1 - \frac{L(j + 1)}{2}, \text{ and}$$

$$\text{(b)} = B(j + 2) - \frac{B(j + 4) - B(j + 2)}{8} - \left(1 - \frac{k}{2}\right) * DCU2 - \frac{H(j + 3)}{2}.$$

Part (a) is calculated in the processing block which provides the outputs $P(i+1)$ through $P(i+4)$. Part (b) is calculated in the adjacent processing block which calculates $P(i+5)$ through $P(i+8)$. The former processing block must also calculate a part (b) to complete the calculation of $P(i+1)$. This term, by correspondence, is:

$$P(i + 1) = B(j) - \frac{B(j + 2) - B(j)}{8} - \left(1 - \frac{k}{2}\right) * DCU1 - \frac{H(j + 1)}{2},$$

plus an (a) partial term.
Two of the terms, $$\frac{B(j+2) - B(j)}{8} \text{ and } \left(1 - \frac{k}{2}\right) * DCU1,$$

are common to both partial calculations of the same block. Performing these partial calculations within the same block reduces the overall number of processing steps required.

In the case of the single dimension Triangle transform, the values of the D-type coefficients which require carrying-up to serve in calculating coefficients at the next higher band are results also required in the present band. For Band 1 no carry-up terms are available since there is no Band 0.

In this case, however, the B-function terms are available directly from which to calculate needed D-type carry-up coefficients.

The reconstruction of the two dimensional Pyramid Transform will now be described. The sequence of calculations is described with reference to TABLES VI and VII, below, which respectively show an array of coefficients and B-function terms for starting the calculations of a reconstruction processing block, and an array representing the results of initial reconstruction processing, and with reference to the FIG. 17 flowchart, which shows the order in which calculations occur, as well as various inputs, outputs, partial calculations and save-over coefficients. The array of starting coefficients and terms for reconstruction represented in TABLE VI may be compared to the array of results from a forward two-dimensional transformation represented in TABLE V hereinabove.

TABLE VI
VERTICAL RECONSTRUCTION PROCESSING INPUTS

| | Columns | | | |
|---|---|---|---|---|
| Rows | b | c | d | e |
| (saved over) | partial"b" input | partial"c" input | partial"d" input | partial"e" input |
| v | B(j)vLh | B(j)vB(j+1)h | B(j)vHh | B(j)vB(j+2)h |
| w | LvLh | LvB(j+1)h | LvHh | LvB(j+2)h |
| x | B(j+1)vLh | B(j+1)vB(j+1)h | B(j+1)vHh | B(j+1)vB(j+2)h |
| y | HvLh | HvB(j+1)h | HvHh | HvB(j+2)h |
| z | B(j+2)vLh | B(j+2)vB(j+1)h | B(j+2)vHh | B(j+2)vB(j+2)h |
| | | ↑ DCU1v | | ↑ DCU2v |

TABLE VII
VERTICAL PROCESSING OUTPUTS STEPS 1 AND 2

| | column | | | |
|---|---|---|---|---|
| row | b | c | d | e |
| v | Lh | B(j+1)h | Hh | B(j+2)h |
| w | Lh | B(j+1)h | Hh | B(j+2)h |
| x | Lh | B(j+1)h | Hh | B(j+2)h |
| y | Lh | B(j+1)h | Hh | B(j+2)h |
| z | Lh | B(j+1)h | Hh | B(j+2)h |
| terms to be output | partial"b" output | partial"c" output | partial"d" output | partial"e" output |
| saved over | B(j+2)vLh | B(j+2)vB(j+1)h | B(j+2)vHh | B(j+2)vB(j+2)h |
| terms to be used in Steps 3, 4 & 5 | DvLh | DvB(j+1)h | DvHh | DvB(j+2)h |
| | DviLh | DviB(j+1)h | DviHh | DviB(j+2)h |

The nomenclature of the TABLES VI and VII above indicates the forward processing steps which operated on input data to calculate values for the transformed elements. A lower case "v" or "H" indicates whether the operation B, L, H and sometimes D is in the vertical or horizontal direction respectively. A "(j)", "(j+1)" or "(j+2)" identifies which one of the B-type operations, left or top, center, or bottom or right respectively, is involved. A lower case "i" indicates a D-type term which is invisible, and is derived from a relationship of other visible data.

Figure 17:
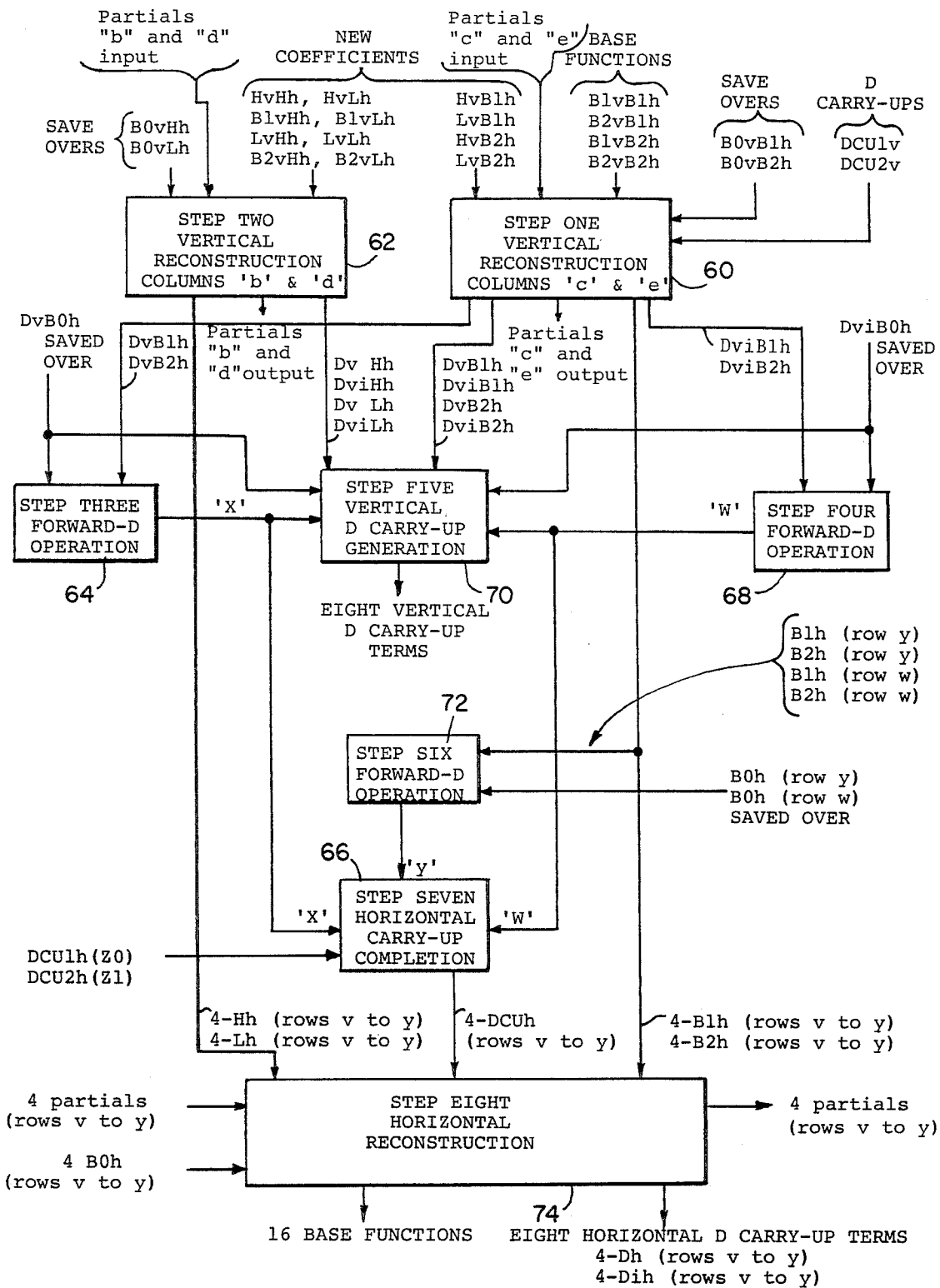
FIG. 17 is a flow chart illustrating eight principal processing steps for a two-dimensional inverse transform (reconstruction)

In FIG. 17, eight principal processing steps are depicted. Steps 1, 2, 5, 7 and 8 are reconstructions. Steps 3, 4 and 6 are actually forward transform pieces necessary to derive D Carry-Up coefficients, DCU. In the two-dimensional case, the D Carry-Up coefficients are not the same as those developed for use in the lower adjacent band and further processing is necessary to get them. As will be shown later with reference to FIGS. 24A through 35, one part of the apparatus performs in sequence the Steps 1, 2, 5, 7 and 8, and a second part operating in parallel with the first performs Steps 3, 4 and 6.

The processing block for two dimensions performs both vertical and horizontal reconstructions on a group of elements in one band. The operation produces as outputs those elements which were inputs in the forward processing block, and uses as inputs those elements which were previously outputs. As in the single-dimensional transform some of the saved over terms are different between forward and reconstruction processes. Also, D Carry-Up coefficients are not saved over in the forward direction. A sequence of processing blocks is implemented within a single band until sufficient output B-type terms are produced to perform processing block functions in the next higher band.

In contrast with single-dimensional reconstruction, the two-dimensional reconstruction requires groups of calculations of four different types.

The first is called Type I and has the same form as the one-dimensional case involving the D carry-up terms:

$$P(i+1) = \text{Partial Input} + B(j) - \frac{B(j+2) - B(j)}{8} -$$

$$\left(1 - \frac{k}{2}\right) * DCU1 - \frac{H(j+1)}{2},$$

$$P(i+2) = \frac{B(j) + B(j+1)}{2} + DCU1 * (1-k) + H(j+1),$$

$$P(i+3) = B(j+1) + DCU1 * k - \frac{H(j+1) + L(j+1)}{2}, \text{ and}$$

$$P(i+4) = \frac{B(j+1) + B(j+2)}{2} +$$

$$DCU1 * (1-k) + L(j+1).$$

$$\text{Partial Output} = \frac{B(j+2) - B(j)}{8} -$$

$$\left(1 - \frac{k}{2}\right) * DCU1 - \frac{L(j+1)}{2}.$$

Type II is reconstruction which does not involve D Carry-Up coefficients:

$$P(i+1) = B(j) + Di,$$

$$P(i+2) = B(j+1) - D - S,$$

$P(i+3)=B(j+1)+D$, and $P(i+4)=B(j+1)-D+S$.

These relate back to the first reconstruction equations presented prior to introduction of the D Carry-Up coefficient and method. Type II is used to reconstruct values from a row or column of only coefficients and no base function terms. Its use is dictated by the fact that no D Carry-Up terms can be derived from data different from the same coefficients themselves. Although sometimes a Type I calculation may be performed in a situation involving only coefficients, it is done as a convenience and not because it adds any strength to the calculation.

Type III is a forward D-type transform operation on three quantities, $P(i+2)$, $P(i+3)$ and $P(i+4)$:

$$-\frac{P(i+2)}{4} + \frac{P(i+3)}{2} - \frac{P(i+4)}{4}.$$

Type IV is a S-type forward transform operation on two quantities P3 and P5:

$$-\frac{P(i+2)}{2} + \frac{P(i+4)}{2}$$

Referring now to FIG. 17 in detail, eight processing steps are shown in block diagram form, and will now be explained as they relate to the reconstruction calculations of a processing block. The device which performs the operations of the eight steps in FIG. 17 is explained hereinafter with reference to FIGS. 24A through 35. To simplify the nomenclature of FIG. 17, as well as later FIGS., the subscripts on the B-terms are shortened by omitting the "J" index. Thus B(j) becomes B0; B(j+1) becomes B1; B(j+2) becomes B2; and so on.

In FIG. 17, Step 1 (Box 60) performs a Type I vertical reconstruction on column "c" data of TABLE VII and a second Type I operation on column "e" data. A vertical D Carry-Up term for each column, calculated as part of a lower band processing block, is used for each. The results from column "c" are four B1h terms for rows "v" through "y", a DvB1h and a DviB1h and a partial Coefficient to participate in the calculation of column "c" in the next adjacent lower processing block of the same band. Also, B2vB1h is saved over for further used in the latter processing block. The results for column "e" are four B2h terms for rows "v" through "y", a DvB2h and a DviB2h, and similar partial and B2vB2h save-overs as shown in TABLE VII. Type I processing is used to determine new vertically reconstructed B-function terms at the next higher band, which consists of smoothly interpolated values from the adjacent lower band and departures from this smoothness determined by the new coefficients first introduced with this processing in columns "c" and "e".

Step 2 (Box 62) vertically reconstructs columns "b" and "d" using Type II reconstruction equations. The coefficients therein are called 'diagonal' coefficients since they only have non-zero values when simultaneous horizontal and vertical changes are encountered. These columns contain only new coefficients not previously introduced into any reconstruction processing and no B-function terms. The use of Type II processing for these two columns of coefficients does not therefore aggravate previous processing results of lower bands but introduces approximations due only to quantization effects in the present band between the forward and reconstruction transformers. The outputs from column "b" are four Lh terms in rows "v" through "y", a DvLh and a DviLh term as seen in TABLE VII. The outputs from processing column "d" are four Hh terms in the same rows, a DvHh and a DviHh term as seen in TABLE VII. The vertical reconstruction is complete for the present band at this point.

Prior to performing horizontal reconstruction it is necessary to complete calculation of the horizontal D Carry-Up coefficient, as only partial data is carried up from the processing in the adjacent lower band. This is accomplished in Steps 3, 4 and 6. Generation of complete vertical D carry-up terms for use in the four adjacent processing blocks in the next higher band is accomplished in Step 5, conveniently using the results of Steps 3 and 4.

Step 3 (Box 64) calculates the single quantity X as:

$$X = -\frac{DvB0h}{4} + \frac{DvB1h}{2} - \frac{DvB2h}{4}$$

This is a forward D-type calculation using three derived present band coefficients. This is used in subsequent calculation of horizontal D Carry-Up terms in Step 7 (Box 66), and as a convenient aid in calculation of next-band vertical D Carry-Up terms in Step 5.

Step 4 (Box 68) calculates the single quantity W as:

$$W = -\frac{DviB0h}{4} + \frac{DviB1h}{2} - \frac{DviB2h}{4}.$$

This is another forward D-type calculation using the derived invisible present band coefficients. W is used in Steps 5 and 7.

Step 5 (Box 70) calculates eight vertical D Carry-UP coefficients for use in four adjacent processing blocks in the next higher band using two Type I reconstructions. Since the D Carry-Up coefficients for use in these rconstructions are derived from the same data as directly used, there is no processing advantage to using a Type I over a Type II reconstruction. It can be a convenience for the device which implements the processing, however.

TABLE VIII below shows the two rows of data and their origin which are used in the calculation of the eight vertical D carry-up terms. The Type I calculation herein used requires partial inputs and generates partial outputs as is typical of Type I processing shown in TABLES VI and VII columns "c" and "e" for the Step 1 vertical reconstruction of FIG. 17, Step 1 (Box 60). These partials, although present, are not shown for FIG. 17, Step 5 (Box 70), nor are they included in TABLE VIII.

TABLE VIII

VERTICAL D CARRY-UP GENERATION

| | | column | | | |
|---|---|---|---|---|---|
| D carry-up | a | b | c | d | e |
| TOP ROW | | | | | |
| INPUTS | W | DviB0h | DviLh | DviB1h | DviHh | DviB2h |
| ORIGIN | Step 4 | Saved-Over | Step 2 | Step 1 | Step 2 | Step 1 |
| OUTPUTS BOTTOM ROW | | DCUv | DCUv | DCUv | DCUv | |
| INPUTS | X | DvB0h | DvLh | DvB1h | DvHh | DvB2h |
| ORIGIN | Step 3 | Saved- | Step 2 | Step 1 | Step 2 | Step 1 |

TABLE VIII-continued

VERTICAL D CARRY-UP GENERATION

| D carry-up | column | | | | |
|---|---|---|---|---|---|
| | a | b | c | d | e |
| OUTPUTS | Over DCUv | DCUv | DCUv | DCUv | |

The purpose of the reconstructions is to remove the horizontal forward transform operation of the two rows leaving one row of four Dv coefficients and one row of four Dvi coefficients. The first two Dvi coefficients on the left are used in one processing block in the next higher band spatially aligned with the upper left corner of the present processing block. The second two Dv coefficients are used in the next higher band aligned with the upper right corner of the present band. The pairs of Dvi coefficients are used in the next higher band aligned with the lower left and right corners of the present band respectively.

Step 6 of FIG. 17 includes two parts. The first part is the calculation of three SvBh coefficients from Bh data saved over, and the result of Step 1 calculations. These are three forward S-type calculations:

$$SvB0h = \frac{B0h \text{ (row } y\text{)} - B0h \text{ (row } w\text{)}}{2}$$

$$SvB1h = \frac{B1h \text{ (row } y\text{)} - B1h \text{ (row } w\text{)}}{2}$$

$$SvB2h = \frac{B2h \text{ (row } y\text{)} - B2h \text{ (row } w\text{)}}{2}$$

The second part is the calculation of a forward D-type operation in the horizontal direction using the three results calculated in the first part to arrive at the result, Y:

$$Y = -\frac{SvB0h}{4} + \frac{SvB1h}{2} - \frac{SvB2h}{4}$$

Step 7 (Box 66) completes the calculation of the horizontal D Carry-Up coefficients. This is done by a type II vertical reconstruction on the coefficients X from Step 3 (Box 64), W from Step 4 (Box 68), Y from Step 6 (Box 72) and two coefficients Z0 and Z1 carried up from the next adjacent lower band. All five coefficients have a forward horizontal D-type of transform operation at the next lower band inherent in them. However, these all have present-band forward vertical processing inherent in them. This latter is removed by the Type II vertical reconstruction. To relate individual terms to those required as inputs to this reconstruction it can be seen that W is a Dvi-type coefficient, X is a Dv-type coefficient and Y is a Sv-type coefficient. Z0 can be related to a B0v type term and Z1 to a B1v-type term as will be seen in Step 8 where these same terms are generated to be carried up as partial horizontal D Carry-Up coefficients to the next higher band. The four horizontal D Carry-Up coefficients for the present band are thus calculated:

row v: $DCUh = Z0 + W$ row w: $DCUh = Z1 - X - Y$ row x: $DCUh = Z1 + X$ row y: $DCUh = Z1 - X + Y$ Step 8 (Box 74) calculates sixteen B-function terms using four Lh and four Hh coefficients from Step 2, four B1h and four B2h terms from Step 1, four B0h terms saved over, and four horizontal partial calculations from the adjacent processing block to the left in the same band. Also used are the four horizontal D Carry-Up coefficients generated in Step 7. These terms and coefficients are aligned in four input rows as shown in TABLE IX below:

TABLE IX

HORIZONTAL RECONSTRUCTION

| | INPUTS | | | | | | |
|---|---|---|---|---|---|---|---|
| | columns | | | | | | |
| rows | a | b | c | d | e | | |
| v | partial row v | B0h | Lh | B1h | Hh | B2h | DCUh | row v |
| w | partial row w | B0h | Lh | B1h | Hh | B2h | DCUh | row w |
| x | partial row x | B0h | Lh | B1h | Hh | B2h | DCUh | row x |
| y | partial row Y | B0h | Lh | B1h | Hh | B2h | DCUh | row y |

| | OUTPUTS | | | | | | |
|---|---|---|---|---|---|---|---|
| | columns | | | | | | |
| rows | b | c | d | e | | Z0 | Z1 |
| v | Pvb | Pvc | Pvd | Pve | partial row v | Dhiv | Dhv |
| w | Pwb | Pwc | Pwd | Pwe | partial row w | Dhiw | Dhw |
| x | Pxb | Pxc | Pxd | Pxe | partial row x | Dhix | Dhx |
| y | Pyb | Pyc | Pyd | Pye | partial row y | Dhiy | Dhy |

A type I horizontal reconstruction is performed on each of the four rows v, w, x and y, resulting in the sixteen B-function terms. Four partial calculations for the next processing block to the right in the same band and eight partial horizontal D Carry-Up coefficients are also shown in TABLE IX. In the latter group there are four of the Z0 type and four of the Z1 type coefficients. One of each type is carried up to each of four processing blocks in the next higher band. The four Z0-type coefficients are the four Dhi coefficients calculated in Step 8. The four Z1 coefficients are the four Dh coefficients calculated in Step 8. This completes the calculations required for a single reconstruction processing block.

Coefficient Coding

With prior art transformations, a usual way to transmit the information concerning the location of the non-zero valued coefficients in the transform domain resulting from an input signal has been to use run-length coding. With run-length coding, the number of zero value coefficients is indicated by a binary coded number, rather than by sending a separate binary character, often a single zero bit, for each and every zero value coefficient. Efficiency results from the fact that the probability of non-zero coefficient occurrence is fairly low so that fewer bits are required in a binary coded representation than a non-coded form. Other more sophisticated and adaptive forms of coding also exist and have seen use.

With the Triangle and Pyramid transforms of the present invention other a priori probabilities exist relative to occurrence relationships between various coefficients which can be advantageously utilized. This results from the finite length of the basis functions (B-functions) and the layering of coefficients in multiple bands or levels of calculation. Due to the finite length of each basis function, a local length (or in two dimensions, a spatial localization) can be associated with each function. In a certain locality a high level of signal activity may produce non-zero value coefficients in multiple bands where the particular basis functions with non-zero values align with this signal activity. If there are gradual edges in the activity, only the lower bands may produce non-zero coefficients; if there are steep edges, then the higher bands as well as the lower bands will produce non-zero coefficients. Existence of non-zero lower band coefficients does not carry with it a high probability of non-zero higher band coefficients; existence of non-zero higher band coefficients does, however, carry with it a high probability of the existence of non-zero lower band coefficients in spatially aligned locations. This aspect for naturally occurring signals such as acoustic and image signals is very useful for minimizing the amount of overhead map data which must accompany the non-zero coefficient data for reconstruction purposes.

It should be noted that the map coding technique of the present invention is not limited to use with the subject Triangle and Pyramid transforms, but is also applicable to other heirarchial transform systems employing finite duration basis functions and subdivisions by predetermined factors when moving from level to level. Efficiencies result from the present map coding because the same pixels affect aligned basis function terms in successive levels. One example of a hierarchial transform system with which the subject map coding technique may be employed is disclosed in Knowlton U.S. Pat. No. 4,222,076 entitled "Progressive Image Transmission".

The present map coding can be likened to a forest of trees. Each tree trunk is associated with a processing block in Band 1. The first division of the tree trunk into two branches in the one-dimensional case or four branches in the two-dimensional case is associated with the coefficients of Band 2. Subsequent division of the first branches into multiple other branches is associated with Band 3 and subsequently with higher bands. This arrangement is useful since a natural tree-shaped envelope exists relative to the alignment of coefficients between Bands. In one dimension each pair of Band 1 coefficients is affected by roughly and mostly the same input signal samples as affect two pairs of coefficients in Band 2, four pairs in Band 3, eight pairs in Band 4, and so forth. In two dimensions there is a second natural alignment between coefficients in different bands affected by the same input samples. This is on the basis of the two different dimensions. Two-dimensional coefficients are of three types: (1) those that reflect activity in the first dimension but are affected only by an averaged value of activity in the second dimension; (2) those affected by activity in the second but only by an averaged value in the first dimension; and (3) those which are affected only if there is activity in both dimensions.

A coefficient with an averaged value of activation in a single dimension is one formed by means of a B-type transform operation in that dimension, and a non-B-type transform operation in the other dimension. The directionality of a coefficient is determined by the direction of the non-B-type transform operation. An LvBh or HvBh coefficient is a vertical coefficient, while a BvHh or a BvLh coefficient is a horizontal coefficient. Coefficients with non-averaged activation in both dimensions are called diagonal coefficients; examples include HvHh and LvHh.

Map coding can therefore be set up on a basis of one tree per Band 1 processing block in one dimension with two coefficients per block, and three trees per Band 1 processing block in two dimensions. In the latter case the three trees are associated with the three aforementioned types of two-dimensional coefficients. Each of the three types has four coefficients per processing block in the preferred embodiment of the invention.

The details of the map will now be discussed. A component of the map exists for each and every Band 1 processing block. These components correspond on a one-for-one basis with the trunks of the aforementioned trees. Further components of the map correspond to branches of the tree and conditionally exist as determined from the branch or trunk from which each emanated. Each existing component is further divided into three elements:

(a) a directory word,
(b) a contents word, and
(c) an existence word.

All of the aforementioned terms relating to the map are described in the context of both a single-dimensional case and a two-dimensional case.

Figure 18:
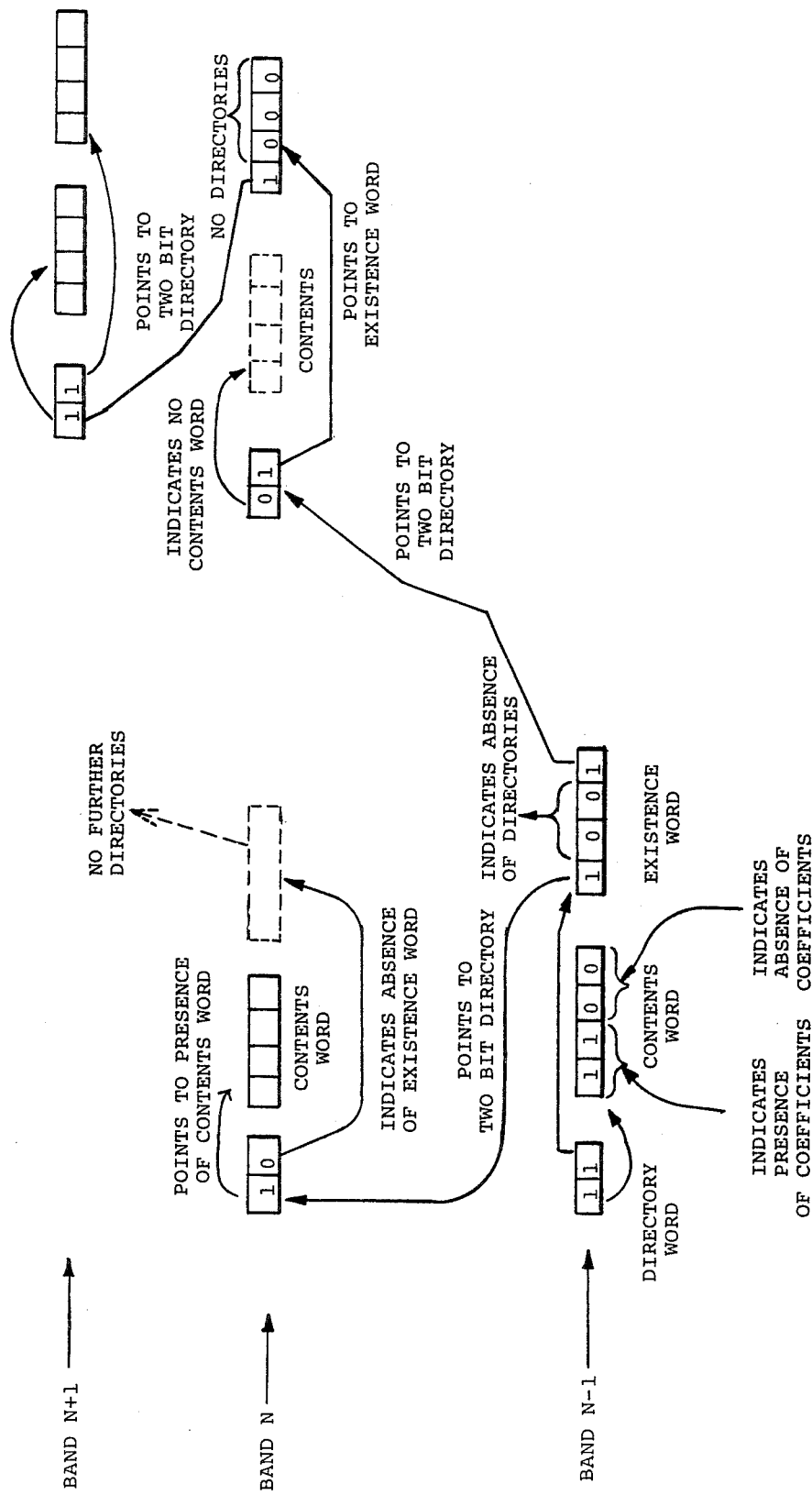
FIG. 18 is a diagram illustrating the map coding process for two-dimensional processing.

FIG. 18 illustrates the process for two-dimensional processing for one coefficient set only. A total of three are required to indicate the presence of horizontal, vertical and diagonal events.

The directory word indicates the presence or absence of the associated contents word and existence word. Two binary bits are used to represent the four possible conbinations of these two events. For two-dimensional processing, a directory with associated contents and existence words may exist for each of the three types of coefficient sets: vertical, horizontal and diagonal.

A contents word is present and indicated to be present by the directory word if any of the coefficients in the coefficient set in the present processing block are non-zero. For one-dimensional processing, only two bits are needed, as a maximum of two coefficients may exist. For two-dimensional processing, four bits are needed to indicate which of the four coefficients of the set are zero, and will be so indicated by the directory. Only coefficients with non-zero values are retained or transmitted.

The existence word indicates the presence or absence of further branches extending from the present location. If no further branches exist then the existence word will be absent as indicated by the directory. The existence word can selectively indicate which of the next higher band directories are present and which are not. For one and two dimensional processing, the existence word contains two and four bits respectively. The non-zero bits indicate which of the processing blocks in the next higher band contain coefficients in the same coefficient set. For bands higher than the first a directory will be present only if indicated by an existence word which itself exists in the next lower band. For the highest band in a particular system there are no existence words since there are no further higher bands. In this case no directory is required either since the only possibility of the existence of anything in the highest band is a contents word. This is pointed to directly by the lower band existence word.

For this map system to be uniquely decodable and to provide signal reconstruction in exactly the correct manner, an ordering of existing map components and elements, and the coefficients, is necessary. A basis for this ordering, in priority, is:

(a) band number;

(b) spatial location of the processing block—left to right in one dimension, and upper left to lower right in horizontal strips in two dimensions;

(c) for the two dimensional case only, within a processing block, horizontal, vertical and diagonal types; and (d) directory, contents, coefficients, and existence words.

This then represents sufficient map data and order to describe the location of the non-zero coefficients. The individual map items or entries themselves may be further coded using Huffman or other variable length codes, given a knowledge of occurrence probabilities. This can be useful in minimizing the number of transmitted map bits somewhat further.

The manipulation of the mapping data into the correct order during the forward and reconstruction transform processes will now be described. The actual apparatus which performs the map generation at the transmitter and the map usage at the receiver is described hereinafter with reference to FIGS. 20 and 22A–22D, as a part of the transformer apparatus description. Although the aforementioned mapping tree along with the ordered arrangement of the map and coefficient data is sufficient to uniquely locate all of the non-zero coefficients, a method is required to facilitate the filing of non-zero coefficient data in the correct order at the transmitter and searching for the correct coefficients at the reconstruction transformer. This is accomplished by means of a temporary status control system whose task is to keep a running record of which branches exist and which do not during the time a forward or reconstruction transform is being performed. This status control system provides organized linkage between processing blocks from one band to an adjacent band. It is temporary in that once the status of a processing block in one band is conveyed to the appropriate processing block in the adjacent lower band it may be discarded. This temporary status data is recorded for each and every processing block whether or not non-zero coefficients and/or map data existed for that block. This temporary status is required since the transformer usually processes a succession of blocks in a single band prior to returning to the same tree branch. The status control system therefore keeps a record of whether or not a branch with accompanying contents words, coefficients or existence words has been established and saved at that location and band, or has not been established and saved due to its having neither non-zero contents nor non-zero existence. After processing has been completed in the block of the next lower band which is spatially aligned with the block whose status is being temporarily saved, this status becomes part of the existence word of the lower block. It need no longer be retained separately as status. The number of memory locations required to store this temporary status data is not large and is in proportion to the number of memory locations required to store the intermediate band base (B-type) functions, which are also discarded after being used at the next lower band.

The operation, once organized, is to temporarily record whether or not a directory exists until this information is used in the next lower band. In the two-dimensional case where there can be three directories for each processing block, corresponding to horizontal, vertical or diagonal data, the status word individually records the existence of each. The action of a processing block includes the determination of whether or not to set up a directory word based on both the contents information concerning non-zero value coefficients and the existence of higher band directories which are communicated to it by this temporary status. A more direct approach toward getting this latter information is not usually possible since only map data representing existing directories and so forth is retained and the location of non-existing directories cannot at this point in the processing be identified in the sequence of the retained data. Unlike the map data, a status word exists for each and every processing block at some time during the transform sequence, but for a limited time prior to being discarded after use.

The temporary status control performs an analogous function during signal reconstruction, but in this case carries the status contained in the existence words up to the appropriately aligned processing blocks in the next higher band. Where no map data exists for a particular processing block the status is also zero and serves to signal processing blocks in the aligned higher bands that no map data exists there either.

This aforementioned mapping technique offers additional efficiency when applied to color images originating from natural objects or pictures over that provided for monochrome images. This occurs when the color signal, prior to encoding by some means such as subcarrier modulation, is represented by three video signals such as "Y", "I" and "Q", as it is in current broadcast practice. The "Y" signal is the equivalent of a monochrome signal which can be transformed by the Pyramid Transform as herein described. The "I" and "Q" signals are color-difference signals which go to zero value for any image areas without color. The "Y", "I" and "Q" signals are formed usually from linear combinations of red, green and blue separations of an image formed in a color television camera. As such there is a very high spatial correlation between the separations. In turn there is a very high spatial correlation between the "Y", "I", and "Q" signals. When a Pyramid transform is taken of each of the "Y", "I" and "Q" signals, there is a very high probability that for every resulting non-zero "I" or "Q" coefficient there will also be a corresponding non-zero "Y" coefficient in the same processing block. The map for the monochrome image can be caused to also represent the map for the "I" and "Q" color information by one of a few techniques. Two of these will next be described.

The first technique is called the "OR" technique. Here, a single map word is caused to exist in a processing block by a corresponding non-zero coefficient in the transformed "Y" signal, or the "I" signal, or the "Q" signal. The result then is that coefficients from all three signals are transmitted in response to the information contained in the common map. Although this will occasionally result in the transmission of a zero-value coefficient it is of fairly low probability. Also, when the coefficients are encoded with a Huffman-like code, the representation for a zero value can be a very short code word and hence not represent much penalty in extra transmitted data.

The second technique is called the "Monochrome-signalling" technique. This technique produces map data only in response to non-zero value coefficients from the "Y" signal. Non-zero values of coefficients of "I" and "Q" signals not corresponding to a non-zero value coefficient from the "Y" signal are simply discarded. Although this results in an occasional color error it is not often and usually not noticeable. This latter aspect is a result of Band 1 B-functions for the color signals always being transmitted regardless of "Y" coefficient data and of the errors which do occur being ones of failure to spatially change from one color to another as rapidly as called for in the original image. In this technique there is no extra map data required for the color coefficients, only the coefficients themselves. The color portion of the picture is thereby transmitted very efficiently without need for any additional mapping overhead. Another advantage of this latter technique is the ability to remove noise in the color portion of the video signal introduced by various means including passing through a video tape recorder. The most objectionable noise usually introduced is in areas of constant or slowly varying luminance and color which result, in the absence of the noise, in only non-zero coefficients in the lowest bands. Since the noise is only in the color part of the signal, the Pyramid Transformer will generate non-zero coefficients for only the "I" and "Q" color signals and not the luminance "Y" signal for higher bands. The aforementioned monochrome-signalling technique will discard the color coefficients which are mostly caused by noise in higher bands where the monochrome coefficients have zero value. Thus the most objectionable color noise is stripped out of the image which is subsequently reconstructed by the Pyramid reconstruction transformer. An additional advantage of this technique is that unneeded coefficients due to the color noise are not allowed to consume valuable transmission channel capacity or storage space.

Specific implementation of these two techniques are described hereinafter with reference to FIGS. 36 and 37.

Resolution Considerations for Color Images

Not only do color images permit improved efficiency as a result of map coding techniques, but they also permit improved efficiency as a result of resolution considerations.

In particular, it is well known that I and Q color-difference signals may be transmitted and satisfactorily received with a reduced resolution relative to an accompanying monochrome signal. Standard United States color television broadcast practice is to send the I signal with a bandwidth of 1.5 MHz and the Q signal with a bandwidth of 0.5 MHz, whereas the monochrome signal is transmitted with 4.2 MHz bandwidth. This results in a decrease in horizontal resolution of the I signal of a factor of 2.8 and of the Q signal of 8.4 relative to the monochrome signal. Vertical resolution is generally not altered for I and Q signals in standard broadcast practice relative to the monochrome signal. This latter resolution could, however, be reduced without perceived degradation.

Advantage can be taken of this reduced resolution acceptability of I and Q signals by the Pyramid Transform which possesses the aforementioned strong frequency properties. To effect a decrease in horizontal resolution by a factor of two, corresponding to reducing the bandwidth of a standard television signal component by the same said factor, the horizontal coefficients of the Band N transform are set to zero. To effect a decrease in vertical resolution by a factor of two, the vertical coefficients of the Band N transform are set to zero. To simultaneously decrease both horizontal and vertical resolution by a factor of two, all coefficients of Band N (horizontal, vertical and diagonal) are set to zero.

In similar fashion, a decrease in resolution by a factor of four may be obtained by setting the coefficients in both Band N and Band N−1 to zero. The advantage in performing this operation is that no coefficients for bands so affected need be stored or transmitted.

Specific hardware for color signal filtering to implement this acceptable decrease in resolution is described hereinafter with reference to FIG. 38.

Edge Treatment

Edges, when a signal to be transformed has them (such as that resulting from an image), are treated as modifications to the techniques for calculating the transform on interior portions of the signal. The modifications are necessary to accomodate the situations where signal elements normally used in the transform process do not exist because they are located outside the signal space. As with interior transform calculations the number of resulting transform terms around edges is the smallest mumber needed for exact reconstruction of the signal elements from which the transform terms came. Treatment of the edges is described as it applies to the fast method of calculation of the transform. The treatment is described mainly in the forward direction and in one dimension. The reconstruction and second dimension treatments follow in a corresponding way the manner in which interior reconstruction and the second dimension follow the interior first dimension previously described.

Five edges cases are shown in FIGS. 19A through 19E, as will now be described. Some of these edge conditions arise due to the non-arbitrary layering of adjacent bands to incorporate the D-Carry Up feature in reconstruction processing. The two principal departures from interior processing involve the normalization of S-type coefficients and the formation of B-type terms. Two procedures are given for each of the five cases, one allowing exact reconstruction, and the other resulting in the H and L coefficients having zero values. The latter method is sometimes preferable when the signal edges are artificially rough and result in unwanted non-zero value coefficients.

Figure 19A:
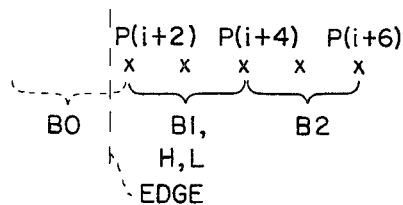
FIGS. 19A, 19B, 19C, 19D and 19E are diagrams illustrating transform treatment for five separate edge cases.
Figure 19B:
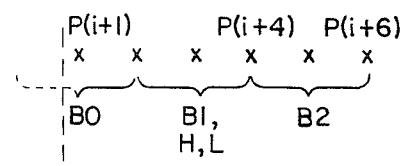
Figure 19C:
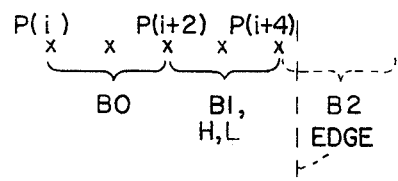
Figure 19D:
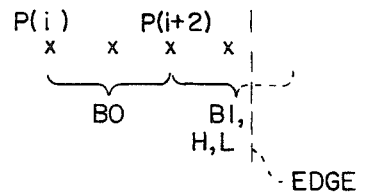
Figure 19E:
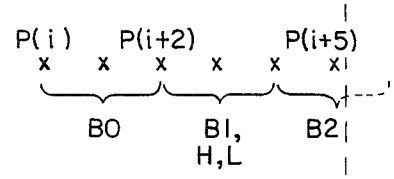

Case A of FIG. 19A shows five elements to the right side of an edge. Calculations for B1, B2, D and S can be performed in the manner previously described with reference to interior transformations. B0 is not immediately defined due to the absence of the edge of P(i) and P(i+1). A working definition of B0 is made as:

$$B0 = 2 * B1 - B2.$$

This causes a constant slope between B0, B1 and B2. Hence the D Carry-Up is zero:

$$DCU = -\frac{B0}{4} + \frac{B1}{2} - \frac{B2}{4}$$

$$= -\frac{B1}{2} + \frac{B2}{4} + \frac{B1}{2} - \frac{B2}{4}$$

$$= 0.$$

The normalizing coefficient for the S coefficient can be found as:

$$SN = S - \frac{B2 - B0}{4}$$

-continued $$= S - \frac{B2 - 2*B1 + B2}{4}.$$

$$= S - \frac{B2 - B1}{2}.$$

The H and L terms can be found using the previously given interior formulas for them which yields:

$H = -D - SN$, and $L = -D + SN$.

This method provides for an exact reconstruction of the P elements from the transform coefficients and base functions.

The approximate method for case A is to arbitrarily assume that H and L are both zero. This leads to a reconstruction which guarantees a constant slope between P(i+2), P(i+3) and P(i+4) regardless of their original relationship.

In case B (FIG. 19B) an exact reconstruction can be realized by directly letting:

$B0 = p(I+1)$.

Normalization of S is performed using only B1 and B2 as, $$SN = S - \frac{B2 - B1}{2},$$

as in case A. The D Carry-Up is again assumed equal to zero so that, $H = -D - SN$, and $L = -D + SN$.

Case B is therefore identical to case A, but with the now defined B0 being equal to P(i+1).

The second method for case B assumes that H and L are equal to zero, which forces reconstructed values of P(i+2), P(i+3) and P(i+4) to be in a straight line. Also, B0 = P(i+1) as in the exact calculation method.

Case C (FIG. 19C) is the mirror image of case A wherein the edge is on the right side of the elements rather than on the left side. The working assumption now is that the absent B2 is, $B2 = 2*B1 - B0$, which again forces the D carry-up to be zero. The normalized S becomes, $$SN = S - \frac{B1 - B0}{2}.$$

H and L are calculated as for interior signal space and become under the above conditions, $H = -D - SN$, and $L = -D + SN$.

The second method is to assume H and L are both zero. This results in P(i+2), P(i+3) and P(i+4) being regenerated with a constant slope.

In case D (FIG. 19D) an exact reconstruction can be achieved by letting, $B1 = P(i+3)$, and $D = 0$.

The S and SN coefficients are now defined as:

$S = P(i+3) - P(i+2)$, and $$SN = S - \frac{B1 - B0}{2}$$

The missing B2 is assumed to have a value such that DCU=0. Then, $H = -SN$, and $L = SN$.

It is only necessary to retain either H or L, but not both, since one is of opposite sign with respect to the other.

The approximate method for case D (FIG. 19D) is to assume that $B1 = P(i+3)$ and that H and L are both zero. P(i+2) is then approximately, $$P(i+2) = \frac{P(i+1) + P(i+3)}{2}$$

Case E (FIG. 19E) is the mirror image of case B. For the exact calculation method by correspondence with case B, $B2 = P(i+5)$, $$SN = S - \frac{B1 - B0}{2}$$

$H = -D - SN$, and $L = -D + SN$.

For the approximate method, $B2 = P(i+5)$, $H = 0$, and $L = 0$.

Specific Implementations

The foregoing completes the conceptual description of the subject invention, and provides the details of the various functional processing steps which must be accomplished. It will be apparent that a variety of specific approaches to implementation may be employed, depending upon the intended purpose. As one example, the transforms and inverse transforms can be implemented by means of a suitably-programmed digital computer. However, real-time processing of complex input data, such as that comprising images, is difficult to achieve employing a computer. The presently-preferred approach is to employ specialized processors for the forward and inverse transforms. Such a forward transform processor is described hereinafter with reference to FIG. 20, and an inverse transform (reconstruction) processor is described hereinafter with reference to FIGS. 24A, 24B, 24C and 24D. Each of the processors described comprises a plurality of conventional elements such as storage registers, multiplexers, adders, and threshold devices interconnected as shown in FIGS. 20 and 24A–24D. Various of these elements also have control point inputs (not shown), the functions of which are defined hereinafter. Through application of control bits to these control point inputs, in a manner also hereinafter defined, the required operations are caused to occur in proper sequence.

Forward Transform Apparatus

Figure 20:
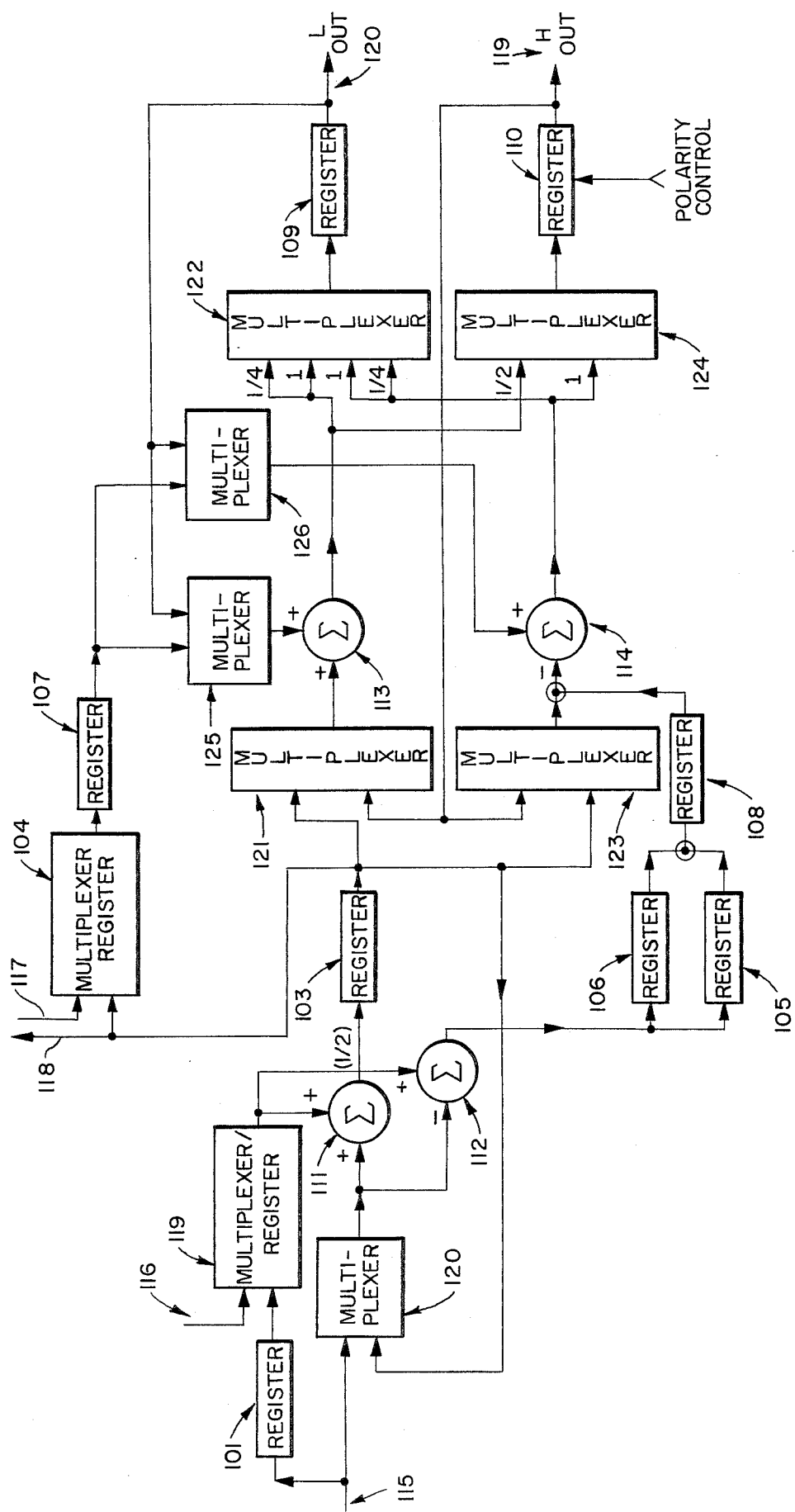
FIG. 20 is a block diagram of a forward transformer in accordance with a specific embodiment of the invention.

Referring now to FIG. 20, there is shown a diagram of electronic blocks sufficient to implement the Triangle/Pyramid transform in the forward direction. FIGS. 21A&B, 22A&B and 23A&B show three variations of data flow through the transformer for successive time intervals or increments, T, T+1, T+2, etc., determined by externally-generated clock pulses. The approach herein is to follow one small block of input data through the system. Thus the information presented in FIGS. 21A–23B is within boundaries. Outside the boundaries there exist essentially identical signal flows for adjacent blocks, but which for clarity of illustration are not shown. From the shape of the boundaries, it can be seen that the signal flow paths for adjacent data nest both above and below.

The first data flow variation, in FIGS. 21A&B, is used for a one dimensional case where an input sample of the data is continually applied at input 115 (FIGS. 21A&B) for each increment of time. In this case inputs 116 and 117 are not used. The second and third variations of FIGS. 22A&B and 23A&B are used for a two-dimensional case where it is desired to use the exact same electronic circuitry in sequence to perform the forward transform in the first dimension, say the horizontal direction, and subsequently in the second dimension, say the vertical direction. In these two cases certain data must be saved over from the results of the calculations on one specific sequence to be applied as input data at 116 and 117 when next that same sequence continues. In many actual two dimensional systems the same electronic circuitry can operate sufficiently fast to perform the necessary calculations in both directions. This electronic circuitry can be used to sequentially perform the calculations in one dimension and then the second dimension or, a plurality of like circuits can be used. An example is that the first circuit can perform the calculation in one dimension and a second can perform the calculation in the second dimension. Also, multiple units can simultaneously perform forward transforms on multiple rows. The same or different units can then subsequently perform the transforms in multiple columns perpendicular to the previous rows.

FIGS. 22A&B show the data flow for the case where the "S" functions are normalized, as discussed previously. FIGS. 23A&B show the data flow for the case where the "S" functions are not normalized. All three cases show the transform utilizing four successive data points in addition to zero, and two save-overs depending upon whether "S" normalization is used and whether the input data to 115 is continuous or not. Four input data samples are applied to 115 whether the input data is continuous or not. Four outputs and up to two save-over terms are generated by the action of the transformer. The transformor requires nine clock cycles after the first of four data samples are presented at the input 115 to complete the transform. This represents the throughput time of the transformer although a new set of four input samples not necessarily connected to the first four may be entered via input 115 directly following the first four without adverse interaction. The minimum processing time of the transformer is one clock cycle for each data sample presented at input 115.

The operation of the forward transformer of FIG. 20 will first be explained with reference to the timing listing of FIGS. 21A&B. In this case the input data stream is continuous and it may be presumed that sample P3 is contained in the register 101, the sample P2 is contained in register 102, the calculated quantity $(\frac{1}{2}) * (P1+P3)$ is contained in register 103, all the result of previous operations. The sample P4 is at the input 115, and the calculation of B0 is occurring in adder 111 during period T. All of the registers are of the edge-triggered type such that the data at the register input is transferred to the register itself at the end of a clock period if an appropriate edge is then presented to the clock input of that register and, in some cases, the clock enable input is also enabled. At the end of clock period T, B0, the result of the calculation by adder 111, is transferred into register 103, sample P3 is transferred into multiplexer register 119, and the sample P4 at the input 115 is transferred into register 101. Although other calculations and transfers take place during period T, they have the identical form (operating on different sets of data samples) as those occurring during periods T+4, T+8, T+12 and so forth. Therefore they are shown during period T+4 which concerns the data now under consideration rather than data which is the result of previous inputs and calculation operations. The operation is made clear by following the same input data through the electronic circuitry rather than different input data through only four periods.

During period T+1 the adder 111 is presented P3 from register 119 as one operand and P5 from the input 115 through multiplexer 120; the result is transferred into register 103 at the end of period T+1. Also during period T+1 subtractor 112 receives the same operands to produce −S1 which is transferred into register 105 at the end of the period. Also transferred at the end of period T+1 are P5 at input 115 into register 101, P4 from register 101 to register 119 and B0 from register 103 to register 104.

During period T+2, adder 111 receives operand P4 from register 119 and the quantity $(\frac{1}{2}) * (P3+P5)$ from register 103 through multiplexer 120. Adder 111 forms the quantity B1 and transfers this result to register 103 at the end of period T+2. Subtractor 112 receives the same operands as adder 111 and produces output D1 which is transferred to register 106 at the end of period T+2. Transfers also taking place at the same time are P6 from input 115 to register 101, and P5 from register 101 to register 119.

During period T+3 adder 111 receives operands P7 from input 115 through multiplexer 120 and P5 from register 119. It calculates the quantity $(\frac{1}{2}) * (P5+P7)$ which is transferred to register 103 at the end of period T+3. The results of subtractor 112 are not used nor saved in a register at the end of this period. Transfers at the end of period T+3 are P7 from input 115 to register 101, P6 from register 101 to register 119, B1 from register 103 to register 104 and B0 from register 104 to register 107. During this period B1 is available at 118 as one of the four desired outputs from the transform calculation sequence.

During period T+4 adder 111 receives the operand P6 from register 119 and the operand $(\frac{1}{2}) * (P5+P7)$ from register 103 through multiplexer 120. It forms the sum B2 which is transferred to register 103 at the end of period T+4. The output of subtractor 112 is neither used nor saved. Transfers taking place at the end of this period are P8 from input 115 to register 101 and P7 from register 101 to register 119.

During period T+5 the quantity B2 is available at 118 as one of the four desired outputs from the transform calculation sequence. Also adder 113 receives the operand B0 from register 107 via multiplexer 125 and B2 from register 103 via multiplexer 121. Adder 113 produces the quantity Y which is transferred to register 110 through multiplexer 124 at the end of the period. Subtractor 114 receives operand B0 from register 107 via multiplexer 126 and operand B2 via multiplexer 123. Subtractor 114 produces the quantity 4 * Z which is scaled by ¼ at the input to multiplexer 122 and then transferred as Z to register 109 at the end of period T+5. Transfers which also occur at the end of this period include B2 from register 103 to register 104, B1 from register 104 to register 107 and −S1 from register 105 to register 108. Registers 105 and 106 have output enable controls such that only one of them during a period can supply data to register 108.

During the T+6 period adder 113 receives the operand B1 from register 107 via multiplexer 125, and the operand Y from register 110 via multiplexer 121 as −Y so as to actually perform a subtraction. The result is transferred to register 109 via multiplexer 122 at the end of the period. A weighting factor of ¼ is used at the input to multiplexer 122 to achieve the desired result of (½) * DCU. This quantity corresponds to a value of (½) for the aforementioned parameter "k". The −Y from register 110 is achieved by activating a polarity control to provide the negative rather than positive value of Y. The subtractor 114 is presented the operand Z from register 109 via multiplexer 126. The operand −S1 is supplied by register 108 during this period. The output of register 108 is enabled and the output of multiplexer 123 is disabled during this period. The quantity SN1=−(−S1)+Z is formed and transferred to register 110 via multiplexer 124 at the end of this period. A transfer of D1 from register 106 to register 108 is also affected at the end of period T+6.

During the T+7 period the subtractor 114 receives (½) * DCU from register 109 via multiplexer 126 and D1 from register 108. The output from multiplexer 123 is disabled. The quantity W is formed and transferred to register 109 at the end of this period. The output from adder 113 is not used.

During period T+8 the final two outputs H and L are formed. Adder 113 receives the operand W from register 109 via multiplexer 125 and operand SN1 from register 110 via multiplexer 121. The quantity L is formed and transferred to register 109 via multiplexer 122 at the end of the period. Subtractor 114 receives operand W from register 109 via multiplexer 126 and the operand SN1 from register 110 via multiplexer 123. The output of register 108 is disabled during this period to avoid bus contention. The result H is transferred to register 110 via multiplexer 124 at the end of period T+8. During period T+9 the desired coefficient outputs H and L are available at 119 and 120 respectively.

FIGS. 22A&B show the operation for the non-continuous case with normalization. The operations are identical to that for the continuous case, with the following exceptions. During period T the term P3, which was previously saved over from an adjacent processing block, is presented to input 116. At the end of the period it is transferred into multiplexer/register 119. The term B0, also saved over, is presented to input 117 during period T+2. It is transferred into register 104 at the end of this period.

FIGS. 23A&B show the operation for the non-continuous non-normalized case. This process is identical to that of FIGS. 22A&B for the periods T through T+4 with the exception that no B0 term is provided at input 117 and subsequently stored in registers 104 and 107. The B0 term is not needed here if normalization is not performed. The major difference between normalization and non-normalization begins with period T+5. During this period adders 113 and 114 are idle since no Y or Z terms are needed in this process. At the end of period T+5, −S1 is transferred from register 105 to register 108 and B1 from multiplexer/register 104 to register 107.

During period T+6, register 109 is cleared to zero by a control signal. Register 109 then provides this value to the subtractor 114 through multiplexer 126. The other operand to subtractor 114 is −S1 from register 108. The output of multiplexer 123 is disabled to avoid bus contention. The output of subtractor 114, SN1 (called SN1 despite the fact that it is not a normalized term), is transferred to register 110 at the end of the period through multiplexer 124. The term D1 from register 106 is also transferred at the end of period T+6 to register 108. Adder 113 is not used during period T+6.

During period T+7 adder 113 is not used. The register 109 is cleared by a control signal to produce a value of zero at its output. This provides one operand to subtractor 114 through multiplexer 126. The other operand is D1 from register 108. The result is W which is transferred to register 109 at the end of the period.

During period T+8 adder 113 receives the term W from register 109 through multiplexer 125 and the term SN1 from register 110 through multiplexer 121. Subtractor 114 receives W from register 109 through multiplexer 126 and SN1 from register 110 through multiplexer 123. Adder 113 produces the term L and subtractor 114 produces the term H. These terms are transferred to register 109 through multiplexer 122 and to register 110 through multiplexer 124 respectively at the end of this period. The terms H and L are available at the outputs 119 and 120 during periods T+9.

To cause the operation described above with reference to FIG. 20 and FIGS. 21A&B, 22A&B and 23A&B to occur, various of the elements of FIG. 20 have control inputs (not shown) which receive control bits read out from an appropriately programmed read-only memory (not shown), locations in which are successively addressed as clock intervals T, T+1, T+2, etc. proceed.

The following TABLE X is a list of twenty control bits 0 through 19, and their individual control functions, necessary to achieve the flow of data and arithmetic operations to produce the actions described above with reference to FIGS. 20, 21A&B, 22A&B and 23A&B for the forward two-dimensional transform:

TABLE X

CONTROL POINTS OF FIG. 20
FORWARD TRANSFORMER

| Bit Number | Action |
|---|---|
| 0 | 0 - multiplexer/register 119 selects input 116 |
|   | 1 - multiplexer/register 119 selects register 101 |
| 1 | 0 - multiplexer 120 selects input 115 |
|   | 1 - multiplexer 120 selects register 103 |
| 2 | 0 - multiplexer/register 104 selects input 117 |

TABLE X-continued
CONTROL POINTS OF FIG. 20 FORWARD TRANSFORMER

| Bit Number | Action |
|---|---|
| | 1 - multiplexer/register 104 selects register 103 |
| 3 | 0 - multiplexer 121 selects register 103 |
| | 1 - multiplexer 121 selects register 110 |
| 4 | 0 - multiplexer 123 selects register 110 |
| | 1 - multiplexer 123 selects register 103 |
| 5 | 0 - output of register 106 is enabled and output of register 105 is disabled |
| | 1 - output of register 105 is enabled and output of register 106 is disabled |
| 6 | 0 - multiplexer 125 selects register 109 |
| | 1 - multiplexer 125 selects register 107 |
| 7 | 0 - multiplexer 126 selects register 109 |
| | 1 - multiplexer 126 selects register 107 |
| 8 & 9 | 00 - multiplexer 122 selects ½ of Adder 113 output |
| | 01 - multiplexer 122 selects Adder 113 output directly |
| | 10 - multiplexer 122 selects Subtractor 114 output directly |
| | 11 - multiplexer 122 selects ½ of Subtractor 114 output |
| 10 | 0 - multiplexer 124 selects ½ of Adder 113 output |
| | 1 - multiplexer 124 selects Subtractor 114 output directly |
| 11 | 0 - selects positive polarity of register 110 as output |
| | 1 - selects negative polarity of register 110 as output |
| 12 | 0 - enables the clock input of register/multiplexer 104 |
| | 1 - disables the same clock input |
| 13 | 0 - enables the clock input of register 105 |
| | 1 - disables the same clock input |
| 14 | 0 - enables the clock input of register 106 |
| | 1 - disables the same clock input |
| 15 | 0 - enables the clock input of register 107 |
| | 1 - disables the same clock input |
| 16 | 0 - enables the clock input of register 108 |
| | 1 - disables the same clock input |
| 17 | 0 - enables the clock input of register 110 |
| | 1 - disables the same clock input |
| 18 | 0 - enables the output of register 108; disables the output of multiplexer 123 |
| | 1 - enables the output of multiplexer 123; disables the output of register 108 |
| 19 | 0 - forces the value of register 109 to zero |
| | 1 - does not force the value of register 109 to zero |

The control bits 0 through 19 are generated (such as by reading out from a read-only memory) in the following patterns to achieve the required operation. The columns T through T+9 correspond to the time intervals of FIGS. 21A, 21B and 21C. An "X" entry is a "don't care". No entry means the control bit in question is controlling processing blocks adjacent to the example being shown.

The following TABLE XI shows the control bits for the continuous, normalized case of FIG. 21A&B:

TABLE XI
FORWARD TRANSFORM CONTINUOUS NORMALIZED (FIGS. 21A&B)

| Bit No | T | T+1 | T+2 | T+3 | T+4 | T+5 | T+6 | T+7 | T+8 | T+9 |
|---|---|---|---|---|---|---|---|---|---|---|
| 0 | 1 | 1 | 1 | 1 | | | | | | |
| 1 | | 0 | 1 | 0 | 1 | | | | | |
| 2 | | 1 | X | 1 | X | | | | | |
| 3 | | | | | | 0 | 1 | X | 1 | |
| 4 | | | | | | 1 | X | X | 0 | |
| 5 | | | | | | 0 | 1 | X | X | |
| 6 | | | | | | 1 | 1 | X | 0 | |
| 7 | | | | | | 1 | 0 | 0 | 0 | |
| 8 | | | | | | 1 | 0 | 1 | 0 | |
| 9 | | | | | | 1 | 0 | 0 | 1 | |
| 10 | | | | | | 0 | 1 | X | 1 | |
| 11 | | | | | | 1 | X | 0 | X | |
| 12 | 0 | 1 | 0 | 1 | | | | | | |
| 13 | 0 | 1 | 1 | 1 | | | | | | |
| 14 | | 0 | 1 | 1 | 1 | | | | | |
| 15 | | | 0 | 1 | 0 | 1 | | | | |
| 16 | | | | | | 0 | 0 | 1 | 1 | |
| 17 | | | | | | 0 | 0 | 1 | 0 | |
| 18 | | | | | | | 0 | 0 | 1 | 1 |
| 19 | | | | | | | 1 | 1 | 1 | 1 |

The following TABLE XII shows the control bits for the non-continuous, normalized case of FIGS. 22A&B:

TABLE XII
FORWARD TRANSFORM NON-CONTINUOUS NORMALIZED (FIGS. 22A&B)

| Bit No | T | T+1 | T+2 | T+3 | T+4 | T+5 | T+6 | T+7 | T+8 | T+9 |
|---|---|---|---|---|---|---|---|---|---|---|
| 0 | 0 | 1 | 1 | 1 | | | | | | |
| 1 | | 0 | 1 | 0 | 1 | | | | | |
| 2 | | X | 1 | 0 | X | | | | | |
| 3 | | | | | | 0 | 1 | X | 1 | |
| 4 | | | | | | 1 | X | X | 0 | |
| 5 | | | | | | 0 | 1 | X | X | |
| 6 | | | | | | 1 | 1 | X | 0 | |
| 7 | | | | | | 1 | 0 | 0 | 0 | |
| 8 | | | | | | 1 | 0 | 1 | 0 | |
| 9 | | | | | | 1 | 0 | 0 | 1 | |
| 10 | | | | | | 0 | 1 | X | 1 | |
| 11 | | | | | | 1 | X | 0 | X | |
| 12 | | X | 0 | 0 | 1 | | | | | |
| 13 | 0 | 1 | 1 | 1 | | | | | | |
| 14 | | 0 | 1 | 1 | 1 | | | | | |
| 15 | | | 0 | 1 | 0 | 1 | | | | |
| 16 | | | | | | 0 | 0 | 1 | 1 | |
| 17 | | | | | | 0 | 0 | 1 | 0 | |
| 18 | | | | | | | 0 | 0 | 1 | 1 |
| 19 | | | | | | | 1 | 1 | 1 | 1 |

Lastly, the following TABLE XIII shows the control bits for non-continuous, non-normalized case of FIGS. 23A&B:

TABLE XIII
FORWARD TRANSFORM NON-CONTINUOUS, NON-NORMALIZED (FIGS. 23A&B)

| Bit No | T | T+1 | T+2 | T+3 | T+4 | T+5 | T+6 | T+7 | T+8 | T+9 |
|---|---|---|---|---|---|---|---|---|---|---|
| 0 | 0 | 1 | 1 | 1 | | | | | | |
| 1 | | 0 | 1 | 0 | 1 | | | | | |
| 2 | | X | X | 0 | X | | | | | |
| 3 | | | | | | 0 | 1 | X | 1 | |
| 4 | | | | | | 1 | X | X | 0 | |
| 5 | | | | | | 0 | 1 | X | X | |
| 6 | | | | | | X | X | X | 0 | |
| 7 | | | | | | X | 0 | 0 | 0 | |
| 8 | | | | | | X | X | 1 | 0 | |
| 9 | | | | | | X | X | 0 | 1 | |
| 10 | | | | | | X | 1 | X | 1 | |
| 11 | | | | | | X | X | 0 | X | |
| 12 | | X | X | 0 | 1 | | | | | |
| 13 | 0 | 1 | 1 | 1 | | | | | | |
| 14 | | 0 | 1 | 1 | 1 | | | | | |
| 15 | | | X | X | 0 | 1 | | | | |
| 16 | | | | | | 0 | 0 | 1 | 1 | |
| 17 | | | | | X | 0 | 1 | 0 | | |
| 18 | | | | | | | 0 | 0 | 1 | 1 |

TABLE XIII-continued
FORWARD TRANSFORM
NON-CONTINUOUS, NON-NORMALIZED (FIGS. 23A&B)

| Bit No | T | T+1 | T+2 | T+3 | T+4 | T+5 | T+6 | T+7 | T+8 | T+9 |
|---|---|---|---|---|---|---|---|---|---|---|
| 19 | | | | | | | 0 | 0 | 1 | 1 |

Inverse Transform Apparatus

With reference now to FIGS. 24A, 24B, 24C and 24D, there is shown a block diagram of electronic apparatus for performing the reconstruction transform process described hereinabove with reference to FIG. 17. The two-dimensional reconstruction, rather than that for the one-dimensional case, is shown in that some additional hardware required to generate D Carry-Up coefficients for two dimensions is included. In the one-dimensional case these are directly available and the associated apparatus may be omitted. The apparatus is divided into four interconnecting sections labeled A, B, C and D corresponding to FIGS. 24A, 24B, 24C and 24D, respectively, and described individually. The vertical reconstruction is first performed. The horizontal reconstruction is subsequently perfomed utilizing the same apparatus, although separate apparatus could also be used to facilitate transformation of a larger number of two dimensional signals per unit time. In the apparatus of FIGS. 24A-24D the results of the vertical reconstruction must be saved over temporarily in memory (not shown) until the appropriate time to apply them as inputs to the reconstruction transformer to accomplish horizontal reconstruction.

To simplify terminology and understanding, the nomenclature used in the description of this apparatus is that of a single dimension. FIG. 17 shows the sequence of these single dimensional operations required to perform the two dimensional Pyramid Transform.

Figure 24A:
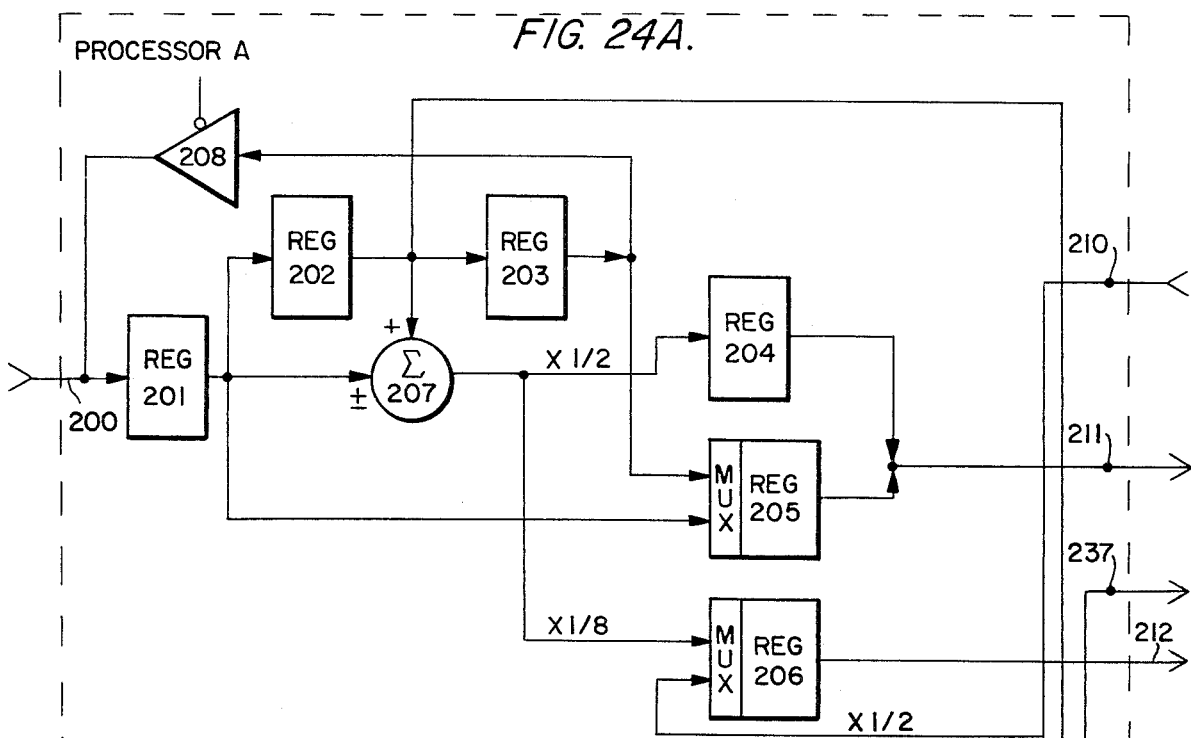
FIGS. 24A, 24B, 24C and 24D illustrate individual processors of a overall two-dimensional reconstruction processor in accodance with the invention.
Figure 25:
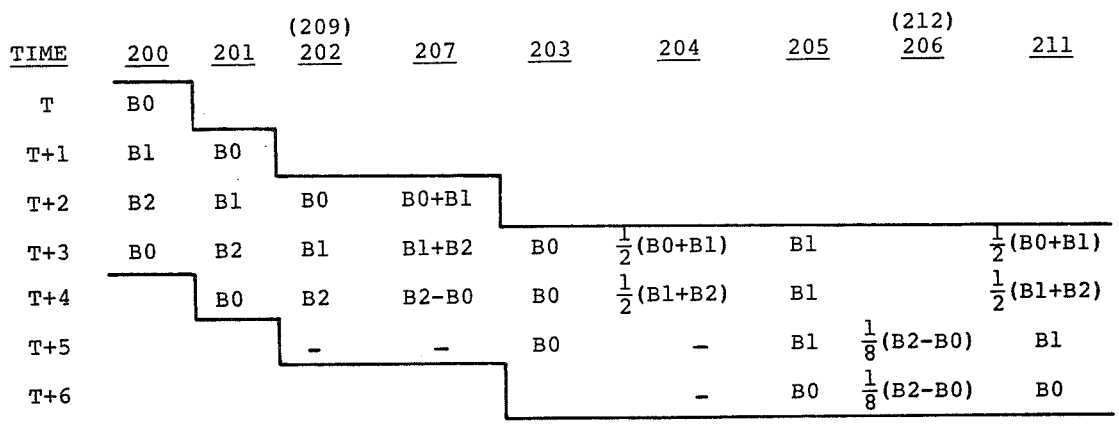
FIGS. 25 and 26 are data flow diagrams for two modes of operation of the processor depicted in FIG. 24A.
Figure 26:
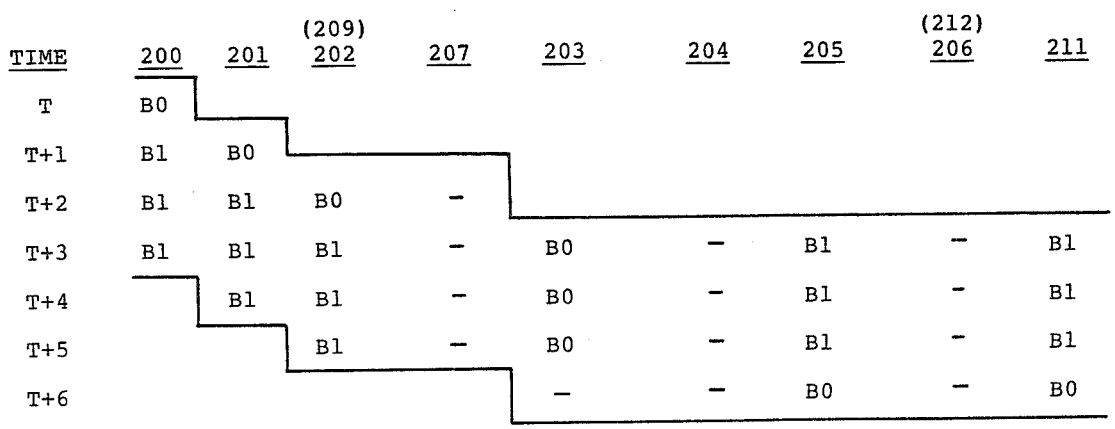
Figure 29:
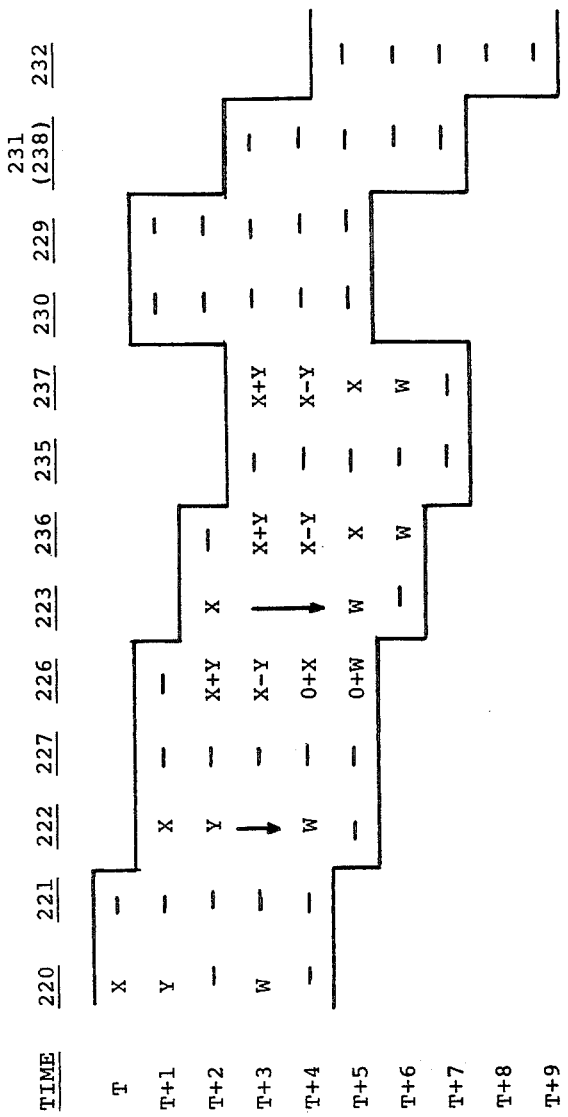

Processor A of FIG. 24A receives base functions (B-function terms) at input 200 and provides outputs at 211 and 212 to be combined with intermediate results from the other sections. As shown in FIGS. 25 and 26, Processor A operates in two separate modes to accomodate the aforementioned Type I interpolation calculations and the Type II non-interpolation calculations, FIGS. 25 and 26 respectively showing the sequential operations and states. The output at 211 is always a base function or an interpolation of two adjacent base functions while the output at 212, when used, contributes to the partial calculations used to initiate and to complete calculations which bridge two processing blocks. The FIG. 24A processor is controlled by eight control bits (TABLE XIV below) which issue from read-only-memories, in similar fashion to that of the forward transformer described above with reference to FIGS. 20, 21A&B, 22A&B and 23A&BC. A pattern of bits (TABLES XV and XVI below) is stored at successive address locations in these memories. A counter which is incremented by a clock provides the successive address at times T, T+1, T+2, etc., to the memories to cause the desired calculation, flow and output of data.

With specific reference to FIGS. 24A and 25, the Interpolation Type I operation is first described. The term B0 is applied at input terminal 200 during T. At the end of period T this B0 term is transferred into register 201. During the time period T+1 the input data B1 is applied at 200. At the completion of this period B0 is transferred from register 201 to register 202 and B1 is entered into register 201. During period T+2 the input data B2 is applied at 200. The adder/subtractor 207 receives the B0 data held in register 202 and the B1 data held in register 201 and performs an addition of the two data terms. At the end of period T+2 several data transfers occur. Term B0 is transferred from register 202 to register 203, term B1 is transferred from register 201 to registers 202 and 205, term B2 is transferred from input 200 to register 201, and the sum of B0 and B1 from adder/subtractor 207 is scaled by the factor one-half and transferred into register 204. During T+3 the output from register 204 is available for subsequent use at 211. Also, the buffer device 208 is activated such as to apply the contents of register 203, B0, to the input 200. Also, adder/subtractor 207 receives B1 from register 202 and B2 from register 201. At the end of period T+3, B0 is transferred from input 200 to register 201, B2 is transferred from register 201 to register 202 and the output sum from adder/subtractor 207 is scaled by one half and transferred to register 204. During period T+4 the linear interpolation of B1 and B2 from register 204 is available at 211 for subsequent use. The adder/subtractor 207 receives inputs B2 from register 202 and B0 from register 201 to form the difference B2−B0. At the end of period T+4 this difference, scaled by the factor one-eighth, is transferred into register 206 for subsequent use. During period T+5 B1 from register 205 is available at output 211 for subsequent use. At the end of period T+5 B0 is transferred from register 203 to register 205. During period T+6 B0 is available at output 211 for subsequent use. This completes the Type I interpolation cycle in processor A. Four time periods are required at input 200 to enter all of the data after which another set may be entered without disturbing the flow-through nature of the processing during T+4 through T+6 in processor A.

All registers in processor A are clocked by the same common clock which advances the counter which in turn provides addresses to the read-only-memory. Registers 203, 205 and 206 also have clock enable inputs which permit the clock edge to transfer data from the input into the register or inhibit the clock edge from so doing. One commercially available register which performs this function is the transistor-transistor logic type 74S377.

The control points of processor A and their actions are defined in the following TABLE XIV.

TABLE XIV
CONTROL POINTS OF FIG. 24A
RECONSTRUCTION PROCESSOR A

| Bit Number | Action |
|---|---|
| 0 | 0 - causes buffer 208 to apply data from register 203 to input 200 |
| | 1 - causes external data to be applied to input 200 |
| 1 | 0 - enables the clock input at register 203 |
| | 1 - inhibits the same clock input |
| 2 | 0 - selects one-eighth the output of adder/subtractor 207 as input for register 206 |
| | 1 - selects one half of input 210 as input for register 206 |
| 3 | 0 - enables the clock input at register 206 |
| | 1 - inhibits the same clock input |
| 4 | 0 - Adder/subtractor 207 produces the difference of its inputs at its output |
| | 1 - The sum is produced at the output of 207 |
| 5 | 0 - Selects register 203 as the source to transfer data into register 205 |
| | 1 - Selects register 201 as source |
| 6 | 0 - Selects register 204 contents as output 211 |
| | 1 - Selects register 205 contents as output 211 |

TABLE XIV-continued

CONTROL POINTS OF FIG. 24A RECONSTRUCTION PROCESSOR A

| Bit Number | Action |
|---|---|
| 7 | 0 - Enables the clock input at register 205<br>1 - Inhibits the same clock input |

The following TABLE XV shows the control bits (read out from memory) to cause the FIG. 24A reconstruction processor A to operate in the interpolation mode:

TABLE XV

RECONSTRUCTION PROCESSOR A INTERPOLATION MODE (FIG. 25)

| Bit No. | T | T+1 | T+2 | T+3 | T+4 | T+5 | T+6 |
|---|---|---|---|---|---|---|---|
| 0 | 1 | 1 | 1 | 0 | | | |
| 1 | | | 0 | 1 | 1 | X | |
| 2 | | X | X | X | 0 | X | |
| 3 | | | X | X | 0 | 1 | |
| 4 | | | 1 | 1 | 0 | X | |
| 5 | | | | 1 | 1 | 0 | 1 |
| 6 | | | | 0 | 0 | 1 | 1 |
| 7 | | 0 | 1 | 1 | 0 | | |

The non-interpolation mode (Type II) requirements for processor A of FIG. 24A are merely to transfer B0 and B1 which are applied at input 200 to the output 211 at the times shown in FIG. 26. B1 takes the path through registers 201 and 205; B0 takes the path through registers 201, 202, 203 and 205.

The following TABLE XVI shows the control bits (sequentially read out from memory) to cause the FIG. 24A reconstruction processor A to operate in the non-interpolation mode:

TABLE XVI

RECONSTRUCTION PROCESSOR A NON-INTERPOLATION MODE (FIG. 26)

| Bit No. | T | T+1 | T+2 | T+3 | T+4 | T+5 | T+6 |
|---|---|---|---|---|---|---|---|
| 0 | 1 | 1 | 1 | 1 | | | |
| 1 | | | 0 | 1 | 1 | X | |
| 2 | | X | X | X | 1 | | |
| 3 | | | X | X | 0 | X | |
| 4 | | | X | X | X | X | |
| 5 | | | | 1 | 1 | 0 | 1 |
| 6 | | | | 1 | 1 | 1 | 1 |
| 7 | | | 0 | 0 | 0 | 0 | |

Figure 24B:
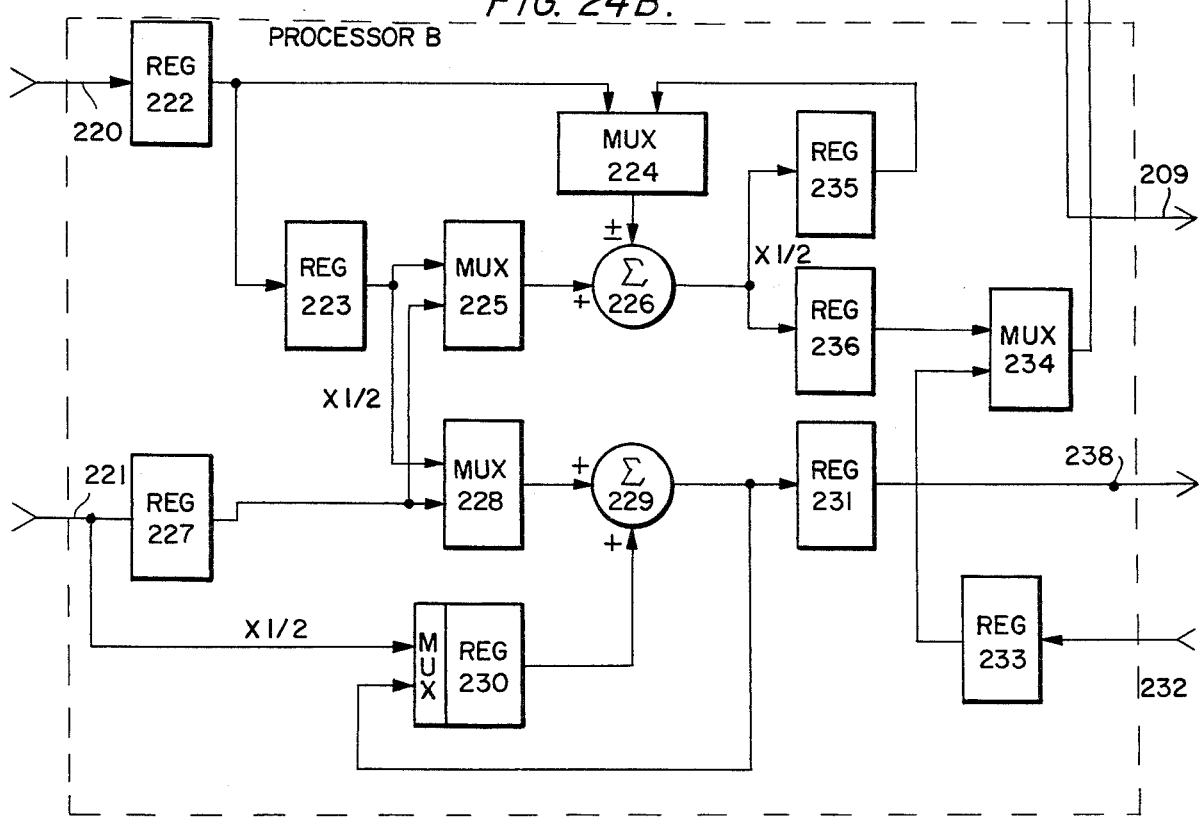

As shown in FIG. 24B, reconstruction processor B has three input ports 220, 221, and 232, and two output ports 237 and 238. Referring also to the Steps of FIG. 17 the processor B operates in three distinct modes to provide processing of coefficient terms. The first mode is the interpolation mode which supports coefficient processing in steps one and eight as well as the vertical D Carry-Up generation in Step 5 of FIG. 17. The second mode is the non-interpolation one which supports coefficient processing in Step 2 of FIG. 17. The third mode supports the completion of horizontal D carry-up generation in Step 7. The two outputs 237 and 238 provide data to processor D. Inputs for the first two modes of processor B are two dimensional coefficients or visible or invisible D-type coefficients terms in the case of Step 5 processing in FIG. 17. Inputs for the third mode of processor B issue from the output of processor C. These latter outputs are sometimes stored temporarily in a buffer memory before being used as inputs to processor B. The timing diagrams for the three modes of the FIG. 24B processor B are shown in FIGS. 27A&B, 28A&B, and 29A&B, respectively. For the cases depicted, the value of the aforementioned parameter "k" has been chosen as one-half. The control bit functions and sequences for operation are presented hereinbelow in TABLES XVII, XVIII, XIX, and XX.

Mode 1, that of interpolation processing, will first be described with reference to FIGS. 24B and 27A&B. At time T the H-type coefficient is presented to input 220 and one-half of the D carry-up term ($\frac{1}{2}$) * DCU is presented to input 221. At the end of this period, H is transferred into register 222, and ($\frac{1}{2}$) * DCU is transferred into register 227. Also, the latter term is scaled by one-half and transferred into register 230. During period T+1 adder/subtractor 226 receives term H from register 222 through the multiplexer 224 and the term ($\frac{1}{2}$) * DCU from register 227 through multiplexer 225. During the same period adder 229 receives the term ($\frac{1}{2}$) * DCU from register 227 through multiplexer 228 and the term ($\frac{1}{4}$) * DCU from multiplexer-register 230. Also during this period the term L is applid to input 220. At the end of period T+1 the output of adder/subtractor 226 is transferred into register 236, the output of adder 229 is transferred to multiplexer-register 230, H from register 222 is transferred into register 223 and the input term L is transferred from input 220 to register 222.

During period T+2 adder/subtractor 226 receives the term H from register 223 through multiplexer 225 and the term L from register 222 through multiplexer 224. Adder 229 receives the term ($\frac{3}{4}$) * DCU from register 230 and the term H, scaled by the factor one-half from register 223 through multiplexer 228. At the end of period T+2 the output from adder/subtractor 226 is scaled by one-half and transferred into register 235 and the output from adder 229 is transferred into register 231. The L term is transferred from register 222 to register 223.

During period T+3 adder/subtractor 226 receives the term ($\frac{1}{2}$) * DCU from register 227 through multiplexer 225 and the term L from register 222 through multiplexer 224. Adder 229 receives the term ($\frac{3}{4}$) * DCU from register 230 and the term ($\frac{1}{2}$) * L from register 223 through multiplexer 228. No new inputs are presented during this period. The term ($\frac{1}{2}$) * DCU+H from register 236 is presented to output 237 through multiplexer 234. The output term ($\frac{3}{4}$) * DCU+0.5 * H from register 231 is presented to output 238. At the end of period T+3 the output of adder/subtractor 226 is transferred to register 236 and the output of adder 229 is transferred into register 231.

During period T+4 adder/subtractor 226 receives the term ($\frac{1}{2}$) * DCU from register 227 through multiplexer 225 and the term ($\frac{1}{2}$) * (H+L) from register 235 through multiplexer 224. Adder 229 is not used during this period. A new processing sequence of four periods at the input may be started at this time without adversely affecting the processing of the data already in progress. At the end of period T+4 the output of adder/subtractor 226 is transferred into register 236.

During period T+5 the term Di from processor D is presented at input 232 and transferred into register 233 at the end of this period. The term ($\frac{1}{2}$) * (DCU+H+L) is presented to output 237 through multiplexer 234 from register 236. During T+6 Di is available from register 233 through multiplexer 234 and is presented at output 237 for transfer to processor D.

In Mode 2 processor B performs non-interpolation coefficient processing in which registers 227, 230 and 231 and adder 229 are not used. During period T shown in Mode 2 of FIG. 28 the coefficient H is presented at input terminal 220 and transferred into register 222 at the end of the period. During period T+1 adder/subtractor 226 receives input H from register 222 through multiplexer 224 and a value of 0 from multiplexer 225 which is turned off so as not to select either of its inputs for its output. Also the term L is presented at input 220 during this period. At the end of period T+1 the output of adder/subtractor 226, H itself, is transferred into register 236, the output of register 222, also H, is transferred into register 223, and the input L at 220 is transferred into register 222.

During period T+2 the adder/subtractor 226 receives the term H from register 223 through multiplexer 225 and the term L from register 222 through multiplexer 224. At the end of this period the output of the adder/subtractor 226 is scaled by one-half and transferred into register 235. Also, L from register 222 is transferred from register 222 into register 223.

During period T+3 the term H from register 236 is available at output 237 through multiplexer 234. Also, adder/subtractor 226 receives L from register 223 through multiplexer 225 and a 0 from multiplexer 224 which is disabled so as to select neither of its inputs for its output. At the end of this period the output of adder/subtractor 226 is transferred into register 236.

During period T+4, L in register 236 is available through multiplexer 234 at output 237. Adder/subtractor 226 receives input (½) * (H+L) from register 235 through multiplexer 224 as one input and a value of 0 from the disabled multiplexer 225 at the other input and performs a subtraction. At the end of this period the output of adder/subtractor 226 is transferred to register 236.

During period T+5, Di is at input 232, and the output of register 236 is available through multiplexer 234 at output 237. At the end of period T+5, Di is transferred into register 233. During period T+6 the output of register 233 is available through multiplexer 234 at output 237.

Mode 3 of processor B involves support of horizontal carry-up completion in Step 7 of FIG. 17. At period T of FIG. 29 the term X from processor C and as output of Step 3 in FIG. 17 is presented at input 220 and transferred into register 222 at the end of the period. During period T+1 the term Y from processor C and an output of Step 6 in FIG. 17 is presented at input 220. At the end of this period the term X is transferred from register 222 into 223 and the term Y is transferred from input 220 into register 222.

During period T+2 adder/subtractor 226 receives input X from register 223 through multiplexer 225 and input Y from register 222 through multiplexer 224 and forms the sum of the two terms. At the end of this period the output of 226 is transferred into register 236.

During period T+3 the term X+Y from register 236 is available through multiplexer 234 at output 237. Also, the term W from processor C and an output from Step 4 in FIG. 17 is presented at input 220. The adder/subtractor 226 receives the same input terms as in period T+2, but this time forms the difference X−Y. At the end of this period the output of 226 is transferred into register 236, and W is transferred from input 220 into register 222.

During period T+4, X−Y in register 236 is presented to output 237 through multiplexer 234. The adder/subtractor 226 receives the term X from register 223 and a value of 0 from multiplexer 224 which is disabled during this period. At the end of this period the output of 226, X itself, is transferred into register 236. Also, W is transferred from register 222 to register 223.

During period T+5 the output of register 236 is presented to output 237 through multiplexer 234. Also, adder/subtractor 226 receives W from register 223 through multiplexer 225 and the value of 0 from multiplexer 224 which is disabled. At the end of the period the output of 226 is transferred into register 236. During period T+6, W is available at output 237 from register 236 through multiplexer 234. This process requires five steps for data input. A new process may begin with new data at T+5.

A total of fifteen control bits are required to cause processor B to product the results heretofore described. The function of each is defined in the following TABLE XVII, and the control bit patterns for the three modes are defined in the following TABLES XVIII, XIX and XX.

TABLE XVII

CONTROL POINTS OF FIG. 26
RECONSTRUCTION PROCESSOR B

| Bit Number | Action |
| --- | --- |
| 0 | 0 — enables clock input for register 235 |
|   | 1 — disables clock input for register 235 |
| 1 | 0 — subtract mode for adder/subtractor 226 |
|   | 1 — add mode for adder/subtractor 226 |
| 2 | 0 — enables multiplexer 224 |
|   | 1 — disables multiplexer 224: output = 0 |
| 3 | 0 — multiplexer 224 selects register 222 |
|   | 1 — multiplexer 224 selects register 235 |
| 4 | 0 — enables multiplexer 225 |
|   | 1 — disables multiplexer 225: output = 0 |
| 5 | 0 — multiplexer 225 selects register 223 |
|   | 1 — multiplexer 225 selects register 227 |
| 6 | 0 — multiplexer 228 selects register 227 |
|   | 1 — multiplexer 228 selects register 223 |
| 7 | 0 — enables clock input for register 222 |
|   | 1 — inhibits the same clock input |
| 8 | 0 — enables clock input for register 223 |
|   | 1 — inhibits the same clock input |
| 9 | 0 — enables clock input for register 230 |
|   | 1 — inhibits the same clock input |
| 10 | 0 — enables clock input for register 227 |
|    | 1 — inhibits the same clock input |
| 11 | 0 — multiplexer/register 230 selects 221 |
|    | 1 — multiplexer/register 230 selects 229 |
| 12 | 0 — enables clock input for register 236 |
|    | 1 — inhibits the same clock input |
| 13 | 0 — enables clock input for register 231 |
|    | 1 — inhibits the same clock input |
| 14 | 0 — multiplexer 234 selects register 236 |
|    | 1 — multiplexer 234 selects register 233 |

TABLE XVIII

RECONSTRUCTION PROCESSOR B
INTERPOLATION MODE (FIGS. 27A&B)

| Bit No. | T | T+1 | T+2 | T+3 | T+4 | T+5 | T+6 |
| --- | --- | --- | --- | --- | --- | --- | --- |
| 0 |   |   | 0 | 1 | X | X |   |
| 1 |   | 1 | 1 | 1 | 0 |   |   |
| 2 |   |   | 0 | 0 | 0 | 0 |   |
| 3 |   |   | 0 | 0 | X | 1 |   |
| 4 |   |   | 0 | 0 | 0 | 0 |   |
| 5 |   | 1 |   | 0 | 1 | 1 |   |
| 6 |   | 0 | 1 | 1 | X |   |   |
| 7 | 0 | 0 | 1 | X |   |   |   |
| 8 |   | 0 | 0 | X | X |   |   |
| 9 | 0 | 0 | 1 | X |   |   |   |
| 10 | 0 | 1 | 1 | 1 |   |   |   |
| 11 | 0 | 1 | X | X |   |   |   |
| 12 |   | 0 | 1 | 0 | 0 |   |   |
| 13 |   |   | 0 | 0 | 1 | 1 |   |
| 14 |   |   |   |   | 0 | 0 | 1 |

TABLE XIX

RECONSTRUCTION PROCESSOR B
NON-INTERPOLATION MODE (FIG. 28)

| Bit No. | T | T+1 | T+2 | T+3 | T+4 | T+5 | T+6 |
|---|---|---|---|---|---|---|---|
| 0 |   |   | 0 | 1 | X | X |   |
| 1 |   | 1 | 1 | 1 | 0 |   |   |
| 2 |   | 0 | 0 | 1 | 0 |   |   |
| 3 |   | 0 | 0 | X | 1 |   |   |
| 4 |   | 1 | 0 | 0 | 1 |   |   |
| 5 |   | X | 0 | 0 | X |   |   |
| 6 |   | X | X | X | X |   |   |
| 7 | 0 | 0 | X | X |   |   |   |
| 8 |   | 0 | 0 | X | X |   |   |
| 9 | X | X | X | X |   |   |   |
| 10 | X | X | X | X |   |   |   |
| 11 | X | X | X | X |   |   |   |
| 12 |   | 0 | 1 | 0 | 0 |   |   |
| 13 |   |   | X | X | X | X |   |
| 14 |   |   |   | 0 | 0 | 0 | 1 |

TABLE XX

RECONSTRUCTION PROCESSOR B
HORIZONTAL CARRY-UP COMPLETION MODE (FIG. 29)

| Bit No. | T | T+1 | T+2 | T+3 | T+4 | T+5 | T+6 | T+7 |
|---|---|---|---|---|---|---|---|---|
| 0 |   |   | X | X | X | X | X |   |
| 1 |   | X | 1 | 0 | 1 | 1 |   |   |
| 2 |   | X | 0 | 0 | 1 | 1 |   |   |
| 3 |   | X | 0 | 0 | X | X |   |   |
| 4 |   | X | 0 | 0 | 0 | 0 |   |   |
| 5 |   | X | 1 | 1 | 1 | 1 |   |   |
| 6 |   | X | X | X | X | X |   |   |
| 7 | 0 | 0 | 1 | 0 | X |   |   |   |
| 8 |   | 0 | 1 | 1 | 0 | X |   |   |
| 9 | X | X | X | X | X |   |   |   |
| 10 | X | X | X | X | X |   |   |   |
| 11 | X | X | X | X | X |   |   |   |
| 12 |   | X | 0 | 0 | 0 | 0 |   |   |
| 13 |   |   | X | X | X | X | X |   |
| 14 |   |   |   | 0 | 0 | 0 | 0 | X |

Figure 24C:
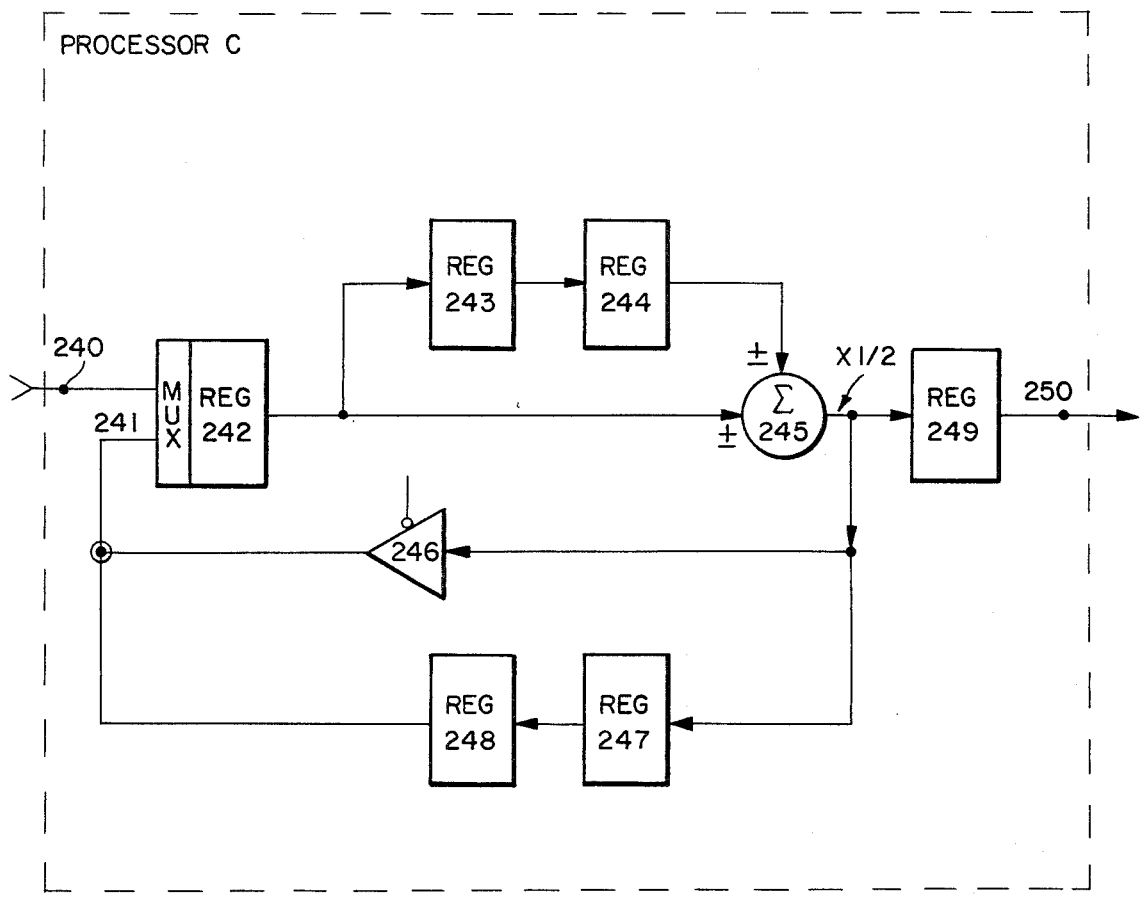

Processor C of FIG. 24C accomplishes the FIG. 17 Steps 3, 4 and 6 to produce the outputs W, X, and Y needed as inputs to processor B described above with reference to FIGS. 24B, 27A&B, 28, and 29. All inputs enter processor C at 240 and all oututs are available at 250. This processor is only required for two dimensional reconstructions and is not required for a one dimensional reconstruction. The operation is described in three distinct parts and occurs during three separate modes. The first part is a S-type forward transform operation previously referred to as a Type IV calculation. The second part is another Type IV calculation followed by a forward D-type transform operation previously referred to as a Type III calculation. This second part results in output Y from Step 5 in FIG. 17 required by processor B. The third part is a Type III calculation. It is used twice, once to generate X in Step 3 and once to generate W in Step 4.

The sequences of operations for the three modes are described with reference to the timing sequences of FIGS. 30, 31 and 32 respectively. The nomenclature used is that of reconstruction of a transform in one dimension to simplify terminology. The actual application is that of vertical reconstruction which must later be followed by horizontal reconstruction operating on the data output of the former.

Figure 30:
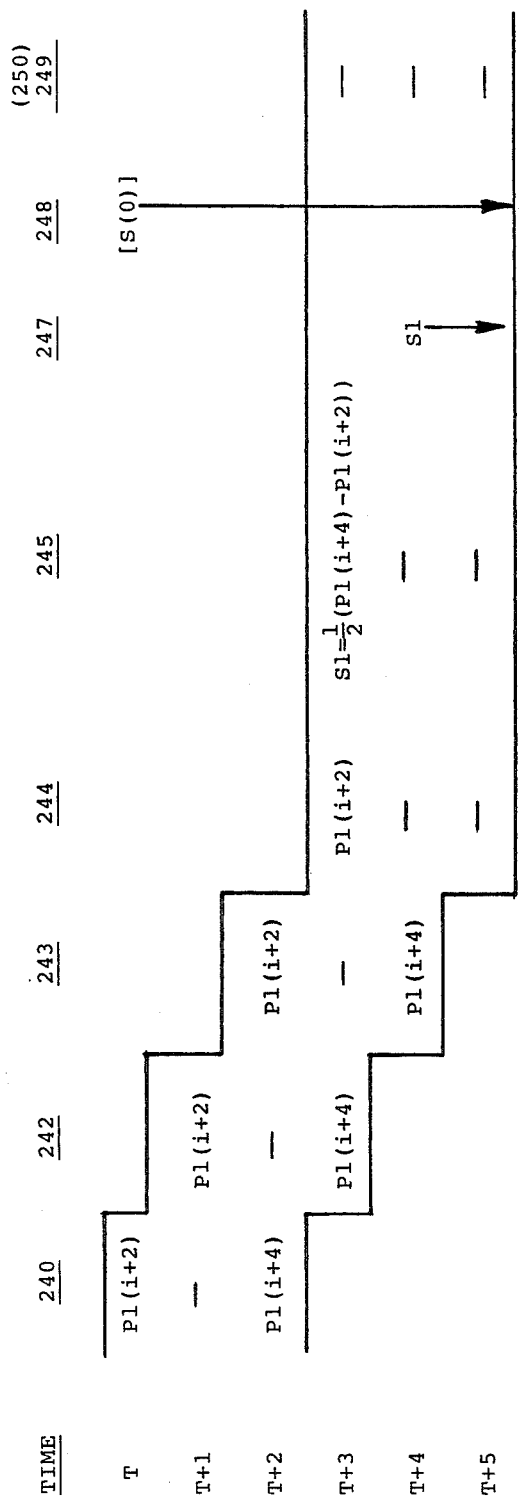
FIGS. 30, 31, and 32 are data flow diagrams for three modes of operation of the FIG. 24C processor.

Referring to the FIG. 30 timing diagram for the first part or mode, during period T, the term P1(i+2) is presented at input 240, having originated as a vertically reconstructed output of processor D. The term S0 is already in register 248 as a result of previous processing. The normal two dimensional processing proceeds on blocks of data in the same band from left to right and as such the term S2, to be developed shortly, of one block becomes S0 in the block immediately to the right. Thus S0 has already been formed and is available for present use. At the end of period T, P1(i+2) is transferred from 240 into register 242. Nothing new occurs during period T+1 but P1(i+2) is transferred from register 242 into register 243 at the end of the period.

During period T+2, P1(i+4) is presented at input 240. At the end of this period P1(i+4) is transferred from 240 into register 242, and P1(i+2) is transferred from register 243 into register 244. During period T+3 adder/subtractor 245 forms the difference between registers 242 and register 244 contents. The output of 245 is scaled by the factor one-half. At the end of period T+3 the scaled output of 245, S1, is transferred into register 247. This completes the first operation of processor C with the result that S0 is in register 248 and S1 is in register 247.

Figure 31:
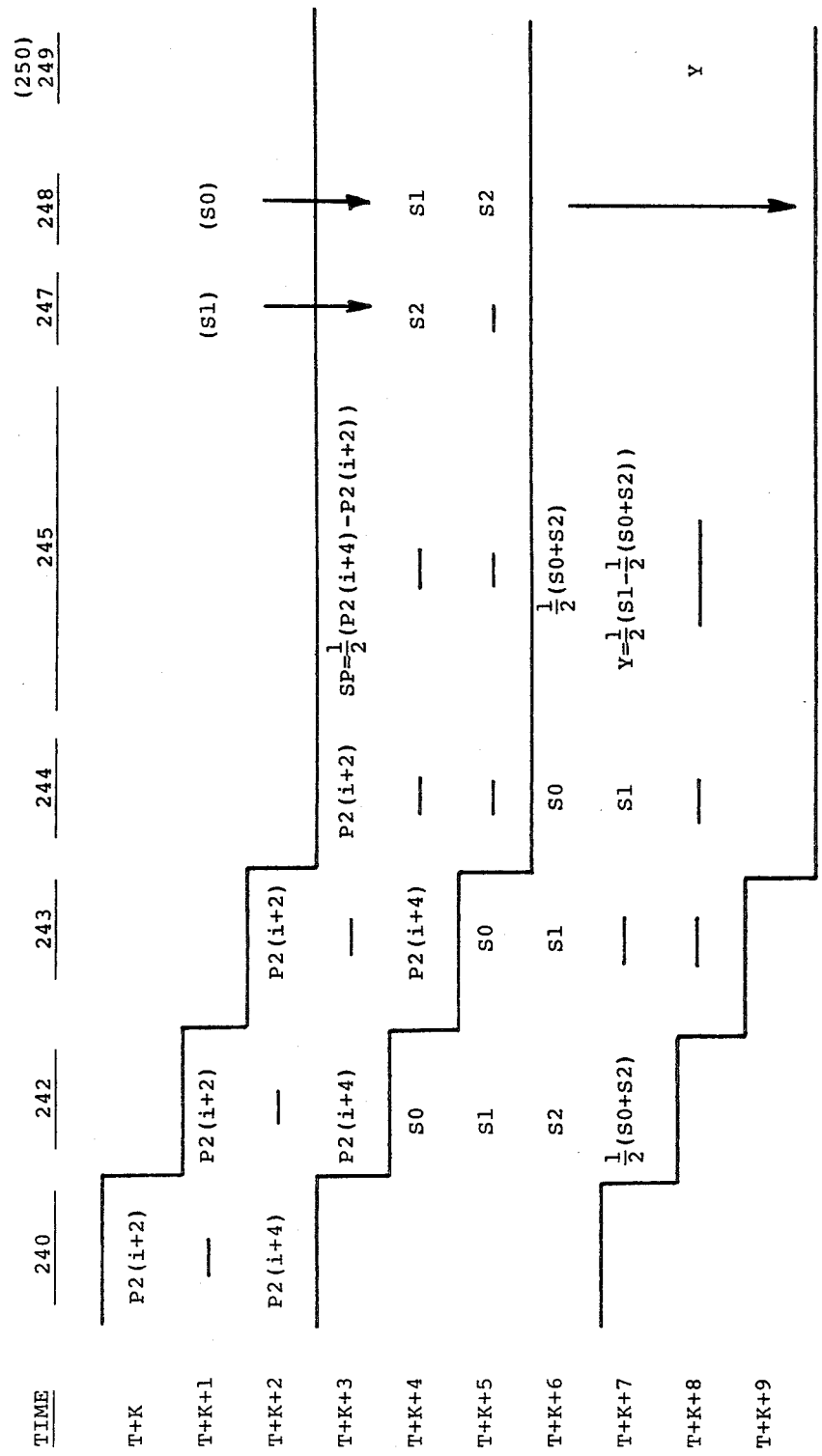

Referring to the timing diagram of FIG. 31, the second operation of processor C generates S2 and then performs the D-type operation to generate output Y. The quantity K is a number which indicates a delay between the first and second operations of processor C. During period T+K, P2(i+2) is presented at input 240. At the completion of this period it is transferred from 240 into register 242; at the completion of period T+K+1 it is transferred from register 242 into register 243.

During period T+K+2, P2(i+4) is presented at the input 240. At the end of this period P2(i+4) is transferred from 240 into register 242 and P2(i+2) in register 243 is transferred into register 244. During period T+K+3 adder/subtractor 245 forms the difference between registers 242 and 244 contents. The output of 245 is scaled by the factor one-half. At the end of period T+K+3 the scaled output of 245, S2, is transferred into register 247. S1 is transformed from register 247 into register 248 and S0 is transferred from register 248 into register 242 via the multiplexer at the input to the register 242. Register 248 and buffer 246 have output enabling controls such that either one or the other but not both simultaneously can provide output data to 241.

At the end of period T+K+4, S0 is transferred from register 242 into register 243, S1 is transferred from register 248 into register 242, and S2 is transferred from register 247 into register 248. At the end of period T+K+5, S0 is transferred from register 243 to register 244, S1 is transferred from register 242 into register 243, and S2 is transferred from register 248 into register 242. S2 is also held in register 248 to become S0 for the next processing block in the same band.

During period T+K+6 adder/subtractor 245 receives S0 from register 244 and S2 from register 242 and forms the sum of the two quantities which is scaled by the factor one-half at the output. Buffer 246 is enabled to present this output to 241 such that at the end of the period the result, 0.5 * (S0+S2) is transferred into register 242. S1 is also transferred from register 243 into register 244.

During period T+K+7 adder/subtractor 245 forms the difference between registers 244 and 242 which is scaled by the factor one-half at its output. This quantity is the desired result Y which is transferred into register 249 at the end of the period and is available at output 250 commencing with period T+K+8. This completes the second part of the action of processor C.

Figure 32:
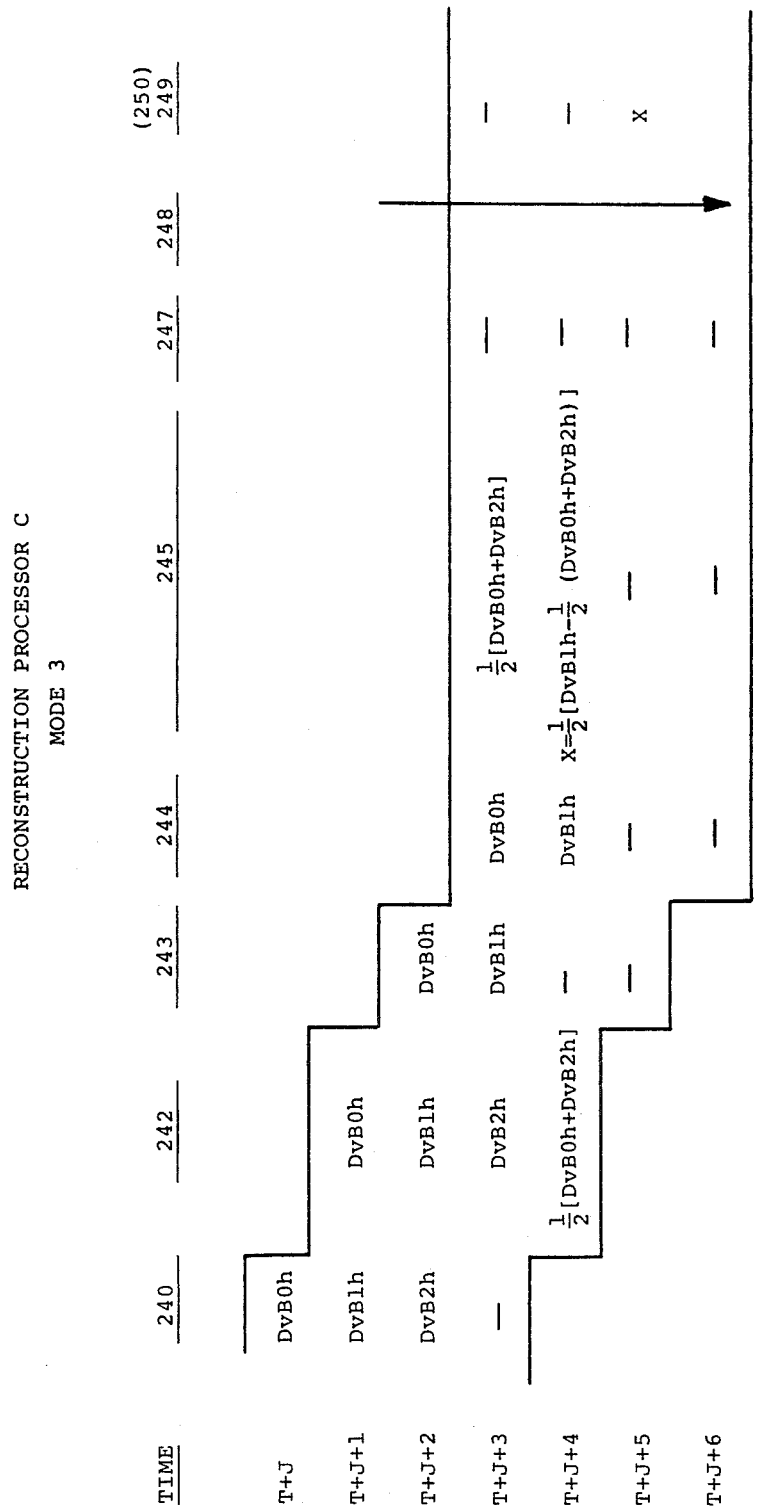

Referring to FIG. 32, the last mode of processor C involves only a forward transform operation on Dv and Dvi terms issuing from Step 1 of FIG. 17. These terms are not vertically reconstructed and hence for clarity the full nomenclature is not used. The operations of Step 3 which show the development of the output X will be described; the same operations are used on Dvi data to yield the output W but need not be described. The quantity J in the FIG. 32 time interval definitions indicates that the operations follow those of the first two processing modes.

During period T+J, DvB0h is presented at input 240 and transferred into register 242 at the end of this period. During period T+J+1, DvB1h is presented at input 240. At the end of this period DvB0h in register 242 is transferred into register 243, and DvB1h is transferred from 240 into register 242. During period T+J+2, DvB2h is presented to input 240. At the end of this period DvB0h is transferred from register 243 into register 244, DvB1h is transferred from register 242 into register 243, and DvB2h is transferred from 240 into register 242.

During period T+J+3 adder/subtractor 245 receives DvB2h from register 242 and DvB0h from register 244 and forms the sum which is scaled by the factor one-half at its output. At the end of this period DvB1h is transferred from register 243 into register 244, and the scaled output of 245 is transferred through buffer 246 into register 242.

During period T+J+4 adder/subtractor 245 receives DvB1h from register 244 and ($\frac{1}{2}$) * (DvB0h+DvB2h) from register 242 and forms the difference which is scaled by the factor one-half at its output. This is the desired output term X which is transferred into register 249 at the end of the period and is available the following period, T+J+5, at output 250.

The functions of the seven control bits for Processor C are defined in the following TABLE XXI, and the patterns of these control bits for each of the processing modes are shown in subsequent TABLES XXII, XXIII and XXIV.

TABLE XXI

CONTROL POINTS FOR FIG. 24C
RECONSTRUCTION PROCESSOR C

| Bit Number | Action |
|---|---|
| 0 | 0 — subtract mode of adder/subtractor 245 |
|   | 1 — add mode of adder/subtractor 245 |
| 1 | 0 — for subtract mode of device 245 performs B input minus A input |
|   | 1 — for subtract mode of device 245 performs A input minus B input |
| 2 | 0 — multiplexer/register 242 selects 240 |
|   | 1 — multiplexer/register 242 selects 241 |
| 3 | 0 — enables buffer output 246 to 241 |
|   | 1 — enables register 248 output to 241 |
| 4 | 0 — enables clock input of register 248 |

TABLE XXI-continued

CONTROL POINTS FOR FIG. 24C
RECONSTRUCTION PROCESSOR C

| Bit Number | Action |
|---|---|
| 5 | 1 — inhibits clock input of register 248 |
|   | 0 — enables clock input of register 249 |
|   | 1 — inhibits clock input of register 249 |
| 6 | 0 — enables clock input of register 247 |
|   | 1 — inhibits clock input of register 247 |

TABLE XXII

RECONSTRUCTION PROCESSOR C
MODE 1 (FIG. 30)

| Bit No. | T | T+1 | T+2 | T+3 | T+4 | T+5 |
|---|---|---|---|---|---|---|
| 0 |   |   |   | 0 | X | X |
| 1 |   |   |   | 0 | X | X |
| 2 | 0 | X | 0 |   |   |   |
| 3 |   | X | X | X |   |   |
| 4 |   |   | X | X | X |   |
| 5 | (1) | (1) | 1 | 1 | 1 | (1) |
| 6 |   |   | 1 | 0 | 1 | (1) |

TABLE XXIII

RECONSTRUCTION PROCESSOR C
MODE 2 (FIG. 31)

| Bit No. | T+K | T+K+1 | T+K+2 | T+K+3 | T+K+4 | T+K+5 | T+K+6 | T+K+7 | T+K+8 | T+K+9 |
|---|---|---|---|---|---|---|---|---|---|---|
| 0 |   |   |   |   |   |   |   |   |   |   |
| 1 |   |   |   | 0 | X | X | 1 | 0 | X | X |
| 2 |   |   |   | 0 | X | X | X | 1 | X | X |
| 3 | 0 | X | 0 | 1 | 1 | 1 | 1 |   |   |   |
| 4 |   | X | X | X | 1 | 1 | 1 | 0 |   |   |
| 5 |   |   | X | X | X | X | X | 0 | X |   |
| 6 | (1) | (1) | 1 | 0 | 0 | 1 | 1 | 1 | 1 | (1) |
|   | (1) | (1) | 1 | 0 | 1 | X | X | X | X |   |

TABLE XXIV

RECONSTRUCTION PROCESSOR C
MODE 3 (FIG. 32)

| Bit No. | T+J | T+J+1 | T+J+2 | T+J+3 | T+J+4 | T+J+5 | T+J+6 |
|---|---|---|---|---|---|---|---|
| 0 |   |   |   | 1 | 0 | X | X |
| 1 |   |   |   | X | 1 | X | X |
| 2 | 0 | 0 | 0 | 1 |   |   |   |
| 3 |   | X | X | X | 0 |   |   |
| 4 |   |   | X | X | 0 | X |   |
| 5 | (1) | (1) | 1 | 1 | 1 | 1 | (1) |
| 6 |   |   | X | X | X | X |   |

Figure 24D:
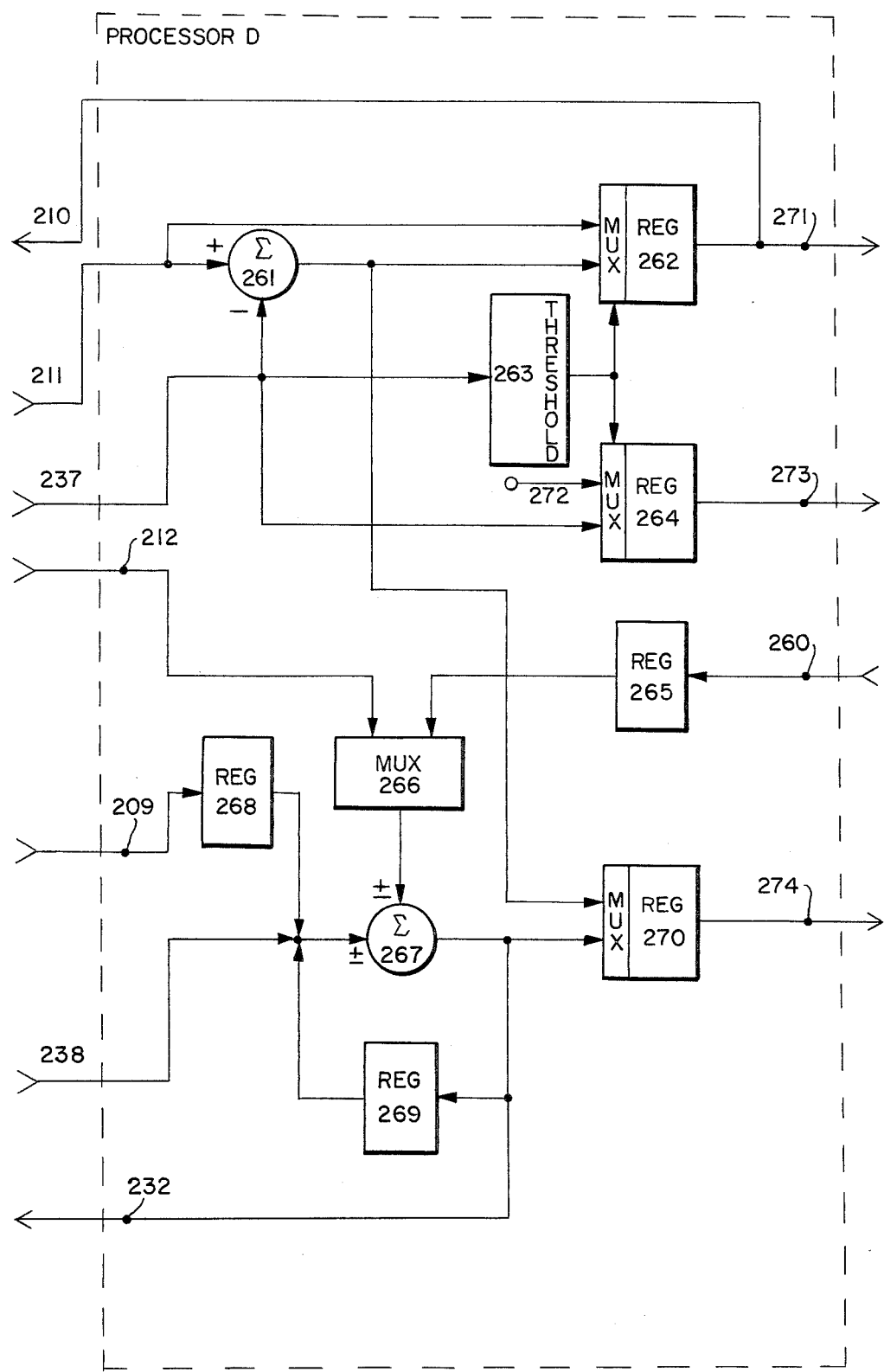

The functions of FIG. 24D reconstruction processor D are generally to complete the calculations of a reconstruction transform started in processors A, B and C and to generate 'partials' which are saved over and used in an adjacent processing block of the same band and which are used to complete the processing initiated in the preceeding block.

Figure 33A:
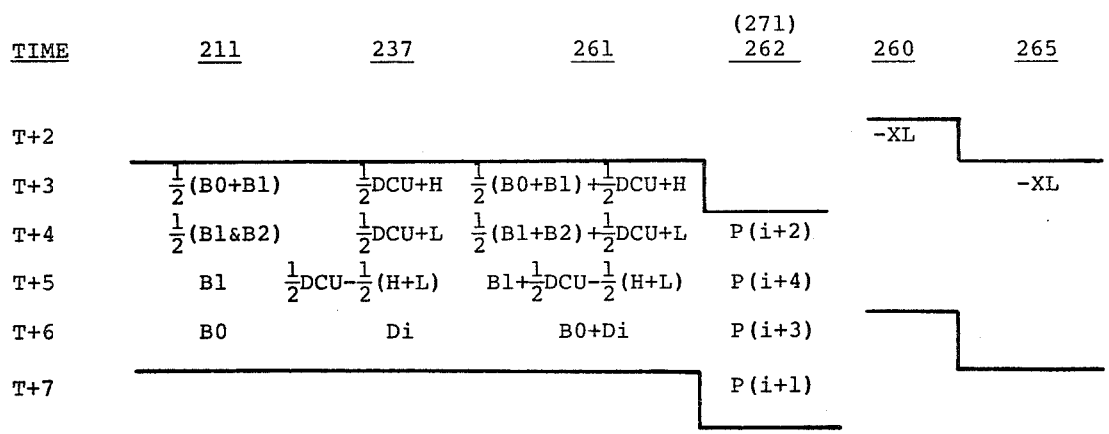
FIGS. 33A&B, 34A&B, and 35 are data flow diagrams for three different modes of operation of the FIG. 24D processor.

Three distinct processing modes are used with processor D. The first mode, depicted in FIGS. 33A&B, supports interpolation reconstruction calculations. All data inputs come from previously described processors except input 260 which accepts 'partials' saved over from an adjacent processing block in the same band. FIGS. 33A&B show the sequence of data operations with the time periods in alignment with those of processors A and B.

During period T+2 the partial −XL is presented to input 260. At the end of the period it is transferred into register 265. During period T+3 adder/subtractor 261 receives the term ($\frac{1}{2}$) * (B0+B1) from 211 and the term ($\frac{1}{2}$) * DCU+H from 237 and forms the sum which is P(i+2). Adder/subtractor 267 receives the term −XL from 265 via multiplexer 266 and the term ($\frac{3}{4}$) * DCU+($\frac{1}{4}$) * H from 238 and forms the difference which is −XL−($\frac{3}{4}$) * DCU−($\frac{1}{4}$) * H. At the end of the period, P(i+2) from 261 is transferred into register 262, and the output of 267 is transferred into register 269. P(i+2) is a reconstructed output element from the transform process and is available at output 271.

During period T+4 adder/subtractor 261 receives the term ($\frac{1}{2}$) * (B1+B2) from 211 and the term ($\frac{1}{2}$) * DCU+L from 237, and forms the sum which is P(i+4). Adder/subtractor Device 267 is not used during this time. At the end of the period, P(i+4) is transferred from the output of 261 into register 262. It is an output element of the transform process and is available at output 271 during period T+5. Also during T+5 terminal 212 receives the term ($\frac{1}{2}$) * (B2−B0) referred to in FIGS. 33A&B as ($\frac{1}{2}$) * SA. Also, adder/subtractor 261 receives B1 at terminal 211 and ($\frac{1}{2}$) * DCU−($\frac{1}{2}$) * (H+L) at terminal 237, and forms the sum which is P(i+3). Adder/subtractor 267 receives −XL−($\frac{3}{4}$) * DCU−($\frac{1}{4}$) * H from terminal 269 and ($\frac{1}{2}$) * SA from terminal 212, and forms the difference which is Di. At the end of this period, P(i+3) from the output of 261 is transferred into register 262, and Di which issues from 267 and is at output terminal 232 is transferred into register 233 of processor B.

During time period T+6, adder/subtractor 261 receives B0 at terminal 211 and Di from terminal 237 and forms the sum of the two terms which is P(i+1). Adder/subtractor 267 receives the term ($\frac{3}{4}$) * DCU+($\frac{1}{4}$)+L at terminal 238 and the term ($\frac{1}{2}$) * SA from terminal 212 via multiplexer 266, and forms the difference at its output which is the output partial, −XL, which is then transferred into register 270 at the end of the period. The term Di at 237 is also applied to threshold device 263. If the magnitude of the signal at 237 is less than the threshold setting of device 263, then multiplexer/register 262 will have transferred in the quantity at terminal 211 rather than the output 261 at the end of the period. Similarly, if the same condition is true then multiplexer 264 will have transferred in the value zero rather than the quantity at terminal 237. In this way smoothing of the output can be effected where the calculated value of Di is lower than a predetermined threshold.

During period T+7, the contents of register 262, P(i+1), is presented at output 271, the contents of register 264 is presented at output 273 and the "partial" quantity −XL in register 270 is presented at output 274.

Figure 34A:
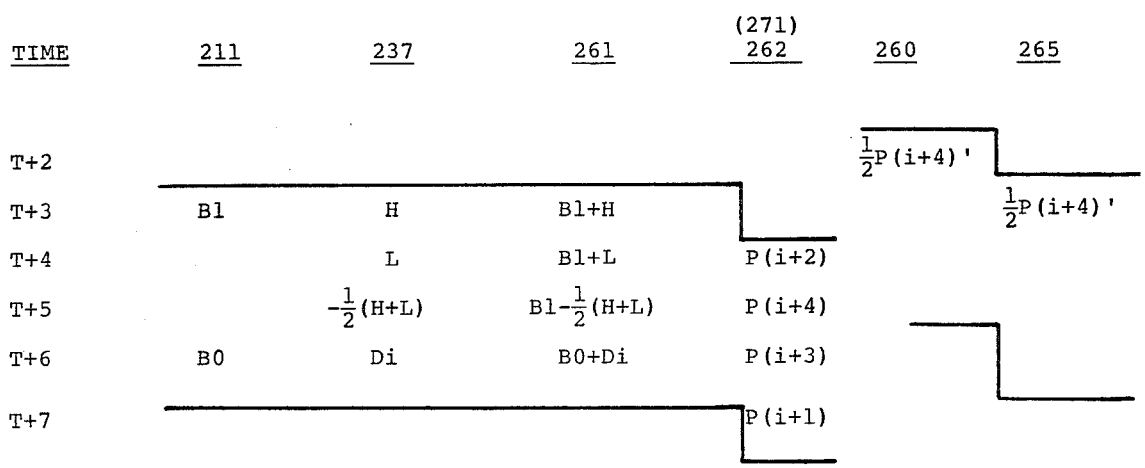
Figure 33B:
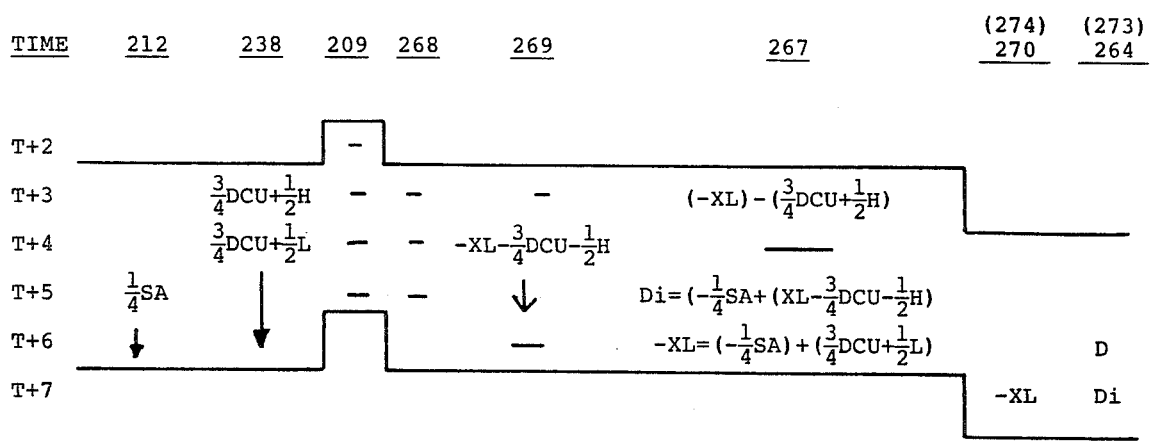
Figure 34B:
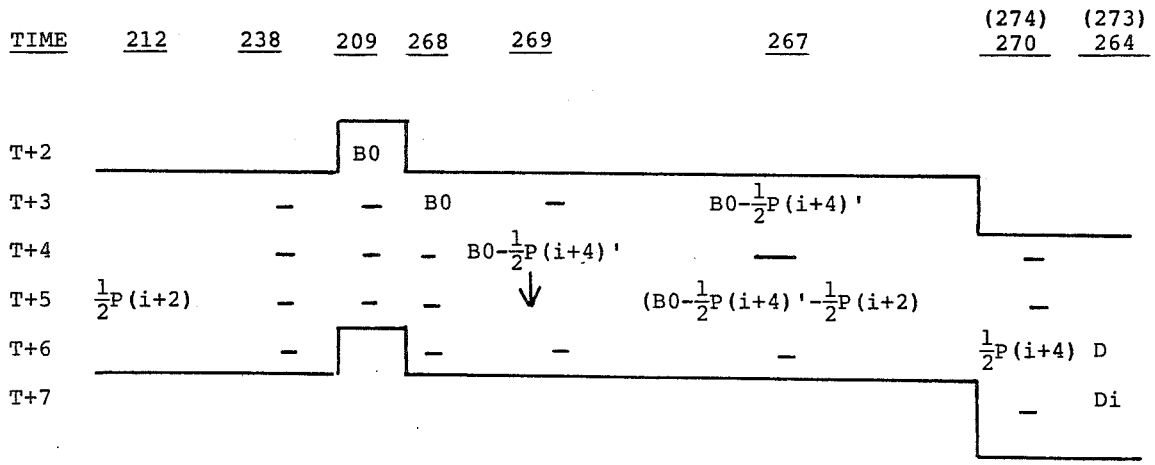

With reference to FIGS. 34A&B, the second mode of the FIG. 24D processor D accomplishes non-interpolation processing. During period T+2 the term ($\frac{1}{2}$) * P(i+4)' is presented to input terminal 260. The prime symbol is used to denote that this term has been saved over from an adjacent processing block of the same band. B0 is available at terminal 209. At the end of this period ($\frac{1}{2}$) * P(i+4)' is transferred into register 265, and B0 is transferred into register 268.

During period T+3, B1 is available at terminal 211, H is available at terminal 237, and adder/subtractor 261 forms their sum which is P(i+2). Adder/subtractor 267 subtracts the term ($\frac{1}{2}$) * P(i+4)' coming from register 265 via multiplexer 266 from the term B0 in register 268. At the end of this period P(i+2) is transferred into register 262, and the output from 267 is transferred into register 269.

During period T+4 adder/subtractor 261 receives the term B1 from terminal 211 and the term L from terminal 237 and forms their sum at its output which is P(i+4). P(i+2) is available at output 271. At the end of the period, P(i+4) is transferred into register 262.

During period T+5, P(i+4) is available at output 271. It is also available at terminal 274 as a "partial" to be saved over for the next processing block. Adder/subtractor 261 receives the term B1 from terminal 211 and −($\frac{1}{2}$) * (H+L) from the terminal 237 and forms their sum at its output which is P(i+3).

The term ($\frac{1}{2}$) * P(i+2), available at terminal 212 is subtracted from the term B0−($\frac{1}{2}$) * P(i+4)' in register 269 by adder/subtractor 267 with the resulting output being Di at terminal 232. At the end of period T+5, P(i+3) is transferred into register 262, and Di is transferred into register 233 of processor B.

During period T+6, Di, available at terminal 237, and B0, available at terminal 211 are added together in adder/subtractor 261. As in Mode 1, threshold device 263 determines whether register 262 will receive the output of adder/subtractor 261 or the data at terminal 211, and also whether register 264 will receive the data at terminal 237 or a value of zero. At the end of period T+6 the aforementioned action results in the transfer of data into register 262 which is P(i+1) and register 264 which is either Di or zero. During T+7, P(i+1) is available at terminal 271.

With reference to FIG. 35, In Mode 3 processor D completes the generation of horizontal D carry-up terms of Step 7 of FIG. 17 for use in the subsequent horizontal reconstruction of Step 8. Adder/subtractor 261 is used during this mode but not adder/subtractor 267.

During period T, the term Z1 is available at terminal 211 and the term X+Y is available at 237. Adder/subtractor 261 forms the difference of these two terms which is DCU(w), the horizontal carry-up term for row w. At the end of period T this term is transferred into register 262.

During period T+1, DCU(w) is available at output 271. Z1 is available at terminal 211 and the term X−Y is available at terminal 237. Adder/subtractor 261 forms the difference of these two quantities which is DCU(y). At the end of this period DCU(y) is transferred into register 262.

During period T+2, DCU(y) is available at output 271. Z1 is available at terminal 211 and the term X is available at terminal 237. Adder/subtractor 261 forms their sum which is DCU(x) which is transferred into register 262 at the end of the period.

During period T+3, DCU(x) is available at output 271. Z0 is available at terminal 211 and the term W is available at terminal 237. Adder/subtractor 261 forms their sum which is DCU(v) which is transferred into register 262 at the end of the period. It is available at terminal 271 during period T+4.

The functions of the nine control bits for Processor 0 are defined in the following TABLE XXV. The patterns of these nine control bits for each of the three modes are shown in subsequent TABLES XXVI, XXVII and XXVIII.

TABLE XXV

CONTROL POINTS FOR FIG. 24D
RECONSTRUCTION PROCESSOR D

| Bit Number | Action |
|---|---|
| 0 | 0 — disables the threshold device 263 |

TABLE XXV-continued

CONTROL POINTS FOR FIG. 24D RECONSTRUCTION PROCESSOR D

| Bit Number | Action |
|---|---|
| 1 | 1 — enables the threshold device 263<br>0 — multiplexer 266 selects 212<br>1 — multiplexer 266 selects register 265 |
| 2 | 0 — subtract mode for adder/subtractor 261<br>1 — add mode for adder/subtractor 261 |
| 3 | 0 — subtract mode for adder/subtractor 267<br>1 — add mode for adder/subtractor 267 |
| 4 | 0 — for subtract mode of adder/subtractor 267 performs B input minus A input<br>1 — for subtract mode of adder/subtractor 267 performs A input minus B input |
| 5 | 0 — enables the clock input for register 269<br>1 — inhibits the same clock input |
| 6 | 0 — enables tri-state output of register 269<br>1 — disables tri-state output of register 269 |
| 7 | 0 — enables tri-state output of register 268<br>1 — disables tri-state output of register 268 |
| 8 | 0 — multiplexer 270 selects device 261<br>1 — multiplexer 270 selects device 267 |

TABLE XXVI

RECONSTRUCTION PROCESSOR D INTERPOLATION MODE (FIGS. 33A&B)

| Bit No. | T+2 | T+3 | T+4 | T+5 | T+6 | T+7 |
|---|---|---|---|---|---|---|
| 0 |  |  | 0 | 0 | 1 | 0 |
| 1 |  | 1 | X | 0 | 0 |  |
| 2 |  | 1 | 1 | 1 | 1 |  |
| 3 |  | 0 | X | 0 | 0 |  |
| 4 |  | 1 | X | 0 | 0 |  |
| 5 | X | 0 | 1 | X |  |  |
| 6 |  | 1 | 1 | 0 | 1 |  |
| 7 |  | 1 | 1 | 1 | 1 |  |
| 8 |  | X | X | X | 1 |  |

TABLE XXVII

RECONSTRUCTION PROCESSOR D NON-INTERPOLATION MODE (FIGS. 34A&B)

| Bit No. | T+2 | T+3 | T+4 | T+5 | T+6 | T+7 |
|---|---|---|---|---|---|---|
| 0 |  |  | 0 | 0 | 1 | 0 |
| 1 |  | 1 | X | 0 | X |  |
| 2 |  | 1 | 1 | 0 | 1 |  |
| 3 |  | 0 | X | O | X |  |
| 4 |  | 0 | X | 0 | X |  |
| 5 | X | 0 | 1 | X |  |  |
| 6 |  | 1 | 1 | 0 | 1 |  |
| 7 |  | 0 | 1 | 1 | 1 |  |
| 8 |  | X | X | 0 | X |  |

TABLE XXVIII

RECONSTRUCTION PROCESSOR D HORIZONTAL CARRY-UP COMPLETION MODE (FIG. 35)

| Bit No. | T−1 | T | T+1 | T+2 | T+3 | T+4 |
|---|---|---|---|---|---|---|
| 0 |  |  | X | X | X | X |
| 1 |  | X | X | X | X |  |
| 2 |  | 0 | 0 | 1 | 1 |  |
| 3 |  | X | X | X | X |  |
| 4 |  | X | X | X | X |  |
| 5 | X | X | X | X |  |  |
| 6 |  | 1 | 1 | 1 | 1 |  |
| 7 |  | 1 | 1 | 1 | 1 |  |
| 8 |  | X | X | X | X |  |

Map Coding Apparatus for Color Images

Previously two techniques for transmission of I and Q color components of a color image were disclosed wherein the map generated in conjunction with the forward Pyramid signal transformation process for the monochrome signal could be used directly for the color components without having to generate and send separate maps for each signal component. The first is the 'OR' technique and the second is the "Monochrome-signalling" technique.

Figure 36:
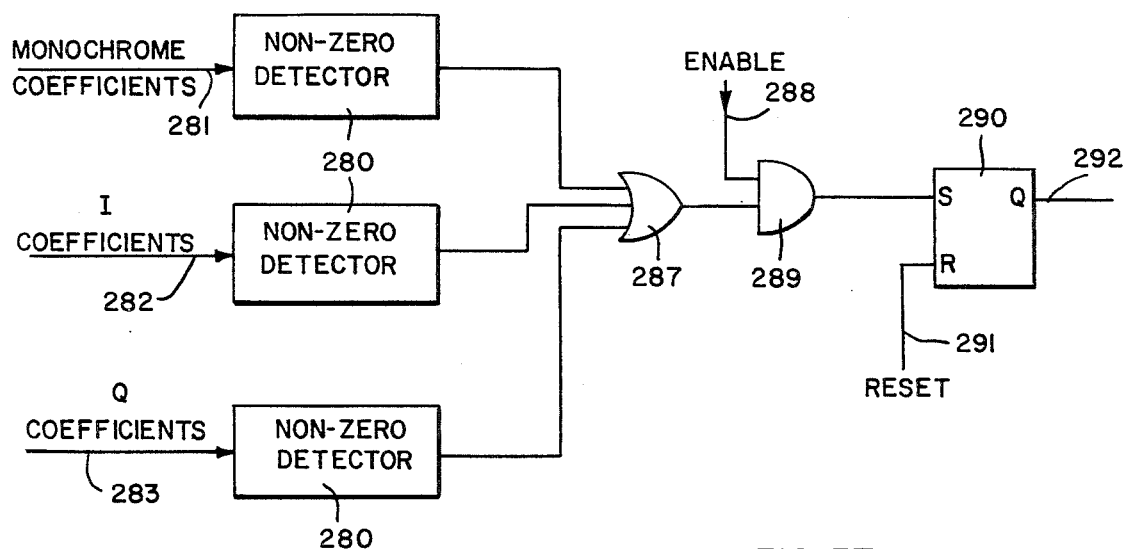
FIG. 36 is a block diagram of apparatus for advantageous map coding of coefficients resulting from transformation of color images by means of an "OR" technique.

FIG. 36 depicts apparatus for implementing the 'OR' technique wherein a non-zero map component is generated in response to a non-zero monochrome signal component or a non-zero I signal component or a non-zero Q signal component. The timing, not shown, is such that components from these three signals which are concurrently presented to the apparatus of FIG. 36 originate from the same band, the same processing block and the same corresponding terms. A non-zero detector 280, whose output is logic 1 if the input is non-zero and a logic 0 if the input is zero, is used for each of the three input signals 281, 282 and 283 respectively being coefficients in the Monochrome (Y) signal, the I signal and the Q signal. The outputs of the three detectors 280 are fed to the three inputs of an OR gate 287. An AND gate 289 receives the output from the OR gate 287, as well as an ENABLE signal on a line 288, the purpose of the AND gate 289 being to pass the output of the OR gate 287 to the set (S) terminal of a flip-flop 290 only when the OR gate 287 output has stabilized in response to input signals 281, 282 and 283. The flip-flop 290 is set to 1 so that its "Q" output 292 is a logic 1 in response to any logic 1 appearing at the output of AND gate 289. The AND gate 289 output is used to indicate to the map generating device, not shown here but previously explained, that one or more of the inputs 281, 282 or 283 is non-zero. The flip-flop output 292 indicates that a contents word exists in response to a sequence of inputs at 281, 282 and 283 of the same type (e.g. horizontal, or vertical, or diagonal) of coefficients. This result can then be placed in the map directory. After tests for non-zero coefficients of the same type have been completed, the flip-flop 290 is reset by a RESET signal on line 291, and a subsequent coefficient examination process started. A single map is thereby generated for the monochrome, I and Q signals.

Figure 37:
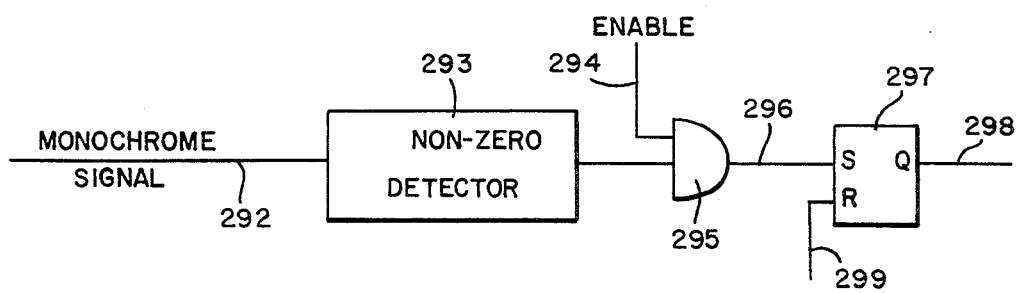
FIG. 37 is a block diagram of apparatus for advanteous map coding of coefficients resulting from transformations of color images by means of a Monochrome Signaling technique.

The second technique for processing color and monochrome coefficients to yield a single map is the monochrome-signalling technique depicted in FIG. 37. This technique employs a non-zero detector 293, identical to the non-zero detector 280 of FIG. 37, with only the monochrome signal 292. Otherwise operation is the same as that explained for the 'OR' technique with reference to FIG. 36. In this case, however, I and Q color coefficients, not shown, are retained for storage or transmission only under the condition that the corresponding monochrome coefficient has a non-zero value. It is possible with this technique for some non-zero color coefficients to be discarded due to a corresponding zero value monochrome coefficient. This is more generally an asset rather than a liability, however. In normal high quality images, the correlation between the monochrome, I and Q signals is very high and the likelihood with the Pyramid Transform that a monochrome coefficient has a non-zero value whenever an I or Q coefficient has a non-zero value is very high. A beneficial result of this technique can occur in cases where the color portion of the image signal is contaminated with electrical noise such as can happen with recording and subsequent playback from a video tape recorder. The noise added to the color signal is most objectionable in locations where the monochrome signal is smooth and consequently would not generate higher band coefficients. In these cases, the coefficients generated by the noise in the I and Q signals are discarded by the monochrome-signalling map generation technique and prevented from contaminating the image when subsequently reconstructed from the transformed data.

Color Image Resolution Processing Apparatus

Hereinabove, under the heading "Resolution Considerations for Color Images", it was pointed out that advantage may be taken of the reduced resolution acceptability for I and Q color-difference signals in standard television broadcasting.

Figure 38:
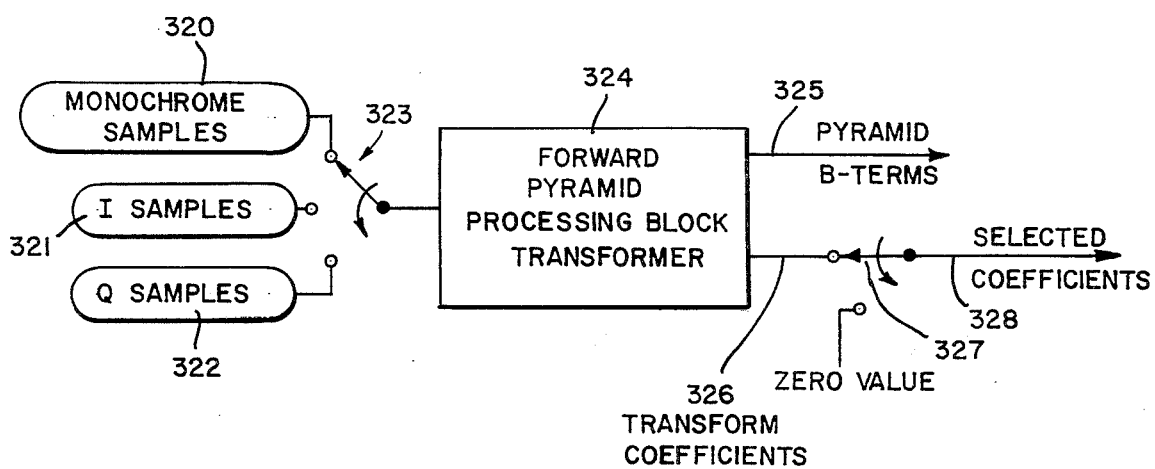
FIG. 38 is a block diagram of apparatus for reducing the resolution of color image transforms in an acceptable manner.

With reference now to FIG. 38, there is shown in block diagram form a means for performing the desired color signal filtering in the forward transform direction. A forward Pyramid Transformer 324 operates on samples from the monochrome signal 320, the I signal 321 and the Q signal 322 in a shared fashion. Electronic switch 323 selects input samples from one of these three sources. The transformer issues pyramid-weighted two dimensional B-type functions at output port 325 and two-dimensional coefficients at output port 326. The transformer performs one band horizontal and vertical processing prior to issuing the outputs. Processing of the Pyramid B terms for the next lower band involves applying these terms another time at inputs 320, 321 or 322 as appropriate.

Electronic switch 327 is operated such that it either passes the coefficients issuing from output port 326 to the selected coefficients output 328 or alternatively passes zero valves to output 328. Said switch is only in the position to output zero values for I or Q coefficients and then only for the selected higher level bands. Under all other conditions the switch 327 passes output 326 to output 328.

Color resolution reduction factors may be chosen as powers of two for individual applications. A particular example somewhat closely matched to current broadcast practice is to choose a reduction factor of four relative to the monochrome signal for the I signal and a factor of eight relative to the monochrome signal for the Q signal. These particular factors then dictate that electronic switch 327 select zero values for I signal coefficients for transform bands N and N−1, and zero value Q signal coefficients for transform bands N, N−1 and N−2. For all other bands the coefficients 326 are actually used as outputs at 328.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A transform method for operating on a one-dimensional set of input data points to provide output terms and coefficients in a transform domain organized into one or more bands, N, where N is an integer greater than zero, Band N is the highest band, and Band 1 is the lowest band, said transform method comprising:
generating and outputting at least one term for Band 1 as a B function defined as a triangularly-weighted average of the values of $2^{N+1}-1$ consecutive input data points;
generating and outputting coefficients for each band as predetermined functions defined as weighted averages of selected consecutive pluralities of input data points, the number of input data points contributing to each coefficient being the least for Band N, and the number of input data points contributing to each coefficient increasing by powers of two for each successive band below Band N, and the predetermined functions being selected so as to enable reconstruction of the values of the input data points from the B-function term for Band 1 and the coefficients for Bands N through 1.

2. A transform method in accordance with claim 1, comprising generating a stream of B-function terms for Band 1, with overlap of the input data points contributing to each B-function term for Band 1 such that the beginning input data point for each successive B-function term for Band 1 shifts ahead by $2^N$ input data points.

3. A transform method in accordance with claim 2, wherein the predetermined functions are selected so as to enable reconstruction of the values of the input data points as a build-up from Band 1 upwards of linear interpolation between B-function terms for Band 1, with departures from linear interpolation being indicated by non-zero coefficients.

4. A transform method in accordance with claim 1, which further comprises representing the values of any of the coefficients which are non-zero by means of a variable length code.

5. A transform method in accordance with claim 2, which further comprises:
outputting only coefficients having non-zero values; and
developing map components to describe the location in the transform domain of the non-zero coefficients, the map components being organized in a branched manner beginning with a plurality of map components for Band 1 and continuing with two conditionally-existing map components for successive higher bands branched from each next lower band map component, each map component corresponding to coefficients in a particular band developed from a particular plurality of input sample points, and each map component including:
a directory word,
conditionally a contents word, and
conditionally an existence word,
the directory words indicating whether a contents word is present and whether an existence word is present,
the contents words being present if there are any non-zero coefficients, and the contents words indicating which coefficients are non-zero,
the existence words being present if there are further branches, and the existence words indicating which branches are present.

6. A transform method in accordance with claim 5, which further comprises representing the values of the non-zero coefficients by means of a variable length code to further minimize the number of bits output.

7. A transform method for operating on a two-dimensional set of input data points to provide output terms and coefficients in a transform domain organized into one or more bands N, where N is an integer greater than zero, Band N is the highest band, and Band 1 is the lowest band; said transform method comprising:
performing a first partial one-dimensional transform for Band N on either each row or each column of the input data points by a single-band triangle transform process to generate B-function terms each defined as a triangularly-weighted average of three consecutive data points, with overlap such that the last of the three data points contributing to one B-function term is the first of the three data points contributing to the next successive B-function term, and to generate coefficients as predetermined functions defined as weighted averages of selected consecutive pluralities of data points, the predetermined functions being selected so as to enable reconstruction of the values of the input data points upon completion of the entire transform method;

ordering the results of the triangle transform process on each row or each column of the data points by rows or columns, as the case may be, by band number and horizontal or vertical position, as the case may be;

performing by the triangle transform process a second partial one-dimensional single-band transform on each column or row, as the case may be, on the ordered results of the first single-band transform performed;

outputting the coefficients generated by the second one-dimensional single-band transform as two-dimensional coefficients for the band just processed;

successively repeating, for successive lower bands employing as data points the B-function terms resulting from the first and second partial one-dimensional triangle transforms of the next higher band arranged in two dimensions, the steps of performing a first partial one-dimensional triangle transform, ordering the results, performing a second partial one-dimensional triangle transform, and outputting the coefficients generated, until processing for Band 1 is completed; and outputting the B-function term resulting from the first and second partial one-dimensional triangle transforms for Band 1.

8. A transform method in accordance with claim 7, wherein the partial triangle transform processes generate a stream of B-function terms for Band 1, with overlap of the input data points contributing to each B-function term for Band 1 such that the beginning input data point for each ensuing successive B-function term for Band 1 shifts ahead by $2^N$ input data points in at least one of the two directions of the two-dimensional set of input data points.

9. A transform method in accordance with claim 7, wherein the partial triangle transform processes generate a stream of B-function terms for Band 1, with overlap of the input data points contributing to each B-function term for Band 1 such that the beginning input data point for each ensuing successive B-function term for Band 1 shifts ahead by $2^N$ input data points in both of the two directions of the two-dimensional set of input data points.

10. A transform method in accordance with claim 7, which further comprises representing the values of any non-zero coefficients by means of a variable length code to further minimize the number of bits output.

11. A transform method for operating on a one-dimensional set of input data points to provide output terms and coefficients in a transform domain organized into one or more bands, N, where N is an integer greater than zero, Band N is the highest band, and Band 1 is the lowest band, said transform method comprising:

generating and outputting at least one term for Band 1 as a B function defined as a triangularly-weighted average of the values of $2^{N+1} - 1$ consecutive input data points;

generating and outputting selected coefficients for each band as D-functions defined, for Band N, as a $-\frac{1}{4}$, $+\frac{1}{2}$, $-\frac{1}{4}$-weighted average of three consecutive input data points and, for all bands below Band N, as a $-\frac{1}{4}$, $+\frac{1}{2}$, $-\frac{1}{4}$-weighted average of three successive B-function terms of the next higher band, the B-function terms in turn each defined, for Band N, as a $\frac{1}{4}$, $\frac{1}{2}$, $\frac{1}{4}$-weighted average of three consecutive input data points, with overlap such that the last of the three input data points contributing to one B-function term is the first of the three input data points contributing to the next successive B-function term, and in turn each defined, for all bands below Band N, as a $\frac{1}{4}$, $\frac{1}{2}$, $\frac{1}{4}$-weighted average of three consecutive B-function terms of the next higher band, with overlap such that the last of the three higher-band B-function terms contributing to each lower-band B-function term is the first of the higher-band B-function terms contributing to the next successive lower-band B-function term.

12. A transform method in accordance with claim 11, comprising a fast method which includes the steps of calculating B-function terms for all bands and employing these calculated B-function terms to generate B-function terms and D-function coefficients for successive lower bands.

13. A transform method in accordance with claim 11, wherein the selected D-function coefficients comprise every D-function coefficient which is defined.

14. A transform method in accordance with claim 11, comprising generating a stream of B-function terms for Band 1, with overlap of the input data points contributing to each B-function term for Band 1 such that the beginning input data point for each successive B-function term for Band 1 shifts ahead by $2^N$ input data points.

15. A transform method in accordance with claim 11, which further comprises:

generating selected coefficients for each band as S-functions defined, for Band N, as a $-\frac{1}{2}$, 0, $+\frac{1}{2}$-weighted average of three consecutive input data points and, for all bands below Band N, as a $-\frac{1}{2}$, 0, $+\frac{1}{2}$-weighted average of three successive B-function terms of the next higher band, the B-function terms in turn each defined, for Band N, as a $\frac{1}{4}$, $\frac{1}{2}$, $\frac{1}{4}$-weighted average of three consecutive input data points, with overlap such that the last of the three input data points contributing to one B-function term is the first of the three input data points contributing to the next successive B-function term, and in turn each defined, for all bands below Band N, as a $\frac{1}{4}$, $\frac{1}{2}$, $\frac{1}{4}$-weighted average of three consecutive B-function terms of the next higher band, with overlap such that the last of the three higher-band B-function terms contributing to each lower-band B-function term is the first of the higher-band B-function terms contributing to the next successive lower-band B-function term.

16. A transform method in accordance with claim 15, which comprise outputting the S-function coefficients.

17. A transform method in accordance with claim 15, which comprises outputting both S-function and D-function coefficients.

18. A transform method in accordance with claim 15, which comprises outputting linear combinations of S-function and D-function coefficients.

19. A transform method in accordance with claim 15, which further comprises:
   normalizing the S-function coefficients to generate normalized S-function coefficients having the property of having zero value for sequences of input sample points of constant value slope; and
   outputting the normalized S-function coefficients.

20. A transform method in accordance with claim 15, which further comprises:
   normalizing the S-function coefficients to generate normalized S-function coefficients having the property of having zero value for sequences of input sample points of constant value slope; and
   outputting both normalized S-functions and D-functions.

21. A transform method in accordance with claim 15 which further comprises:
   normalizing the S-function coefficients to generate normalized S-function coefficients having the property of having zero value for sequences of input samples of constant value slope; and
   outputting linear combinations of normalized S-functions and D-functions.

22. A transform method in accordance with claim 11, which further comprises:
   outputting only coefficients having non-zero values; and
   developing map components to describe the location in the transform domain of the non-zero coefficients, the map components being organized in a branched manner beginning with a plurality of map components for Band 1 and continuing with two conditionally-existing map components for successive higher bands branched from each next lower band map component, each map component corresponding to coefficients in a particular band developed from a particualr plurality of input sample points, and each map component including:
   a directory word,
   conditionally a contents word, and
   conditionally an existence word,
   the directory words indicating whether a contents word is present and whether an existence word is present,
   the contents words being present if there are any non-zero coefficients, and the contents words indicating which coefficients are non-zero,
   the existence words being present if there are further branches, and the existence words indicating which branches are present.

23. A transform method for operating on a two-dimensional set of input data points to provide output terms and coefficients in a transform domain organized into one or more bands, N, where N is an integer greater than zero, Band N is the highest band, and Band 1 is the lowest band, said transform method comprising:
   generating and outputting at least one term for Band 1 as a two-dimensional B-function defined as a pyramid-weighted average of the values of a square array of adjacent input data points, each side of the square containing $2^{N+1}-1$ consecutive input data points by first calculating one-dimensional intermediate terms as one-dimensional B-functions defined as a triangularly weighted average of the values of the data points in each row or each column of the input data points and ordering in a column or row as the case may be, and then performing a second one-dimensional B-function calculation on the column or row of ordered results of the first calculation; and
   generating and outputting selected coefficients for each band as predetermined functions defined as weighted averages of selected rectangular pluralities of input data points and the predetermined function being selected so as to enable reconstruction of the value of the B-function term for Band 1 and the coefficients for Bands N through 1, said coefficients being generated by first calculating intermediate one-dimensional coefficients for each row or each column of the input data points and ordering the results in a column or row as the case may be, and then performing a second calculation of one-dimensional B-function terms and one-dimensional coefficients on each column or row of the ordered results of the first calculation, with the exception that no second one-dimensional B-function caclulation on the solely B-function results of the first calculation is needed.

24. A transform method in accordance with claim 23 which comprises outputting only non-zero coefficients.

25. A transform method in accordance with claim 23 which further comprises representing the values of coefficients by means of a variable length code to further minimize the number of bits output.

26. A transform method in accordance with claim 23 which comprises outputting only non-zero coefficients and representing the values of the non-zero coefficients by means of a variable length code to further minimize the number of bits output.

27. A map coding process for transmitting information concerning the location in a transform domain of non-zero valued coefficients resulting from a transform process characterized generally by operating on the values of input data points, employing finite-length basis functions to generate values, being organized into a hierarchial or tree structure of discrete levels, the number of input data points contributing to each value increasing by a predetermined factor and the number of values decreasing by the predetermined factor for each successive level progressing from tree branch to tree trunk until an ultimate value results at the tree trunk level, and with coefficients at each level determined so as to enable reconstruction of the values of the input data points from the ultimate value at the tree trunk and the coefficients for all levels, said map coding process comprising:
   outputting only the non-zero valued coefficients;
   developing a map including components to describe the location in the transform domain of the non-zero coefficients, the map components being organized in a branched manner beginning with a plurality of map components at the tree trunk level and continuing with a predetermined number of conditionally-existing map components for successive levels branched from each next preceeding level map component, each map component corresponding to coefficients in a particular level, and each map component including:
   a directory word,
   conditionally a contents word, and
   conditionally an existence word,
   the directory words indicating whether a contents word is present and whether an existence word is present, the contents words being present if there are any non-zero coefficients, and the contents words indicating which coefficients are non-zero, the existence words being present if there are further branches, and the existence words indicating which branches are present.

28. A map coding process in accordance with claim 27, which further comprises representing the values of the non-zero coefficients by means of a variable length code to further minimize the number of bits output.

29. A map coding process in accordance with claim 27, which comprises developing a plurality of maps such that the maps in combination describe the location in the transform domain of the non-zero coefficients, with each map contributing separately or in combination with other maps to the location of a subset of non-zero coefficients and other map components.

30. A map coding process in accordance with claim 29 which further comprises representing the values of the non-zero coefficients by means of a variable length code to further minimize the number of bits output.

31. A map coding process in accordance with claim 30, wherein the subsets of non-zero coefficients have different directional properties.

32. A transform and transformed coefficient map coding method for operating on three two-dimensional sets of input data points, the three sets respectively being sampled data points of "Y", "I" and "Q" video signals representing a color television image, the "Y" signal being the equivalent of a monochrome signal and the "I" and "Q" signals being color-difference signals, said transform and coding method providing three respective sets of ouput terms and coefficients in a transform domain organized into one or more bands N, where N is an integer greater than zero, Band N is the highest band, and Band 1 is the lowest band; said transform and coding method comprising:

performing a first partial one-dimensional transform for Band N on either each row or each column of each of the three sets of input data points by a single-band triangle transform process to generate B-function terms each defined as a triangularly-weighted average of three consecutive data points, with overlap such that the last of the three data points contributing to one B-function term is the first of the three data points contributing to the next successive B-function term, and to generate coefficients as predetermined functions defined as weighted averages of selected consecutive pluralities of data points, the predetermined functions being selected so as to enable reconstruction of the values of the input data points upon completion of the entire transform method;

ordering the results of each triangle transform process on each row or each column of the data points by rows or columns, as the case may be, by band number and horizontal or vertical position, as the case may be;

performing by the triangle transform process a second partial one-dimensional single-band transform on each column or row, as the case may be, on the ordered results of the first single-band trnsform performed to generate two-dimensional coefficients for the band just processed;

successively repeating, for each set of input data and for successive lower bands employing as data points the B-function terms resulting from the first and second partial one-dimensional triangle transforms of the next higher band arranged in two dimensions, the steps of performing a first partial one-dimensional triangle transform, ordering the results, performing a second partial one-dimensional triangle transform, and outputting the coefficients generated, until processing for Band 1 is completed;

for each set of input data outputting the B-function terms resulting from the first and second partial one-dimensional triangle transforms for Band 1;

outputting only selected and corresponding coefficients for each of the three sets of input data; and developing a common set of map components to describe the location in the transform domain of the selected coefficients.

33. A transform and coding method according to claim 32, which comprises selecting coefficients for outputting and mapping if any one of three corresponding coefficients respectively resulting from transformation of the "Y" input data, the "I" input data, or the "Q" input data is non-zero.

34. A transform and coding method according to claim 32 which comprises selecting corresponding coefficients for outputting and maping only if a particular coefficient resulting from transformation of the "Y" input data is non-zero.

35. A transform method according to claim 32, which comprises organizing the map components in a branched manner beginning with a plurality of map components for Band 1 and continuing with a predetermined number of conditionally-existing map components for successive higher bands branched from each next lower band map component, each map component corresponding to coefficients in a particular band developed from a particular plurality of input sample points, and each map component including:

a directory word, conditionally a contents word, and conditionally an existence word, the directory words indicating whether a contents word is present and whether an existence word is present, the contents words being present if there are any selected coefficients, and the contents words indicating which coefficients are selected, the existence words being present if there are further branches, and the existence words indicating which branches are present.

36. A transform and coding method according to claim 35, which comprises selecting coefficients for outputting and mapping if any one of three corresponding coefficients respectively resulting from transformation of the "Y" input data, the "I" input data, or the "Q" input data is non-zero.

37. A transform and coding method according to claim 36 which comprises selecting corresponding coefficients for outputting and mapping only if a particular coefficient resulting from transformation of the "Y" input data is non-zero.

38. A transform apparatus for operating on a set of input data points to provide output terms and coefficients in a transform domain organized into one or more bands, N, where N is an integer greater than zero, Band N is the highest band, and Band 1 is the lowest band, said transform apparatus compising:

a plurality of interconnected processing blocks organized adjacent one another for each band, the number of processing blocks being greatest for Band N and decreasing for each successive lower band;

said processing blocks together arranged to generate and output at least one term for Band 1 and a B function defined as a triangularly-weighted average of the values of $2^{N+1}-1$ consecutive input data points and to generate and output coefficients for each band as predetermined functions defined as weighted averages of selected consecutive pluralities of input data points, the number of input data points contributing to each coefficient being the least for Band N, and the number of input data points contributing to each coefficient increasing by powers of two for each successive band below Band N, and the predetermined functions being selected so as to enable reconstruction of the values of the input data points from the B-function term for Band 1 and the coefficients for bands N through 1;

each of said interconnected processing blocks including elements for implementing the smallest set of processing steps which of themselves do not repeat, but which, when taken with other processing blocks, repeat as a set without any additional processing steps being required to interconnect them and are sufficient to perform the transform over the space of an arbitrarily large set of input data points.

39. A transform apparatus for operating on a one-dimensional set of input data points to provide output terms and coefficients in a transform domain organized into one or more bands, N, where N is an integer greater than zero, Band N is the highest band, and Band 1 is the lowest band, said transform apparatus comprising:

means for generating and outputting at least one term for Band 1 as a B function defined as a triangularly-weighted average of the values of $2^{N+1}-1$ consecutive input data points;

means for generating and outputting coefficients for each band as predetermined functions as weighted averages of selected consecutive pluralities of input data points, the number of input data points contributing to each coefficient being the least for Band N, and the number of input data points contributing to each coefficient increasing by powers of two for each successive band below Band N, and the predetermined functions being selected so as to enable reconstruction of the values of the input data points from the B-function term for Band 1 and the coefficients for bands N through 1.

40. A transform apparatus in accordance with claim 39, which generates a stream of B-function terms for Band 1, with overlap of the input data points contributing to each B-function term for Band 1 such that the beginning input data point for each successive B-function term for Band 1 shifts ahead by $2^N$ input data points.

41. A transform apparatus in accordance with claim 40, wherein the predetermined functions are selected so as to enable reconstruction of the values of the input data points as a build-up from Band 1 upwards of linear interpolation between B-function terms for Band 1, with departures from linear interpolation being indicated by non-zero coefficients.

42. A transform apparatus in accordance with claim 40, which further comprises:

means for selecting and outputting only coefficients having non-zero values; and means for developing map components to describe the location in the transform domain of the non-zero coefficients, the map components being organized in a branched manner beginning with a plurality of map components for Band 1 and continuing with two conditionally-existing map components for successive higher bands branched from each next lower band map component, each map component corresponding to coefficients in a particular band developed from a particular plurality of input sample points, and each map component including:

a directory word, conditionally a contents word, and conditionally an existence word, the directory words indicating whether a contents word is present and whether an existence word is present, the contents words being present if there are any non-zero coefficients, and the contents words indicating which coefficients are non-zero, the existence words being present if there are further branches, and the existence words indicating which branches are present.

43. A transform apparatus for operating on a set of input data points to provide output terms and coefficients in a transform domain organized into one or more bands, N, where N is an integer greater than zero, Band N is the highest band, and Band 1 is the lowest band, said transform apparatus comprising:

a plurality of interconnected processing blocks organized adjacent one another for each band, the number of processing blocks being greatest for Band N and decreasing for each successive band;

said processing blocks together arranged to generate and output at least one term for Band 1 as a two-dimensional B-function defined as a pyramid-weighted average of the values of a square array of adjacent input data points, said square being $2^{(N+1)}-1$ consecutive points on a side, and to generate and output coefficients for each band as predetermined functions defined as weighted averages of selected rectangular pluralities of input data points, the number of input data points contributing to each coefficient being the least for Band N and the number on input data points contributing to each coefficient increasing by powers of four for each successive band below Band N, and the predetermined functions being selected so as to enable reconstruction of the values of the input data points from the B-function terms for Band 1 and the coefficients for Band N through 1;

each of said interconnected processing blocks including elements for inplementing the smallest set of processing steps which of themselves do not repeat, but which when taken with other processing blocks, repeat as a set with out any additional processing steps being required to interconnect them and are sufficient to perform the transform over the space of an arbitrarily large set of input data points.

44. A transform apparatus for operating on a two-dimensional set of input data points to provide output terms and coefficients in a transform domain organized into one or more bands, N, where N is an integer greater than zero, Band N is the highest band, and Band 1 is the lowest band, said transform apparatus comprising:

means for generating and outputting at least one term for Band 1 as a two-dimension B-function defined as a pyramid-weighted average of the values of a square set of input data points said square being $2^{(N+1)}-1$ consecutive data points on a side; and means for generating and outputting coefficients for each band as predetermined functions defined as weighted averages of selected rectangular pluralities of input data points, the number of input data points contributing to each coefficient being the least for Band N, and the number of input data points contributing to each coefficient increasing by powers of four for each successive band below Band N, and the predetermined functions being selected so as to enable reconstruction of the values of the input data points from the B-function terms for Band 1 and the coefficients for Bands N through 1.

45. A transform apparatus in accordance with claim 44 which generates a two-dimensional array of B-function terms for Band 1 with overlap of the input data points contributing to each B-function term for Band 1 such that each successive B-function term for Band 1 shifts ahead by $2^N$ input data points in at least one of the two dimensions of the two-dimensionsal set of input data points.

46. A transform apparatus in accordance with claim 44 which generates a two-dimensional array of B-function terms for each Band 1 with overlap of the input data points contributing to each B-function term for Band 1 such that each successive B-function term for Band 1 shifts ahead by $2^N$ input data points in at least one of the two dimensions of the two-dimensional set of input data points.

47. A transform apparatus in accordance with claim 45 wherein the predetermined functions are selected so as to enable two-dimensional reconstruction of the values of the input data points as a build-up from Band 1 upwards of linear interpolation in two dimensions between B-function terms for Band 1, with departures from linear interpolation being indicated by non-zero coefficients.

48. A transform apparatus in accordance with claim 45, which further comprises:
    means for selecting and outputting only coefficients having non-zero values; and
    means for developing map components to describe the location in the transform domain of the non-zero coefficients, the map components being organized in a branched manner beginning with a plurality of map components for Band 1 and continuing with four conditionally-existing map components for successive higher bands branched from each lower band map component, each map component corresponding to coefficients in a particular band developed from a particular plurality of input sample points, and each map component including:
    a directory word,
    conditionally a contents word, and
    conditionally an existence word
    the directory words indicating whether a contents word is present and whether an existence word is present, and
    the contents words being present if there are any non-zero coefficients, and the contents words indicating which coefficnets are non-zero, and
    the existence words being present if there are further branches, and the existence words indicating which branches are present.

49. A digital communication system for communicating a set of input data points, said digital communication system comprising at a transmitting terminal:
    a forward transformer for operating on the set of input data points to provide output terms and coefficients in a transform domain organized into one or more bands, N, where N is an integer greater than zero, Band N is the highest band, and Band 1 is the lowest band, said forward transformer including:
    means for generating and outputting at least one term for Band 1 as a B function defined as a triangularly-weighted average of the values of $2^{N+1}-1$ consecutive input data points;
    means for generating and outputting coefficients for each band as predetermined functions defined as weighted averages of selected consecutive pluralities of input data points, the number of input data points contributing to each coefficient being the least for Band N, and the number of input data points contributing to each coefficient increasing by powers of two for each successive band below Band N, and the predetermined functions being selected so as to enable reconstruction of the values of the input data points from the B-function term for Band 1 and the coefficients for Bands N through 1.

50. A digital communication system in accordance with claim 49, wherein said forward transformer generates a stream of B-function terms for Band 1, with overlap of the input data points contributing to each B-function term for Band 1 such that the beginning input data for each successive B-function term for Band 1 shifts ahead by $2^N$ input data points.

51. A digital communication system in accordance with claim 50, wherein the predetermined functions are selected so as to enable reconstruction of the values of the input data points as a build-up from Band 1 upwards of linear interpolation between B-function terms for Band 1, with departures from linear interpolation being indicated by non-zero coefficients.

52. A digital communication system in accordance with claim 50, which further comprises:
    means for selecting and outputting only coefficients having non-zero values; and
    means for developing map components to describe the location in the transform domain of the non-zero coefficients, the map components being organized in a branched manner beginning with a plurality of map components for Band 1 and continuing with two conditionally-existing map components for successive higher bands branched from each next lower band map component, each map component corresponding to coefficients in a particular band developed from a particular plurality of input sample points, and each map component including:
    a directory word,
    conditionally a contents word, and
    conditionally an existence word,
    the directory words indicating whether a contents word is present and whether an existence word is present,
    the contents words being present if there are any non-zero coefficients, and the contents words indicating which coefficients are non-zero, the existence words being present if there are further branches, and indicating which branches are present.

53. A digital communication system for communicating a two-dimensional set of input data points, said digital communication system comprising at a transmitting terminal:
a forward transformer for operating on the set of input data points to provide output terms and coefficients in a transform domain organized into one or more bands, N, where N is an integer greater than zero, Band N is the highest band, and Band 1 is the lowest band, said forward transformer including:
means for generating and outputting at least one term for Band 1 as a B-function defined as a pyramid-weighted average of the values of a square array of adjacent input data points, said square having $2^{(N+1)} - 1$ consecutive points on a side;
means for generating and outputting coefficients for each band as predetermined functions defined as weighted averages of selected rectangular pluralities of input data points, the number of input data points contributing to each coefficient being the least for Band N, and the number on input data points contributing to each coefficient increasing by powers of four for each successive band below Band N, and the predetermined functions being selected so as to enable reconstruction of the values of the input data points from the B-function terms for Band 1 and the coeficients for Bands N through 1.

54. A digital communication system in accordance with claim 53, wherein said forward transformer generates a two-dimensional array of B-function terms for Band 1 with overlap of the input data points contributing to each B-function term for Band 1 such that each successive B-function terms for Band 1 shifts ahead by $2^N$ input data points in at least one of the dimensions of the two-dimensional set of input data points.

55. A digital communication system in acordance with claim 53, wherein said forward transformer generates a two-dimensional array of B-function terms for Band 1 with overlap of the input data points contributing to each B-function term for Band 1 such that each successive B-function term for Band 1 shifts ahead by $2^N$ input data points in both of the two dimensions of the two-dimensional set of input data points.

56. A digital communication system in accordance with claim 53, wherein the predetermined functions are selected so as to enable two-dimensional reconstruction of the values of the input data points as a build-up from Band 1 upwards of linear interpolation being indicated by non-zero coefficients.

57. A digital communication system in accordance with claim 54, which further comprises:
means for selecting and outputting only coefficients having non-zero values; and
means for developing map components to describe the location in the transform domain of the non-zero coefficients, the map components being organized in a branched manner beginning with a plurality of map components for Band 1 and continuing with four conditionally-existing map components for successive higher bands branched from each lower band map component, each map component corresponding to coefficients in a particular band developed from a particular plurality of input sample points, and each map component including:
a directory word,
conditionally a contents word, and
conditionally an existence word,
the directory words indicating whether a contents word is present and whether an existence word is present, the contents words being present if there are any non-zero coefficients, and the contents words indicating which coefficients are non-zero,
the existence words being present if there are further branches, and the existence words indicating which branches are present.

* * * * *